(12) United States Patent
Kim et al.

(10) Patent No.: US 11,552,063 B2
(45) Date of Patent: Jan. 10, 2023

(54) DISPLAY DEVICE WITH DIFFERENT ELECTRODES AND LIGHT EMITTING ELEMENTS

(71) Applicant: Samsung Display Co., LTD., Yongin-si (KR)

(72) Inventors: Kyung Bae Kim, Yongin-si (KR); Dong Hwan Kim, Yongin-si (KR); Mee Hye Jung, Yongin-si (KR); Jun Ki Jeong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 59 days.

(21) Appl. No.: 17/002,258

(22) Filed: Aug. 25, 2020

(65) Prior Publication Data
US 2021/0143137 A1 May 13, 2021

(30) Foreign Application Priority Data
Nov. 12, 2019 (KR) .................. 10-2019-0144494

(51) Int. Cl.
| | | |
|---|---|---|
| H01L 25/16 | (2006.01) | |
| H01L 27/12 | (2006.01) | |
| H01L 33/62 | (2010.01) | |
| H01L 23/00 | (2006.01) | |

(52) U.S. Cl.
CPC ............ *H01L 25/167* (2013.01); *H01L 24/24* (2013.01); *H01L 24/82* (2013.01); *H01L 27/124* (2013.01); *H01L 27/1259* (2013.01); *H01L 33/62* (2013.01); *H01L 2224/24011* (2013.01); *H01L 2224/24147* (2013.01); *H01L 2224/82143* (2013.01)

(58) Field of Classification Search
CPC ....... H01L 25/167; H01L 24/24; H01L 24/82; H01L 27/124; H01L 27/1259; H01L 33/62; H01L 2224/24011; H01L 2224/24147; H01L 2224/82143
USPC ..... 257/72; 438/48, 128, 149, 151, 157, 283
See application file for complete search history.

(56) References Cited

U.S. PATENT DOCUMENTS

| | | | |
|---|---|---|---|
| 10,008,645 B2 | 6/2018 | Bonar et al. | |
| 2008/0116463 A1* | 5/2008 | Ito ....................... | H01L 51/5203 |
| | | | 257/E33.064 |
| 2020/0203587 A1* | 6/2020 | Kim ................... | H01L 25/0753 |

FOREIGN PATENT DOCUMENTS

| | | |
|---|---|---|
| KR | 10-2017-0094930 | 8/2017 |
| KR | 10-1968592 | 4/2019 |
| KR | 10-2020-0077671 | 7/2020 |

* cited by examiner

*Primary Examiner* — Didarul A Mazumder
(74) *Attorney, Agent, or Firm* — Kile Park Reed & Houtteman PLLC

(57) ABSTRACT

A display device includes a substrate including a display area including pixel areas and a non-display area adjacent to the display area; and a pixel disposed in each of the pixel areas. The pixel includes a sub-electrode, a first conductive line, and a second conductive line on the substrate; a first insulating layer over the sub-electrode and the first and second conductive lines; first to fourth electrodes on the first insulating layer; a second insulating layer over the first and second electrodes to completely overlap the first and second electrodes, the second insulating layer exposing the third and fourth electrodes; light emitting elements between the first and second electrodes; a first contact electrode on the first electrode; and a second contact electrode on the second electrode.

22 Claims, 40 Drawing Sheets

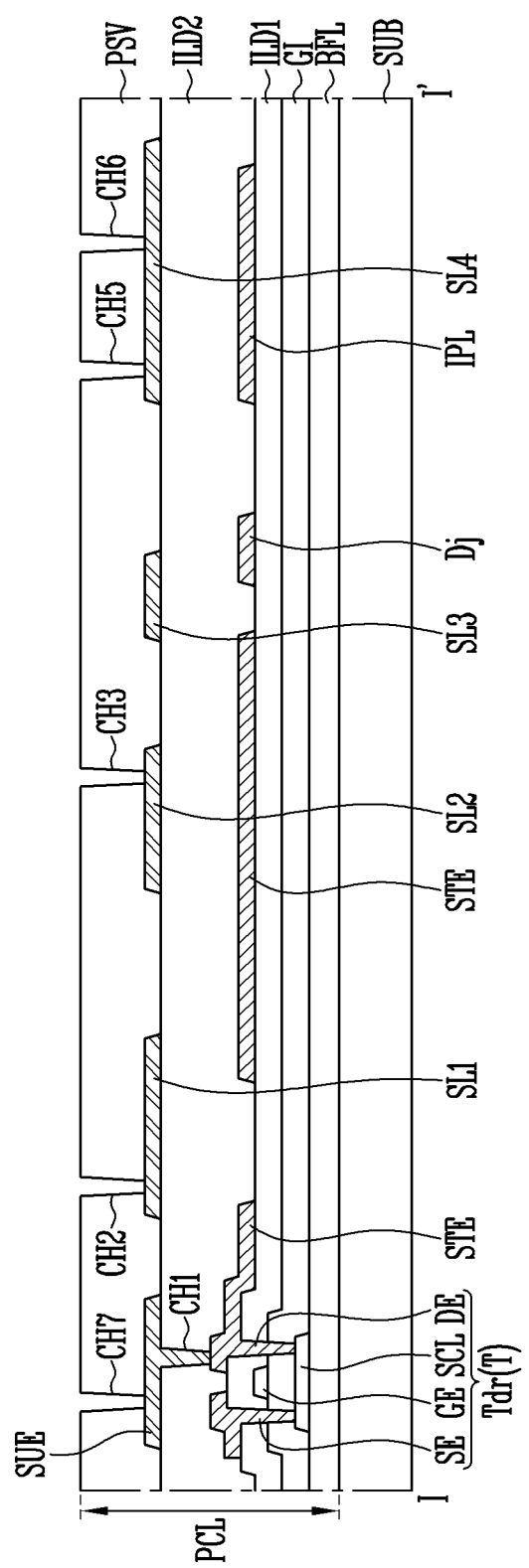

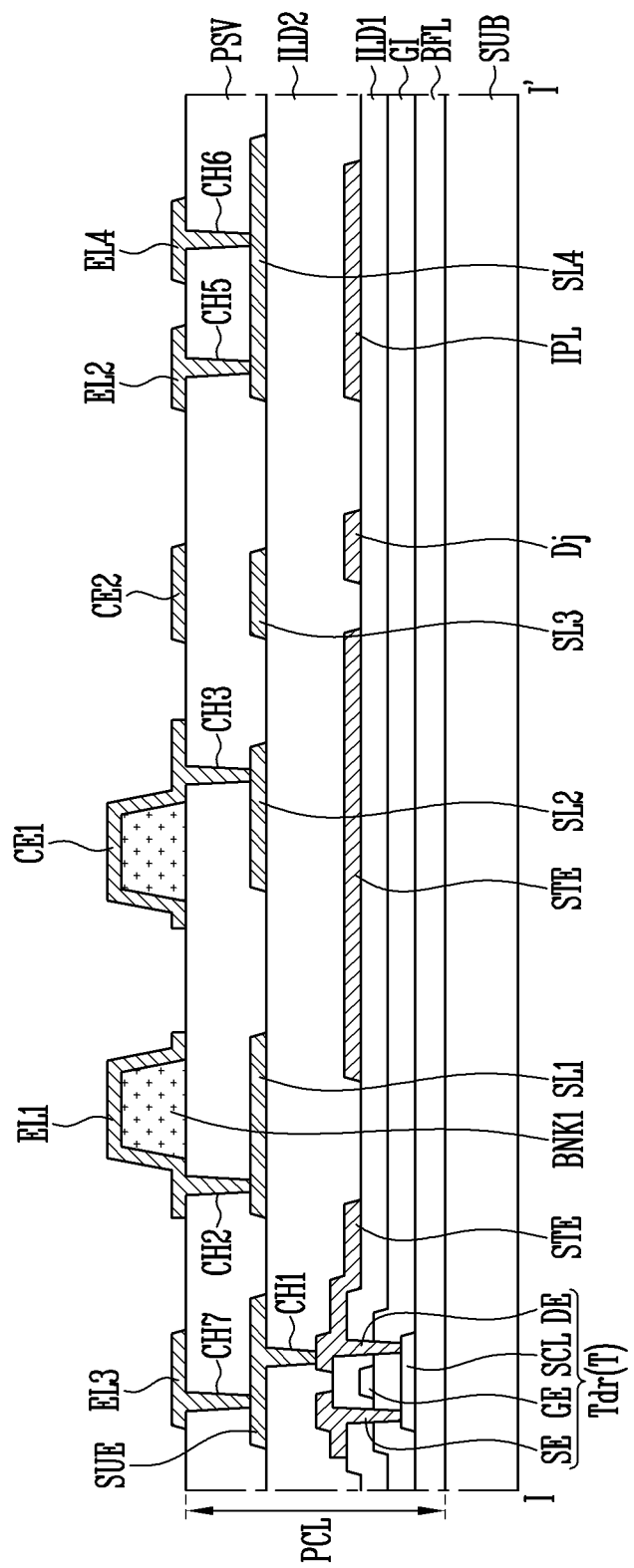

DISPLAY DEVICE WITH DIFFERENT ELECTRODES AND LIGHT EMITTING ELEMENTS

CROSS-REFERENCE TO RELATED APPLICATIONS

This application claims priority to and benefits of Korean patent application No. 10-2019-0144494 under 35 U.S.C. § 119 filed on Nov. 12, 2019 in the Korean Intellectual Property Office, the entire contents of which are incorporated herein by reference.

BACKGROUND

1. Technical Field

The disclosure generally relates to a display device and a method of fabricating the display device.

2. Description of the Related Art

Light emitting diodes exhibit relatively satisfactory durability even in poor environmental conditions and have excellent performance in terms of lifespan and luminance.

In order to apply a light emitting diode to a lighting device, a display device or the like, it may be necessary to electrically connect an electrode that applies power to the light emitting diode. The arrangement or the relationship between the light emitting diode and the electrode has been widely researched in terms of purpose of use, a decrease in space occupied by the electrode, a fabricating method, a driving method, or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device formed through a fabricating process by decreasing a number of masks, and a method of fabricating the display device.

In an embodiment, a display device may include a substrate including a display area including a plurality of pixel areas, and a non-display area adjacent to the display area; and a pixel disposed in each of the pixel areas.

The pixel may include a sub-electrode, a first conductive line, and a second conductive line, disposed on the substrate, wherein the sub-electrode, the first conductive line, and the second conductive line may be spaced apart from each other; a first insulating layer disposed over the sub-electrode and the first and second conductive lines; first to fourth electrodes disposed on the first insulating layer, wherein the first to fourth electrodes may be spaced apart from each other; a second insulating layer disposed over the first and second electrodes to completely overlap the first and second electrodes, the second insulating layer exposing the third and fourth electrodes; a plurality of light emitting elements disposed on the second insulating layer between the first and second electrodes; a first contact electrode disposed on the first electrode, wherein the second insulating layer may be disposed between the first contact electrode and the first electrode; and a second contact electrode disposed on the second electrode, wherein the second insulating layer may be disposed between the second contact electrode and the second electrode.

The pixel may include third and fourth conductive lines disposed on the substrate, the third and fourth conductive lines being disposed between the first conductive line and the second conductive line; and first and second intermediate electrodes disposed on the second insulating layer, the first and second intermediate electrodes being disposed between the first electrode and the second electrode.

The second insulating layer may be disposed over the first and second intermediate electrodes to completely overlap the first and second intermediate electrodes.

The first electrode may extend in a same direction as the first conductive line on the first insulating layer, the second electrode may extend in a same direction as the second conductive line on the first insulating layer, the first intermediate electrode may extend in a same direction as the third conductive line on the first insulating layer, and the second intermediate electrode may extend in a same direction as the fourth conductive line on the first insulating layer.

The first electrode may overlap the first conductive line, the second electrode may overlap the second conductive line, the first intermediate electrode may overlap the third conductive line, and the second intermediate electrode may overlap the fourth conductive line.

The first insulating layer may include a plurality of contact holes exposing a portion of the sub-electrode, a portion of each of the first to fourth conductive lines, and another portion of the second conductive line.

The first electrode may be electrically connected to the exposed portion of the first conductive line, the second and fourth electrodes may be electrically connected to the exposed portions, respectively, of the second conductive line, the first intermediate electrode may be electrically connected to the exposed portion of the third conductive line, the second intermediate electrode may be electrically connected to the exposed portion of the fourth conductive line, and the third electrode may be electrically connected to the exposed portion of the sub-electrode.

The first conductive line and the first electrode may be connected to each other to form a double-layered structure including the first insulating layer disposed between the first conductive line and the first electrode, the second conductive line and the second electrode may be connected to each other to form a double-layered structure including the first insulating layer disposed between the second conductive line and the second electrode, the third conductive line and the first intermediate electrode may be connected to each other to form a double-layered structure including the first insulating layer disposed between the third conductive line and the first intermediate electrode, and the fourth conductive line and the second intermediate electrode may be connected to each other to form a double-layered structure including the first insulating layer disposed between the fourth conductive line and the second intermediate electrode.

The second conductive line, the second electrode, and the fourth electrode may be electrically connected to each other.

The first contact electrode may be directly disposed on the third electrode and an end portion of each of the plurality of light emitting elements, and the second contact electrode may be directly disposed on the fourth electrode and another end portion of each of the plurality of light emitting elements.

The first contact electrode may electrically connect the third electrode and an end portion of each of the plurality of light emitting elements, and the second contact electrode may electrically connect the fourth electrode and another end portion of each of the plurality of light emitting elements.

The pixel may include a third contact electrode spaced apart from the first and second contact electrodes and disposed on the first intermediate electrode, the second insulating layer being disposed between the third contact electrode and the first intermediate electrode; and a fourth contact electrode spaced apart from the first to third contact electrodes and disposed on the second intermediate electrode, the second insulating layer being disposed between the fourth contact electrode and the second intermediate electrode.

The third contact electrode and the first intermediate electrode may be electrically separated from each other, and the fourth contact electrode and the second intermediate electrode may be electrically separated from each other.

The pixel may include a transistor disposed between the substrate and the first to fourth conductive lines, and a signal line electrically connected to the transistor. The transistor may be electrically connected to the sub-electrode.

The pixel may include a third insulating layer disposed over an upper surface of each of the plurality of light emitting elements. The first and second contact electrodes may be disposed on the third insulating layer.

The first contact electrode and the second contact electrode may be disposed in the same layer.

The first contact electrode and the second contact electrode may be disposed in different layers.

Each of the plurality of light emitting elements may include a first semiconductor layer doped with a first conductive dopant; a second semiconductor layer doped with a second conductive dopant; and an active layer disposed between the first semiconductor layer and the second semiconductor layer.

Also provided is a method of fabricating a display device. The method may include forming a pixel in each pixel area.

The forming of the pixel may include forming a sub-electrode and first to fourth conductive lines on a substrate, the sub-electrode and the first to fourth conductive lines being spaced apart from each other; forming a first insulating layer over the sub-electrode and the first to fourth conductive lines; forming first to fourth electrodes and first and second intermediate electrodes on the first insulating layer, wherein the first to fourth electrodes and the first and second intermediate electrodes are spaced apart from each other; forming a second insulating layer over the first and second electrodes and the first and second intermediate electrodes. The forming of the second insulating layer may include forming the second insulating layer completely overlapping each of the first and second electrodes and the first and second intermediate electrodes, and forming the second insulating layer not overlapping the third and fourth electrodes. The method may also include aligning a plurality of light emitting elements on the second insulating layer between two adjacent electrodes among the first and second electrodes and the first and second intermediate electrodes; and forming first and fourth contact electrodes on the second insulating layer.

The first contact electrode may be electrically connected to one of the third and fourth electrodes, and the second contact electrode may be electrically connected to the other of the third and fourth contact electrodes.

The forming of the first insulating layer may include applying an insulating material onto the sub-electrode and the first to fourth conductive lines; and forming a plurality of contact holes exposing a portion of the sub-electrode, a portion of each of the first to fourth conductive lines, and another portion of the second conductive line, by removing a portion of the insulating material.

The forming of the pixel may include connecting the first conductive line and the first electrode to form a double-layered structure including the first insulating layer disposed between the first conductive line and the first electrode, connecting the second conductive line and the second electrode to form a double-layered structure including the first insulating layer disposed between the second conductive line and the second electrode, connecting the third conductive line and the first intermediate electrode to form a double-layered structure including the first insulating layer disposed between the third conductive line and the first intermediate electrode, and connecting the fourth conductive line and the second intermediate electrode to form a double-layered structure including the first insulating layer disposed between the fourth conductive line and the second intermediate electrode.

The forming of the pixel may include forming a transistor and signal lines electrically connected to the transistor on the substrate, before the forming of the sub-electrode and the first to fourth conductive lines.

BRIEF DESCRIPTION OF THE DRAWINGS

Embodiments will now be described more fully hereinafter with reference to the accompanying drawings; however, embodiments may be embodied in different forms and should not be construed as limited to the embodiments set forth herein. Rather, these embodiments are provided so that this disclosure will be thorough and complete, and will fully convey the scope of the disclosure to those skilled in the art.

FIGS. 17A to 17I are schematic cross-sectional views sequentially illustrating a method of fabricating the one pixel shown in FIG. 9A.

DETAILED DESCRIPTION OF THE EMBODIMENTS

Figure 1A:
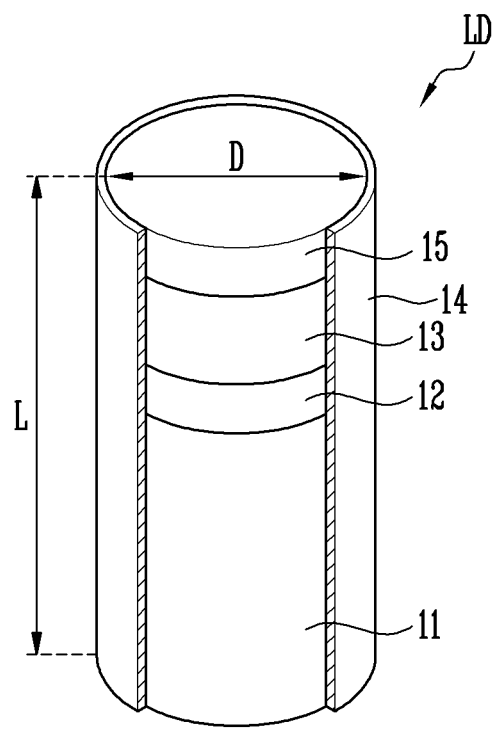
FIG. 1A is a perspective view schematically illustrating a light emitting element in accordance with an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other layer, film, region, substrate, or area, or intervening layers, films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings. In the following description, singular forms in the disclosure are intended to include the plural forms as well, unless the context clearly indicates otherwise.

Figure 1B:
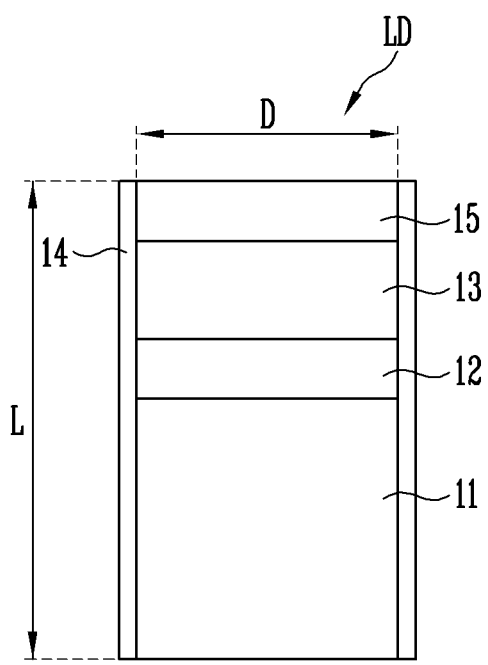
FIG. 1B is a schematic cross-sectional view of the light emitting element shown in FIG. 1A.
Figure 2A:
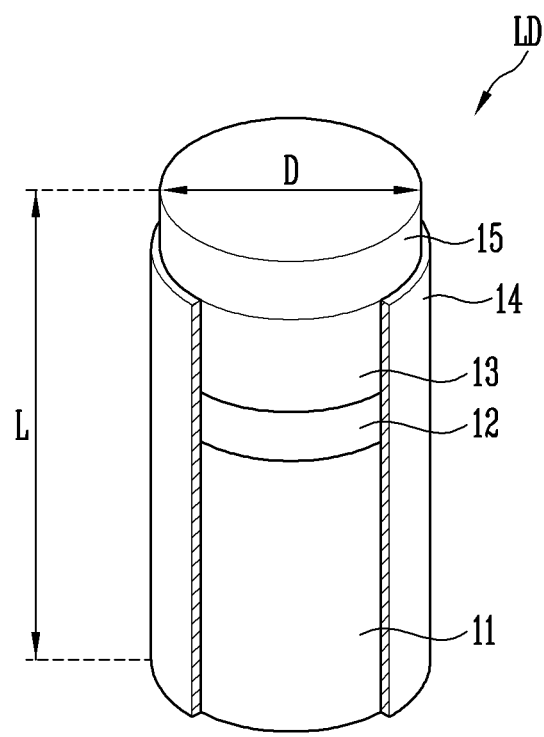
FIG. 2A is a perspective view schematically illustrating a light emitting element in accordance with an embodiment.
Figure 2B:
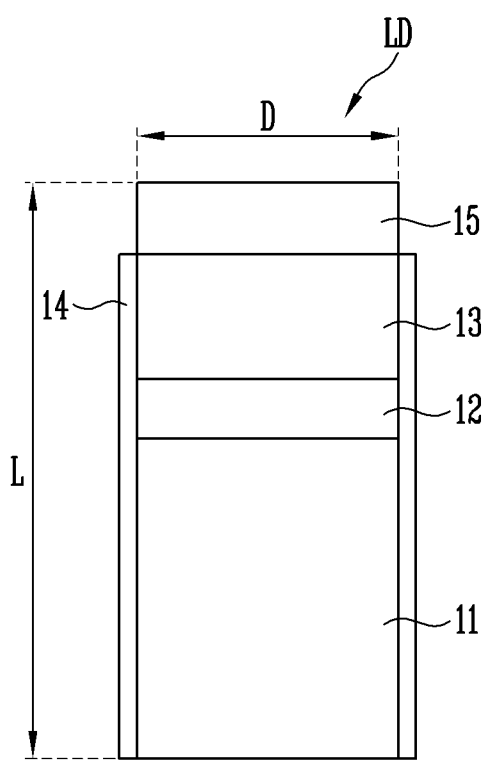
FIG. 2B is a schematic cross-sectional view of the light emitting element shown in FIG. 2A.
Figure 3A:
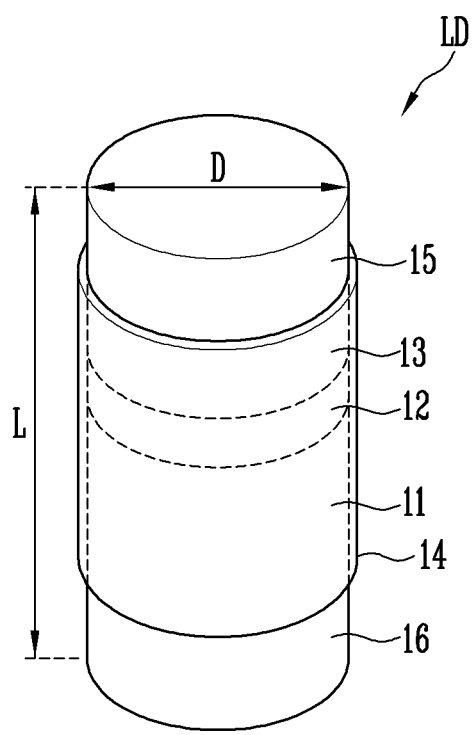
FIG. 3A is a perspective view schematically illustrating a light emitting element in accordance with an embodiment.
Figure 3B:
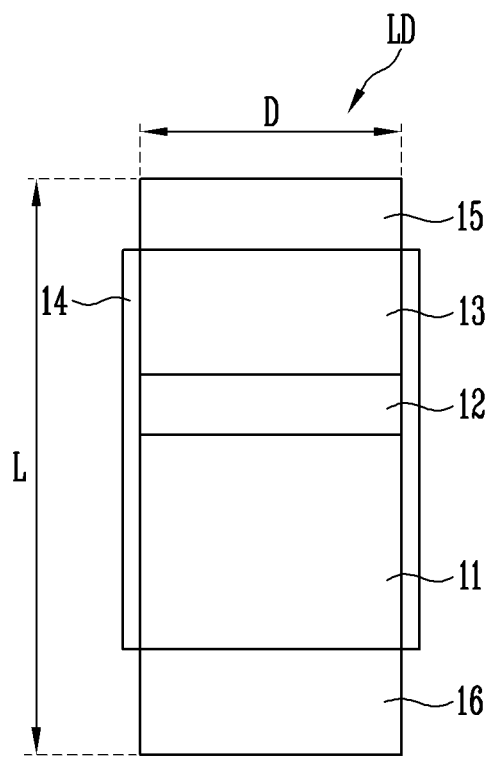
FIG. 3B is a schematic cross-sectional view of the light emitting element shown in FIG. 3A.
Figure 4A:
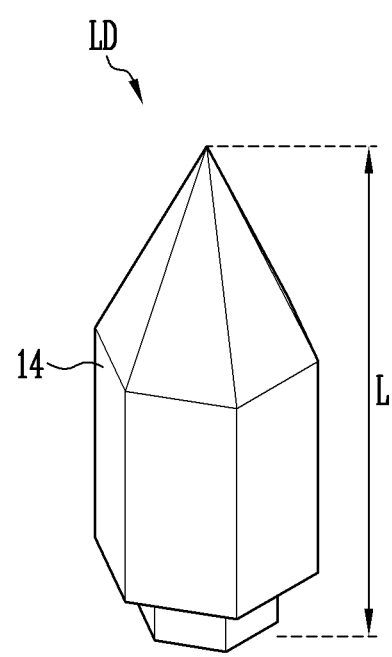
FIG. 4A is a perspective view schematically illustrating a light emitting element in accordance with an embodiment.
Figure 4B:
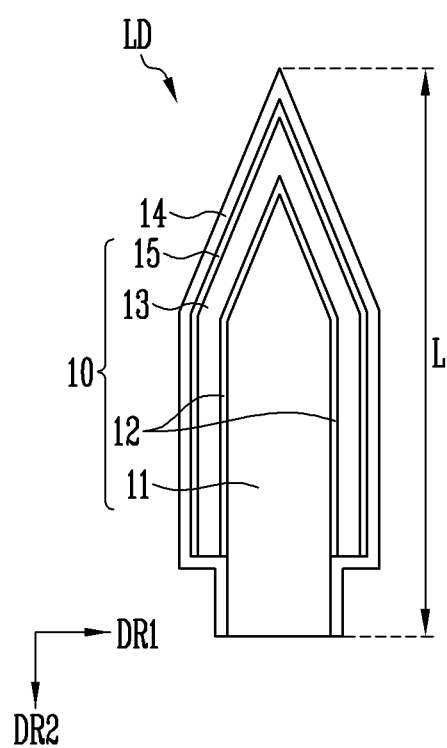
FIG. 4B is a schematic cross-sectional view of the light emitting element shown in FIG. 4A.

FIG. 1A is a perspective view schematically illustrating a light emitting element in accordance with an embodiment. FIG. 1B is a schematic cross-sectional view of the light emitting element shown in FIG. 1A. FIG. 2A is a perspective view schematically illustrating a light emitting element in accordance with an embodiment. FIG. 2B is a schematic cross-sectional view of the light emitting element shown in FIG. 2A. FIG. 3A is a perspective view schematically illustrating a light emitting element in accordance with an embodiment. FIG. 3B is a schematic cross-sectional view of the light emitting element shown in FIG. 3A. FIG. 4A is a perspective view schematically illustrating a light emitting element in accordance with an embodiment. FIG. 4B is a schematic cross-sectional view of the light emitting element shown in FIG. 4A.

For convenience, FIGS. 1A, 1B, 2A, 2B, 3A, and 3B, which illustrate light emitting elements fabricated through an etching process, will be described, and FIGS. 4A and 4B, which illustrate a light emitting element fabricated through a growth process, will be then described. In an embodiment, kinds or types and/or shapes of the light emitting elements are not limited to the embodiments shown in FIGS. 1A, 1B, 2A, 2B, 3A, 3B, 4A, and 4B. Other types and/or shapes of the light emitting elements may thus be included within the spirit and the scope of the disclosure.

Referring to FIGS. 1A, 1B, 2A, 2B, 3A, and 3B, each light emitting element LD may include a first semiconductor layer 11, a second semiconductor layer 13, and an active layer 12 interposed or disposed between the first and second semiconductor layers 11 and 13. In an example, the light emitting element LD may be a light emitting stack structure in which the first semiconductor layer 11, the active layer 12, and the second semiconductor layer 13 may be sequentially stacked.

In accordance with an embodiment, the light emitting element LD may be provided in a shape extending in one direction. In a case where an extending direction of the light emitting element LD may be a length direction, the light emitting element LD may have an end portion and another end portion along the extending direction. Any one of the first and second semiconductor layers 11 and 13 may be disposed at an end portion of the light emitting element LD, and the other of the first and second semiconductor layers 11 and 13 may be disposed at the other end portion of the light emitting element LD.

The light emitting element LD may be provided in or formed of various shapes. In an example, the light emitting element LD may have a substantially rod-like shape or bar-like shape, which may be long in its length direction for example, its aspect ratio may be greater than 1). In an embodiment, a length L of the light emitting element LD in the length direction may be larger than a diameter D (or a width of a cross-section) of the light emitting element LD. The light emitting element LD may include, for example, a light emitting diode fabricated small enough to have a diameter D and/or a length L within a range of micro scales or nano scales. In an embodiment, the size of the light emitting element LD may be modified to be suitable for requirements (or design conditions) of a lighting element or a self-luminescent display device, to which the light emitting element LD may be applied.

The first semiconductor layer 11 may include, for example, at least one n-type semiconductor layer. For example, the first semiconductor layer 11 may include any one semiconductor material among InAlGaN, GaN, AlGaN, InGaN, AlN, and InN, and may include an n-type semiconductor layer doped with a first conductive dopant such as Si, Ge or Sn. However, the material constituting the first semiconductor layer 11 is not limited thereto. For example, the first semiconductor layer 11 may include various materials.

The active layer 12 may be formed or disposed on the first semiconductor layer 11, and may be formed in a single or multiple quantum well structure. The position of the active layer 12 may be variously changed depending on a kind or a type of the light emitting element LD. The active layer 12 may emit light having a wavelength in a range of about 400 nm to about 900 nm, and may use a double hetero structure. In an embodiment, a clad layer (not shown) doped with a conductive dopant may be formed or disposed on the top and/or the bottom of the active layer 12. In an example, the clad layer may be formed as an AlGaN layer or InAlGaN layer. In an embodiment, a material such as AlGaN or AlInGaN may be used to form the active layer 12. For example, the active layer 12 may include various materials.

When an electric field having a predetermined voltage or more is applied to both end portions of the light emitting element LD, the light emitting element LD may emit light as electron-hole pairs are combined in the active layer 12. The light emission of the light emitting element LD may be controlled using the combining of the electron-hole pairs, so that the light emitting element LD may be applied as a light source for various light emitting apparatuses, including a pixel of a display device.

The second semiconductor layer 13 may be formed or disposed on the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and may include a p-type semiconductor layer doped with a second conductive dopant such as Mg. However, the material constituting the second semiconductor layer 13 is not limited thereto. For example, the second semiconductor layer 13 may be include various materials.

In an embodiment, the first semiconductor layer 11 and the second semiconductor layer 13 may have different widths (or thicknesses) in the length L direction of the light emitting element LD. In an example, the first semiconductor layer 11 may have a width (or thickness) relatively wider (or thicker) than that of the second semiconductor layer 13 along the length L direction of the light emitting element LD. Accordingly, the active layer 12 of the light emitting element LD may be located or disposed more adjacent to an upper surface of the second semiconductor layer 13 than a lower surface of the first semiconductor layer 11 as shown in FIGS. 1A to 3B.

In accordance with an embodiment, the light emitting element LD may include an additional electrode 15 disposed on a top of the second semiconductor layer 13, in addition to the first semiconductor layer 11, the active layer 12, and the second semiconductor layer 13, which are described above. In an embodiment, the light emitting element LD may include another additional electrode 16 disposed at an end of the first semiconductor layer 11 as shown in FIGS. 3A and 3B.

The additional electrodes 15 and 16 may be ohmic contact electrodes, but the disclosure is not limited thereto. In an embodiment, the additional electrodes 15 and 16 may be Schottky contact electrodes. The additional electrodes 15 and 16 may include a metal or a metal oxide. For example, the additional electrodes 15 and 16 may include one of or a mixture of chromium (Cr), titanium (Ti), aluminum (Al), gold (Au), nickel (Ni), indium tin oxide (ITO), and any oxide or alloy thereof, but the disclosure is not limited thereto.

Materials respectively included in the additional electrodes 15 and 16 may be identical to, substantially identical to, or different from each other. The additional electrodes 15 and 16 may be substantially transparent or translucent. Accordingly, light generated in the light emitting element LD may be emitted to the outside of the light emitting element LD by passing through the additional electrodes 15 and 16. In an embodiment, when light generated in the light emitting element LD does not pass through the additional electrodes 15 and 16 and is emitted to the outside of the light emitting element LD through an area except both the end portions of the light emitting element LD, the additional electrodes 15 and 16 may include an opaque metal.

In an embodiment, the light emitting element LD may include an insulating film 14. However, in an embodiment, the insulating film 14 may be omitted, and be provided to cover or to overlap only portions of the first semiconductor layer 11, the active layer 12, and the second semiconductor layer 13.

The insulating film 14 may prevent an electrical short circuit that may occur when the active layer 12 is in electrical contact with a conductive material except the first semiconductor layer 11 and the second semiconductor layer 13. The insulating film 14 may be formed, so that a surface defect of the light emitting element LD may be minimized, thereby improving the lifespan and efficiency of the light emitting element LD. When light emitting elements LD are densely disposed, the insulating film 14 may prevent an unwanted short circuit that may occur between the light emitting elements LD. Whether the insulating film 14 is provided is not limited as long as the active layer 12 may prevent an occurrence of a short circuit with external conductive material.

As shown in FIGS. 1A and 1B, the insulating film 14 may be provided in a shape entirely surrounding the outer circumference of the light emitting stack structure including the first semiconductor layer 11, the active layer 12, the second semiconductor layer 13, and the additional electrode 15. For convenience of description, a case where a portion of the insulating layer 14 may be omitted is illustrated in FIG. 1A, and the first semiconductor layer 11, the active layer 12, the second semiconductor layer 13, and the additional electrode 15, which may be included in the actual light emitting element LD, may be surrounded by the insulating film 14.

Although a case where the insulating film 14 may be provided in a shape entirely surrounding the outer circumference of each of the first semiconductor layer 11, the active layer 12, the second semiconductor layer 13, and the additional electrode 15 is described in the above-described embodiment, the disclosure is not limited thereto.

In an embodiment, as shown in FIGS. 2A and 2B, the insulating film 14 may surround the outer circumference of each of the first semiconductor layer 11, the active layer 12, and the second semiconductor layer 13, and may not entirely surround the outer circumference of the additional electrode 15 disposed on the second semiconductor layer 13. Alternatively, the insulating film 14 may surround only a portion of the outer circumference of the additional electrode 15, and may not surround the other of the outer circumference of the additional electrode 15. However, the insulating film 14 may expose at least both the end portions of the light emitting element LD. In an example, the insulating film 14 may expose one end portion of the first semiconductor layer 11, in addition to the additional electrode 15 disposed at one end of the second semiconductor layer 13. In an embodiment, as shown in FIGS. 3A and 3B, when the additional electrodes 15 and 16 are disposed at both the end portions of the light emitting element LD, the insulating film 14 may expose at least one area of each of the additional electrodes 15 and 16. Alternatively, in an embodiment, the insulating film 14 may not be provided.

In accordance with an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$. However, the disclosure is not limited thereto, and various materials having insulating properties may be used for the insulating film 14.

When the insulating film 14 is provided in the light emitting element LD, the active layer 12 may be prevented from being short-circuited with a first electrode (not shown) and/or a second electrode (not shown). As an example, the insulating film 14 may be formed or disposed, so that a surface defect of the light emitting element LD may be minimized, thereby improving the lifespan and efficiency of the light emitting element LD. When light emitting elements LD are densely disposed, the insulating film 14 may prevent an unwanted short circuit that may occur between the light emitting elements LD.

The above-described light emitting element LD may be used as a light emitting source for various display devices. The light emitting element LD may be fabricated through a surface treatment process. For example, when light emitting elements LD are mixed in a liquid solution (or solvent) to be supplied to each light emitting area (for example, a light emitting area of each pixel or a light emitting area of each sub-pixel), each light emitting element LD may be surfacetreated such that the light emitting elements LD may not be unevenly condensed in the solution but evenly dispersed in the solution.

A light emitting apparatus including the above-described light emitting element LD may be used in various types of devices that may require a light source, including a display device. When light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used in other types of devices that may require a light source, such as a lighting device.

A light emitting element LD fabricated through a growth process will be described with reference to FIGS. 4A and 4B.

In the description of the light emitting element LD fabricated through the growth process, portions different from those of the above-described embodiment will be mainly described to avoid redundancy. Portions not particularly described in the light emitting element LD fabricated through the growth process may follow those of the above-described embodiment. Components similar and/or identical to those of the above-described embodiment are designated by like reference numerals.

Referring to FIGS. 4A and 4B, the light emitting element LD in accordance with an embodiment a first semiconductor layer 11, a second semiconductor layer 13, and an active layer 12 interposed or disposed between the first and second semiconductor layers 11 and 13. In an embodiment, the light emitting element LD may include a light emitting pattern 10 having a core-shell structure including a first semiconductor layer 11 located or disposed at the center thereof, an active layer 12 surrounding at least one side of the first semiconductor layer 11, a second semiconductor layer 13 surrounding at least one side of the active layer 12, and an additional electrode 15 surrounding at least one side of the second semiconductor layer 13.

The light emitting element LD may be provided in a substantial poly-pyramid shape extending in one direction. In an example, the light emitting element LD may be provided in a substantially hexagonal pyramid shape. In a case that an extending direction of the light emitting element LD may be a length L direction of the light emitting element LD, the light emitting element LD may have one end portion (or lower end portion) and the other end portion (or upper end portion) along the length L direction. A portion of one of the first and second semiconductor layers 11 and 13 may be exposed at the one end portion (or lower end portion) of the light emitting element LD, and a portion of the other of the first and second semiconductor layers 11 and 13 may be exposed at the other end portion (or upper end portion) of the light emitting element LD. In an example, a portion of the first semiconductor layer 11 may be exposed at the one end portion (or lower end portion) of the light emitting element LD, and a portion of the second semiconductor layer 13 may be exposed at the other end portion (or upper end portion) of the light emitting element LD. When the light emitting element LD is applied as a light source of a display device, the exposed portion of the first semiconductor layer 11 may be in electrical contact with one of driving electrodes for driving the light emitting element LD, and the exposed portion of the second semiconductor layer 13 may be in electrical contact with another of the driving electrodes.

In an embodiment, when the light emitting element LD includes the additional electrode 15, a portion of the additional electrode 15 surrounding at least one side of the second semiconductor layer 13 may be exposed at the other end portion (or upper end portion) of the light emitting element LD. When the light emitting element LD is applied as a light source of a display device, the exposed portion of the additional electrode 15 may be in electrical contact with the another driving electrode to be electrically connected to the one electrode.

In an embodiment, the first semiconductor layer 11 may be located or disposed at a core, for example, the center (or middle) of the light emitting element LD. The light emitting element LD may be provided in a shape corresponding to that of the first semiconductor layer 11. In an example, when the first semiconductor layer 11 has a substantially hexagonal pyramid shape, the light emitting element LD and the light emitting pattern 10 may also have a substantially hexagonal pyramid shape.

The active layer 12 may be provided and/or formed in a shape surrounding the outer circumference of the first semiconductor layer 11 in the length L direction of the light emitting element LD. For example, the active layer 12 may be provided and/or formed in a shape surrounding the other area except the other end portion disposed at a lower side between both end portions of the first semiconductor layer 11 in the length L direction of the light emitting element LD.

The second semiconductor layer 13 may be provided and/or formed in a shape surrounding the active layer 12 in the length L direction of the light emitting element LD, and include a semiconductor layer having a type different from that of the first semiconductor layer 11. In an example, the second semiconductor layer 13 may include at least one p-type semiconductor layer.

In an embodiment, the light emitting element LD may include an additional electrode 15 surrounding at least one side of the second semiconductor layer 13. The additional electrode 15 may be an ohmic contact electrode or a Schottky contact electrode, which may be electrically connected to the second semiconductor layer 13, but the disclosure is not limited thereto.

As described above, the light emitting element LD may be in a substantially hexagonal pyramid shape having both protruding end portions, and may include a light emitting pattern 10 having a core-shell structure including a first semiconductor layer 11 located or disposed at the center thereof, an active layer 12 surrounding at least one side of the first semiconductor layer 11, a second semiconductor layer 13 surrounding at least one side of the active layer 12, and an additional electrode 15 surrounding at least one side of the second semiconductor layer 13. The first semiconductor layer 11 may be disposed at one end portion (or lower end portion) of the light emitting element LD having the substantially hexagonal pyramid shape, and the additional electrode 15 may be disposed at the other end portion (or upper end portion) of the light emitting element LD.

In an embodiment, the light emitting element LD may include an insulating film 14 provided or disposed on the outer circumference of the light emitting pattern 10 having the core-sell structure. The insulating film 14 may include a transparent insulating material.

Figure 5:
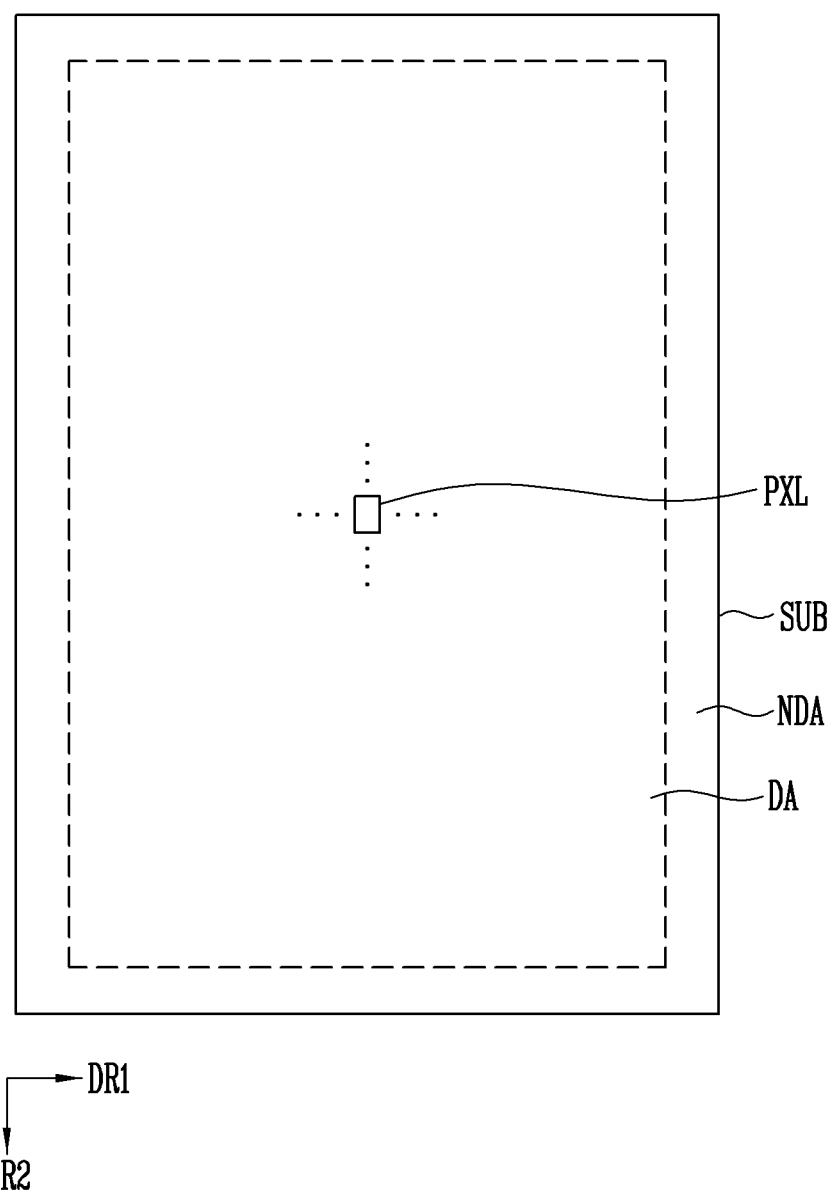
FIG. 5 illustrates a display device in accordance with an embodiment, and is a schematic plan view of a display device using, as a light emitting source, any one light emitting element among the light emitting elements shown in FIGS. 1A, 1B, 2A, 2B, 3A, 3B, 4A, and 4B.

FIG. 5 illustrates a display device in accordance with an embodiment, and for example, is a schematic plan view of a display device using, as a light emitting source, any one light emitting element among the light emitting elements shown in FIGS. 1A, 1B, 2A, 2B, 3A, 3B, 4A, and 4B.

In FIG. 5, for convenience, a structure of the display device is illustrated based on a display area in which an image or images may be displayed. However, in an embodiment, at least one driving circuit (for example, a scan driver and a data driver) and/or signal lines, which are not shown, may be disposed in the display device.

Referring to FIGS. 1A, 1B, 2A, 2B, 3A, 3B, 4A, 4B, and 5, the display device in accordance with an embodiment may include a substrate SUB, pixels PXL which may be disposed on the substrate SUB and each may include at least one light emitting element LD, a driving unit (not shown) which may be disposed on the substrate SUB and drive the pixels PXL, and a line unit (not shown) that may electrically connect the pixels PXL and the driving unit.

The display device may be classified into a passive matrix type display device and an active matrix type display device according to a method of driving the light emitting element LD. In an example, when the display device is implemented as the active matrix type display device, each of the pixels PXL may include a driving transistor for controlling an amount of current supplied to the light emitting element LD, a switching transistor for transferring a data signal to the driving transistor, and the like within the spirit and the scope of the disclosure.

The active matrix type display device in which light may be selectively emitted for each pixel PXL has recently become mainstream from the viewpoint of resolution, contrast, and operation speed. However, the disclosure is not limited thereto, and the passive matrix type display device in which light may be emitted for each group of pixels PXL may also use components (for example, first and second electrodes, and the like) for driving the light emitting element LD.

The substrate SUB may include a display area DA and a non-display area NDA.

In an embodiment, the display area DA may be disposed in a central area of the display device, and the non-display area NDA may be disposed in an edge area of or adjacent to the display device to surround the display area DA. However, the positions of the display area DA and the non-display area NDA are not limited thereto, and may be varied within the spirit and the scope of the disclosure.

The display area DA may be an area in which the pixels PXL for displaying an image or images may be provided. The non-display area NDA may be an area in which the driving unit for driving the pixels PXL and a portion of the line unit which electrically connects the pixels PXL and the driving unit may be provided.

The display area DA may have various shapes. For example, the display area DA may be provided in a closed substantially polygonal shape including substantially linear sides. The display area DA may be provided in a substantially circular shape and/or a substantially elliptical shape, including a substantially curved side. The display area DA may be provided in various shapes such as a substantially semicircle or a substantially semi-ellipse, including substantially linear and substantially curved sides.

The non-display area NDA may be provided at at least a side of the display area DA. In an embodiment, the non-display area NDA may surround the circumference (or edge) of the display area DA.

The substrate SUB may include a transparent insulating material to enable light to be transmitted therethrough. The substrate SUB may be a rigid substrate or a flexible substrate.

An area on the substrate SUB may be provided as the display area DA such that the pixels PXL may be disposed therein, and another area on the substrate SUB may be provided as the non-display area NDA. In an example, the substrate SUB may include the display area DA including pixel areas in which the respective pixels PXL may be disposed and the non-display area NDA disposed at the periphery of the display area DA.

Each of the pixels PXL may be provided or disposed in the display area DA. In an embodiment, the pixels PXL may be arranged or disposed in a stripe or pentile arrangement structure in the display area DA, but the disclosure is not limited thereto.

Each pixel PXL may include at least one light emitting element LD driven by a corresponding scan signal and a corresponding data signal. The light emitting element LD may have a small size in a range of micro scales or nano scales, and may be electrically connected in parallel to light emitting elements disposed adjacent thereto. However, the disclosure is not limited thereto. The light emitting element LD may constitute a light source of each pixel PXL.

Each pixel PXL may include at least one light source driven by a predetermined signal (for example, a scan signal and a data signal) and/or a predetermined power source (for example, a first driving power source and a second driving power source). For example, each pixel PXL may include the light emitting element LD illustrated in embodiments shown in FIGS. 1A to 4B, for example, at least one micro light emitting element LD having a small size in a range of micro scales or nano scales. However, in an embodiment, the kind or type of the light emitting element LD which may be used as the light source of the pixel PXL is not limited thereto.

In an embodiment, the color, kind, or type, and/or number of the pixels PXL are not particularly limited. In an example, the color of light emitted by each pixel PXL may vary within the spirit and the scope of the disclosure.

The driving unit may provide a predetermined signal and a predetermined power source to each pixel PXL through the line unit, and accordingly, the driving of the pixel PXL may be controlled. In FIG. 5, the line unit may be omitted for convenience of description.

The driving unit may include a scan driver that may provide a scan signal to the pixels PXL through scan lines, an emission driver that may provide an emission control signal to the pixels PXL through emission control lines, a data driver that may provide a data signal to the pixels PXL through data lines, and a timing controller. The timing controller may control the scan driver, the emission driver, and the data driver.

FIGS. 6A to 6E are equivalent circuit diagrams illustrating embodiments of an electrical connection among components included in one pixel shown in FIG. 5.

For example, FIGS. 6A to 6E illustrate embodiments of an electrical connection among components included in the pixel PXL applicable to an active matrix display device. However, the kinds or types of the components included in the pixel PXL to which the embodiments are applicable are not limited thereto.

In FIGS. 6A to 6E, the pixel PXL comprehensively may include not only components included in each of the pixels shown in FIGS. 6A to 6E but also an area in which the components may be provided or disposed. In an embodiment, each of pixels PXL shown in FIGS. 6A to 6E may be any one of the pixels PXL provided or disposed in the display device shown in FIG. 5, and the pixels PXL may have structures substantially identical or similar to one another.

Referring to FIGS. 1A to 4B, 5, and 6A to 6E, one pixel PXL (hereinafter, referred to as a 'pixel') may include a light emitting unit EMU which may generate light with a luminance corresponding to a data signal. The pixel PXL may include a pixel circuit 144 that may drive the light emitting unit EMU.

In an embodiment, the light emitting unit EMU may include light emitting elements LD electrically connected in parallel between a first power line PL1 to which a first driving power source VDD may be applied and a second power line PL2 to which a second driving power source VSS may be applied. For example, the light emitting unit EMU may include a first electrode EL1 (or "first alignment electrode") electrically connected to the first driving power source VDD via the pixel circuit 144 and the first power line PL1, a second electrode EL2 (or "second alignment electrode") electrically connected to the second driving power source VSS through the second power line PL2, and light emitting elements LD electrically connected in parallel in the same direction between the first and second electrodes EL1 and EL2. In an embodiment, the first electrode EL1 may be an anode electrode, and the second electrode EL2 may be a cathode electrode.

In an embodiment, each of the light emitting elements LD included in the light emitting unit EMU may include one end portion electrically connected to the first driving power source VDD through the first electrode EL1 and the other end portion electrically connected to the second driving power source VSS through the second electrode EL2. The first driving power source VDD and the second driving power source VSS may have different potentials. In an example, the first driving power source VDD may be set as a high-potential power source, and the second driving power source VSS may be set as a low-potential power source. The potential difference between the first and second driving power sources VDD and VSS may be set to a threshold voltage or more of the light emitting elements LD during an emission period of the pixel PXL.

As described above, the light emitting elements LD electrically connected in parallel in the same direction (for example, a forward direction) between the first electrode EL1 and the second electrode EL2, to which difference voltages may be supplied, may form effective light sources, respectively. The effective light sources may constitute the light emitting unit EMU of the pixel PXL.

Each of the light emitting elements LD of the light emitting unit EMU may emit light with a luminance corresponding to a driving current supplied through a corresponding pixel circuit 144. For example, the pixel circuit 144 may supply, to the light emitting unit EMU, a driving current corresponding to a grayscale value of corresponding frame data during each frame period. The driving current supplied to the light emitting unit EMU may be divided to flow through the light emitting elements LD electrically connected in the same direction. Accordingly, the light emitting unit EMU may emit light with a luminance corresponding to the driving current while each light emitting element LD may be emitting light with a luminance corresponding to a current flowing therethrough.

Figure 6A:
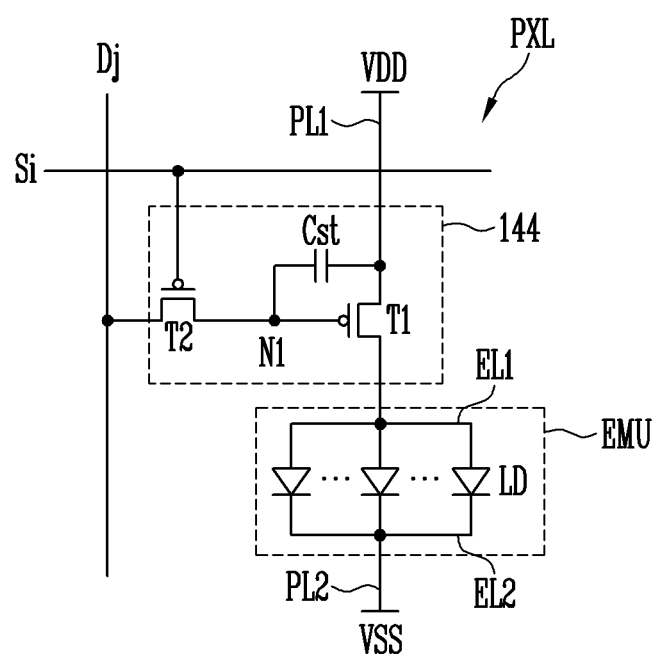
FIGS. 6A to 6E are equivalent circuit diagrams illustrating various embodiments of an electrical connection among components included in one pixel shown in FIG. 5.
Figure 6B:
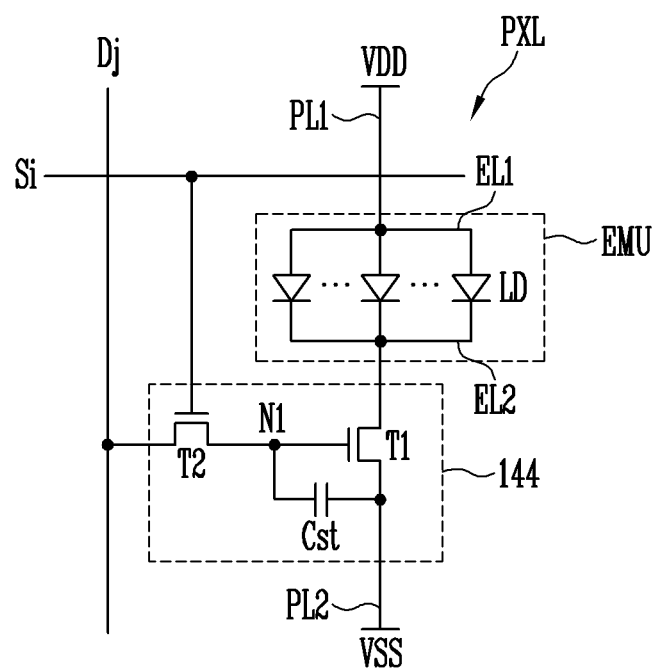
Figure 6C:
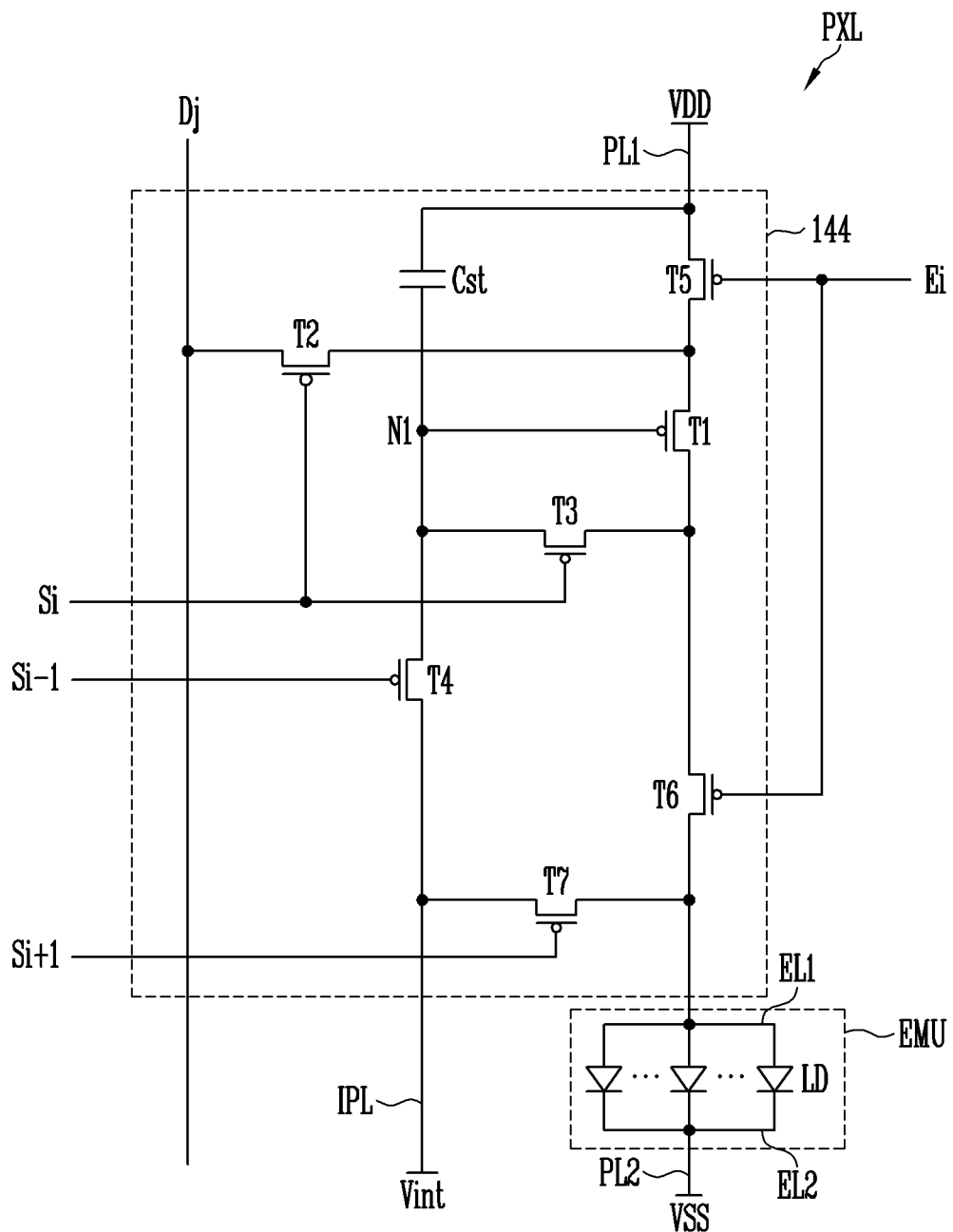
Figure 6D:
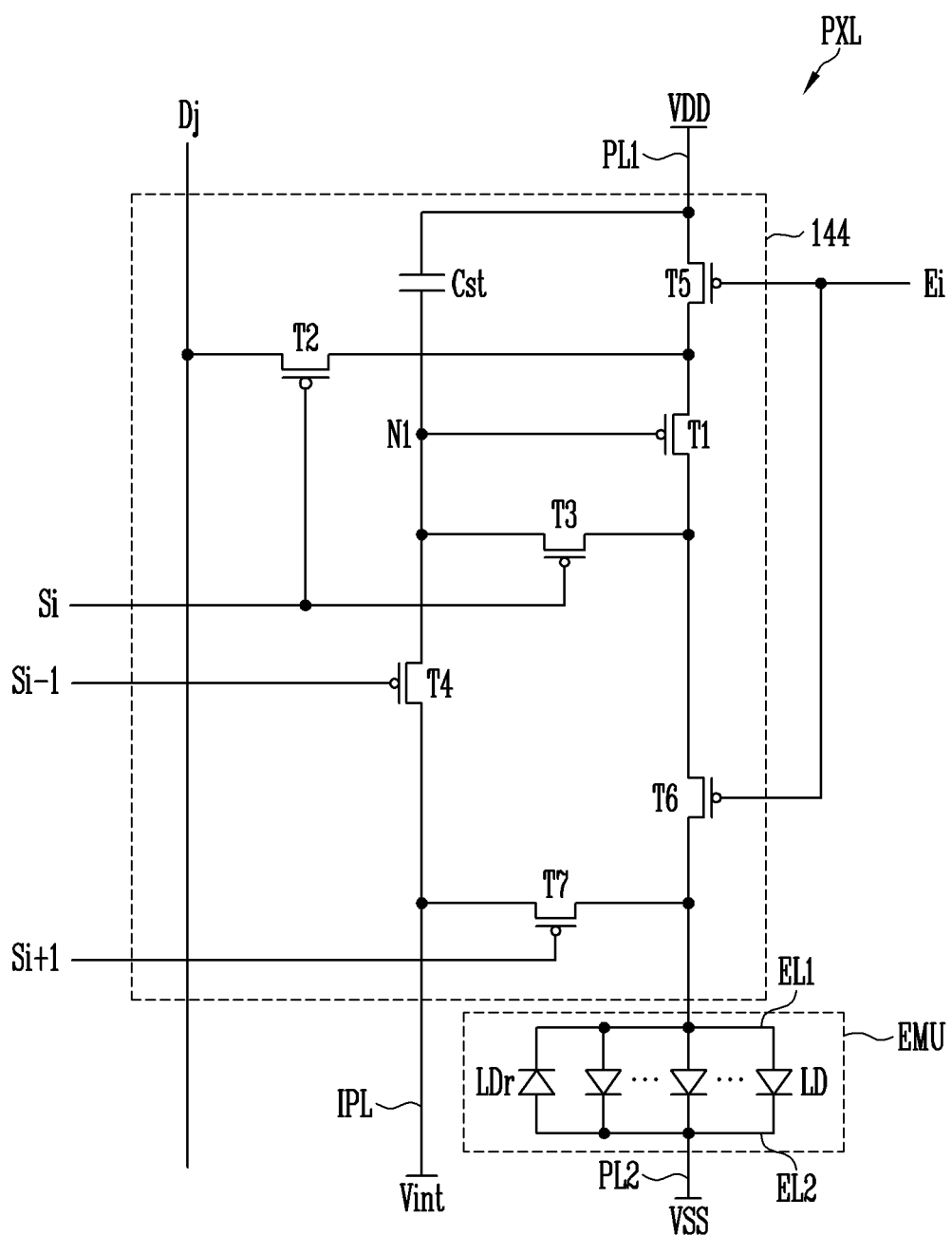
Figure 6E:
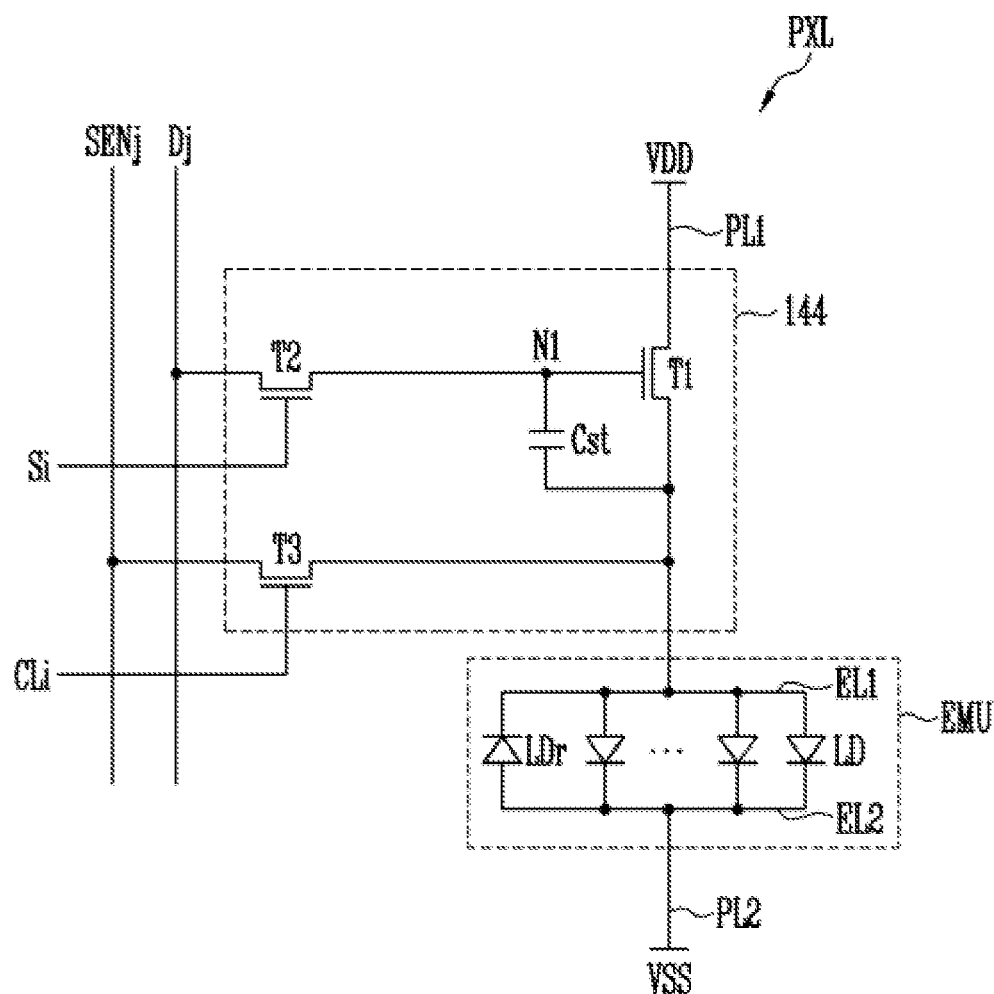

Meanwhile, although an embodiment in which the light emitting elements LD may be electrically connected in the same direction between the first and second driving power sources VDD and VSS is illustrated in FIGS. 6A to 6E, the disclosure is not limited thereto. In an embodiment, the light emitting unit EMU may include at least one ineffective light source in addition to the light emitting elements LD forming the respective effective light sources. In an example, as shown in FIGS. 6D and 6E, at least one reverse light emitting element LDr may be electrically connected between the first and second electrodes EL1 and EL2 of the light emitting unit EMU. The reverse light emitting element LDr may be electrically connected in parallel together with the light emitting elements LD forming the effective light sources between the first and second electrodes EL1 and EL2, and may be electrically connected between the first and second electrodes EL1 and EL2 in a direction opposite to that in which the light emitting element LD may be electrically connected. Although a predetermined driving voltage (for example, a forward driving voltage) may be applied between the first and second electrodes EL1 and EL2, the reverse light emitting element LDr may maintain an inactive state, and accordingly, no current may substantially flow through the reverse light emitting element LDr.

The pixel circuit 144 may be electrically connected to a scan line Si and a data line Dj of a corresponding pixel PXL. In an example, in a case that a pixel PXL may be disposed on an ith (i is a natural number) row and a jth (j is a natural number) column of the display area DA, the pixel circuit 144 of the pixel PXL may be electrically connected to an ith scan line Si and a jth data line Dj of the display area DA. In an embodiment, the pixel circuit 144 may include first and second transistors T1 and T2 and a storage capacitor Cst as shown in FIGS. 6A and 6B. However, the structure of the pixel circuit 144 is not limited to the embodiments shown in FIGS. 6A and 6B.

Referring to FIG. 6A, the pixel circuit 144 may include first and second transistors T1 and T2 and a storage capacitor Cst.

A first terminal of the second transistor T2 (switching transistor) may be electrically connected to the data line Dj, and a second terminal of the second transistor T2 may be electrically connected to a first node N1. The first terminal and the second terminal of the second transistor T2 may be different terminals. For example, when the first terminal is a source electrode, the second terminal may be a drain terminal. As an example, a gate electrode of the second transistor T2 may be electrically connected to the scan line Si.

The second transistor T2 may be turned on when a scan signal having a voltage (for example, a low voltage) at which the second transistor T2 may be turned on, to electrically connect the data line Dj and the first node N1. A data signal of a corresponding frame may be supplied to the data line Dj. Accordingly, the data signal may be transferred to the first node N1. The data signal transferred to the first node N1 may be charged in the storage capacitor Cst.

A first terminal of the first transistor T1 (driving transistor) may be electrically connected to the first driving power source VDD, and a second terminal of the first transistor T1 may be electrically connected to a first electrode EL1 of each of the light emitting elements LD. A gate electrode of the first transistor T1 may be electrically connected to the first node N1. The first transistor T1 may control an amount of driving current supplied to the light emitting elements LD, corresponding to a voltage of the first node N1.

One electrode of the storage capacitor Cst may be electrically connected to the first driving power source VDD, and the other electrode of the storage capacitor Cst may be electrically connected to the first node N1. The storage capacitor Cst may charge a voltage corresponding to the data signal supplied to the first node N1, and may maintain the charged voltage until a data signal of a next frame may be supplied.

In each of FIGS. 6A and 6B, the pixel circuit 144 is illustrated, which may include the second transistor T2 that may transfer a data signal to the inside of the pixel PXL, the storage capacitor Cst that may store the data signal, and the first transistor T1 that may supply a driving current corresponding to the data signal to the light emitting elements LD.

However, the disclosure is not limited thereto, and the structure of the pixel circuit 144 may be variously modified and embodied within the spirit and the scope of the disclosure. In an example, the pixel circuit 144 may include at least one transistor element such as a transistor element that may compensate for a threshold voltage of the first transistor T1, a transistor element that may initialize the first node N1, and/or a transistor element that may control an emission time of the light emitting elements LD, or other circuit elements such as a boosting capacitor that may boost the voltage of the first node N1.

Although a case where all the transistors, for example, the first and second transistors T1 and T2 included in the pixel circuit 144 may be a P-type transistor is illustrated in FIG. 6A, the disclosure is not limited thereto. For example, at least one of the first and second transistors T1 and T2 included in the pixel circuit 144 may be an N-type transistor.

Referring to FIGS. 1A to 4A, 5, and 6B, in accordance with an embodiment, the first and second transistors T1 and T2 may be an N-type transistor. A configuration or operation of the pixel circuit 144 shown in FIG. 6B may be similar to that of the pixel circuit 144 shown in FIG. 6A, except that electrical connection positions of some components may be changed due to a change in transistor type. Therefore, this will be briefly described.

In an embodiment, the pixel circuit 144 shown in FIG. 6A may include first and second transistors T1 and T2 as an N-type transistor and a storage capacitor Cst. When the first and second transistors T1 and T2 are the N-type transistor, the light emitting unit EMU may be electrically connected between the first driving power source VDD and the pixel circuit 144 to achieve the stability of the storage capacitor Cst which may charge a voltage corresponding to a data signal supplied to a first node N1. However, the disclosure is not limited thereto. In an embodiment, the light emitting unit EMU shown in FIG. 6B may be electrically connected between the pixel circuit 144 and the second driving power source VSS. In an embodiment, the configuration of the pixel circuit 144 is not limited to the embodiments shown in FIGS. 6A and 6B. In an example, the pixel circuit 144 may be as illustrated in the embodiments shown in FIGS. 6C and 6D.

As shown in FIGS. 6C and 6D, the pixel circuit 144 may be electrically connected to the scan line Si and the data line Dj of the pixel PXL. In an example, when assuming that a pixel PXL is disposed on an ith row and a jth column of the display area DA, the pixel circuit 144 of the corresponding pixel PXL may be electrically connected to an ith scan line Si and a jth data line Dj of the display area DA.

In an embodiment, the pixel circuit 144 may be electrically connected to at least another scan line. For example, a pixel PXL disposed on the ith row of the display area DA may be electrically connected to an (i−1)th scan line Si−1 and/or an (i+1)th scan line Si+1. In an embodiment, the pixel circuit 144 may be electrically connected to a third power source in addition to the first and second driving power sources VDD and VSS. For example, the pixel circuit 144 may be electrically connected to an initialization power source Vint.

The pixel circuit 144 may include first to seventh transistor T1 to T7 and a storage capacitor Cst.

One electrode, for example, a source electrode of the first transistor T1 (driving transistor) may be electrically connected to the first driving power source VDD via the fifth transistor T5, and another electrode, for example, a drain electrode of the first transistor T1 may be electrically connected to one end portions of light emitting elements LD via the sixth transistor T6. A gate electrode of the first transistor T1 may be electrically connected to a first node N1. The first transistor T1 may control an amount of driving current flowing between the first driving power source VDD and the second driving power source VSS via the light emitting elements LD, corresponding to a voltage of the first node N1.

The second transistor T2 (switching transistor) may be electrically connected between the jth data line Dj electrically connected to the pixel PXL and the source electrode of the first transistor T1. A gate electrode of the second transistor T2 may be electrically connected to the ith scan line Si electrically connected to the pixel PXL. The second transistor T2 may be turned on when a scan signal having a gate-on voltage (for example, a low voltage) may be supplied to the ith scan line Si, to electrically connect the jth data line Dj to the source electrode of the first transistor T1. Therefore, when the second transistor T2 is turned on, a data signal supplied from the jth data line Dj may be transferred to the first transistor T1.

The third transistor T3 may be electrically connected between the drain electrode of the first transistor T1 and the first node N1. A gate electrode of the third transistor T3 may be electrically connected to the ith scan line Si. The third transistor T3 may be turned on when a scan signal having a gate-on voltage may be supplied from the ith scan line Si, to electrically connect the drain electrode of the first transistor T1 and the first node N1 to each other.

The fourth transistor T4 may be electrically connected between the first node N1 and an initialization power line IPL to which the initialization power source Vint may be applied. A gate electrode of the fourth transistor T4 may be electrically connected to a previous scan line, for example, the (i−1)th scan line Si−1. The fourth transistor T4 may be turned on when a scan signal having a gate-on voltage may be supplied to the (i−1)th scan line Si−1, to transfer a voltage of the initialization power source Vint to the first node N1. The initialization power source Vint may have a voltage equal to or smaller than the lowest voltage of the data signal.

The fifth transistor T5 may be electrically connected between the first driving power source VDD and the first transistor T1. A gate electrode of the fifth transistor T5 may be electrically connected to a corresponding emission control line, for example, an ith emission control line Ei. The fifth transistor T5 may be turned off when an emission control signal having a gate-off voltage may be supplied to the ith emission control line Ei, and be turned on in other cases.

The sixth transistor T6 may be electrically connected between the first transistor T1 and the one end portions of the light emitting elements LD. A gate electrode of the sixth transistor T6 may be electrically connected to the ith emission control line Ei. The sixth transistor T6 may be turned off when an emission control signal having a gate-off voltage may be supplied to the ith emission control line Ei, and be turned on in other cases.

The seventh transistor T7 may be electrically connected between the one end portions of the light emitting elements LD and a power line, for example, the initialization power line IPL to which the initialization power source Vint may be applied. A gate electrode of the seventh transistor T7 may be electrically connected to any one of scan lines of a next stage, for example, the (i+1)th scan line Si+1. The seventh transistor T7 may be turned on when a scan signal having a gate-on voltage may be supplied to the (i+1)th scan line Si+1, to supply the voltage of the initialization power source Vint to the one end portions of the light emitting elements LD.

The storage capacitor Cst may be electrically connected between the first driving power source VDD and the first node N1. The storage capacitor Cst may store a voltage corresponding to a data signal supplied to the first node N1 and a threshold voltage of the first transistor T1 in each frame period.

Although a case where all the transistors, for example, the first to seventh transistors T1 to T7 included in the pixel circuit 144 are a P-type transistor may be illustrated in FIGS. 6C and 6D, the t disclosure is not limited thereto. For example, at least one of the first to seventh transistors T1 to T7 may be replaced with an N-type transistor.

In an embodiment, the configuration of the pixel circuit 144 is not limited to embodiments shown in FIGS. 6A to 6D. In an example, the pixel circuit 144 may as illustrated in an embodiment shown in FIG. 6E.

As shown in FIG. 6E, the pixel circuit 144 may be electrically connected to a control line CLi and a sensing line SENj. In an example, the pixel circuit 144 of a pixel PXL disposed on an ith row and a jth column of the display area DA may be electrically connected to an ith control line CLi and a jth sensing lien SENj of the display area DA. The pixel circuit 144 may include a third transistor T3 in addition to the first and second transistors T1 and T2 shown in FIGS. 6A and 6B.

The third transistor T3 may be electrically connected between the first transistor T1 and the sensing line SENj. For example, one electrode of the third transistor T3 may be electrically connected to one electrode (for example, a source electrode) of the first transistor T1 electrically connected to the first electrode EL1, and the other electrode of the third transistor T3 may be electrically connected to the sensing line SENj. Meanwhile, when the sensing line SENj is omitted, a gate electrode of the third transistor T3 may be electrically connected to the data line Dj.

In an embodiment, the gate electrode of the third transistor T3 may be electrically connected to the control line CLi. Meanwhile, when the control line CLi is omitted, the gate electrode of the third transistor T3 may be electrically connected to the scan line Si. The third transistor T3 may be turned on by a control signal having a gate-on voltage for example, a high level), which may be supplied to the control line CLi during a predetermined sensing period, to electrically connect the sensing line SENj and the first transistor T1.

In an embodiment, the sensing period may be a period in which characteristic information (for example, a threshold voltage of the first transistor T1, etc.) of each of the pixels PXL arranged or disposed in the display area DA. During the sensing period, a predetermined reference voltage at which the first transistor T1 may be turned on may be supplied to the first node N1 through the data line Dj and the second transistor T2, or the first transistor T1 may be turned on as each pixel PXL is electrically connected to a current source or the like within the spirit and the scope of the disclosure. The first transistor T1 may be electrically connected to the sensing line SENj as the third transistor T3 is turned on by supplying a control signal having a gate-on voltage to the third transistor T3. Accordingly, characteristic information of each pixel PXL, including the threshold voltage of the first transistor T1, for example, may be extracted through the sensing line SEj. The extracted characteristic information may be used to convert image data such that a characteristic deviation between the pixels PXL may be compensated.

Meanwhile, although an embodiment in which all of the first to third transistors T1 to T3 may be N-type transistors is illustrated in FIG. 6E, the disclosure is not limited thereto. For example, at least one of the first to third transistors T1 to T3 may be replaced with a P-type transistor. Although an embodiment in which the light emitting unit EMU may be electrically connected between the pixel circuit 144 and the second driving power source VSS is illustrated in FIG. 6E, the light emitting unit EMU may be electrically connected between the first driving power source VDD and the pixel circuit 144.

Although an embodiment in which all of the light emitting elements LD constituting each light emitting unit EMU may all be electrically connected in parallel is illustrated in FIGS. 6A to 6E, the disclosure is not limited thereto. In an embodiment, the light emitting unit EMU may include at least one serial stage including light emitting elements LD electrically connected in parallel to each other. For example, the light emitting unit EMU may be configured in a serial/parallel mixed structure. This will be described later with reference to FIGS. 7A and 7B.

The structure of a pixel PXL applicable to the disclosure is not limited to the embodiments shown in FIGS. 6A to 6E, and the corresponding pixel PXL may have various structures. In an embodiment of the disclosure, each pixel PXL may be at the inside of a passive matrix light emitting display device, for example. Therefore, the pixel circuit 144 may be omitted, and both end portions of light emitting elements LD included in the light emitting unit EMU may be directly electrically connected to the scan lines Si−1, Si, and Si+1, the data line Dj, the first power line PL1 to which the first driving power source VDD may be applied, a second power line PL2 to which the second driving power source VSS may be applied, and/or a predetermined control line.

Figure 7A:
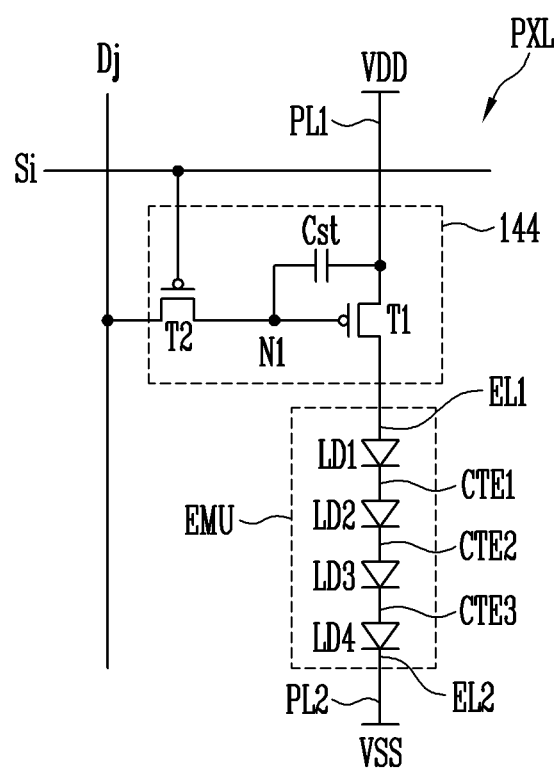
FIGS. 7A and 7B are equivalent circuit diagrams illustrating embodiments of the electrical connection among the components included in the one pixel shown in FIG. 5.
Figure 7B:
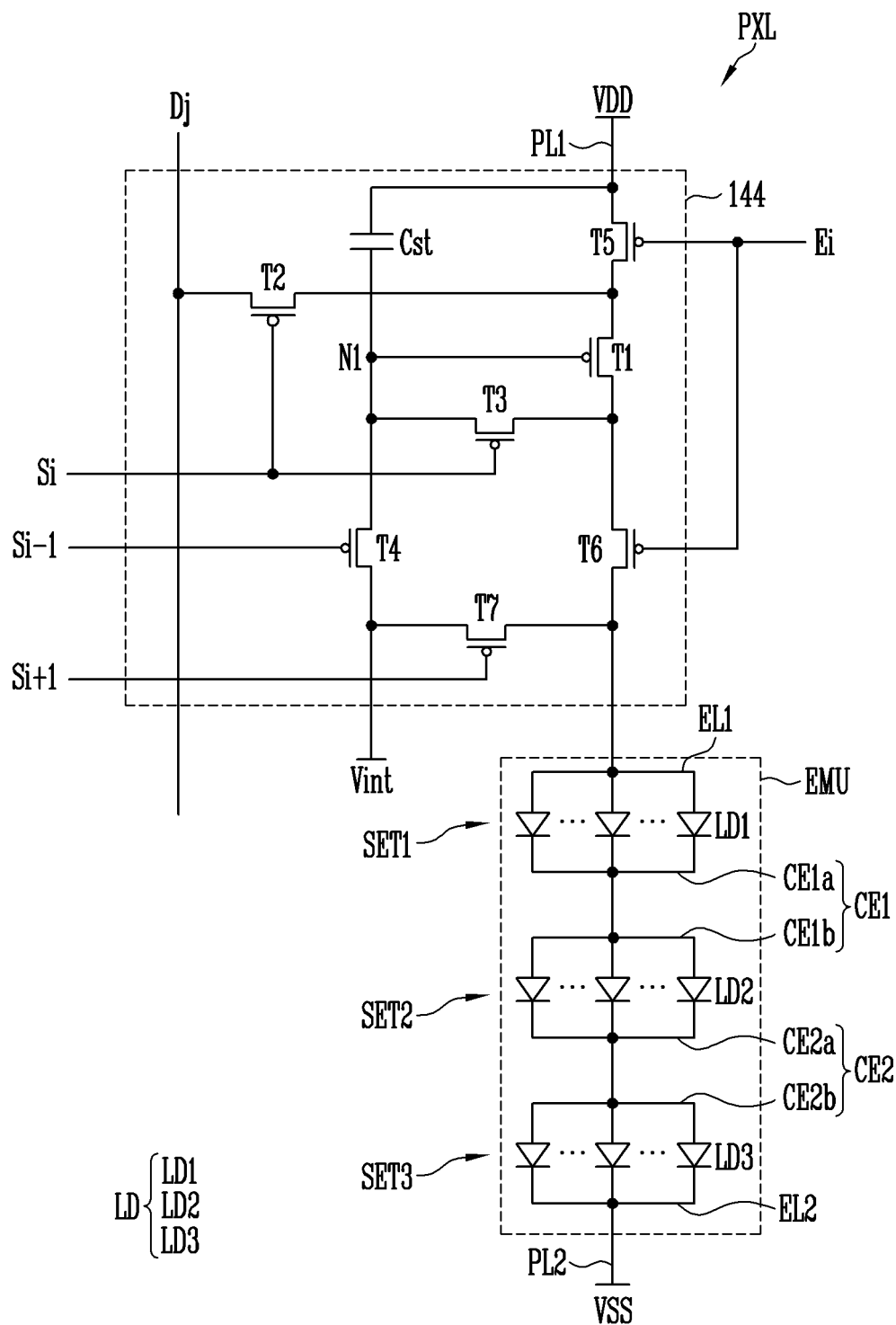

FIGS. 7A and 7B are equivalent circuit diagrams illustrating embodiments of the electrical connection among the components included in the one pixel shown in FIG. 5. In FIGS. 7A and 7B, the light emitting unit EMU of each pixel PXL may include serial stages continuously electrically connected to each other. In the description of embodiments shown in FIGS. 7A and 7B, detailed descriptions of components, for example, the pixel circuit 144 which may be similar or identical to those of embodiments shown in FIGS. 6A to 6E will be omitted to avoid redundancy.

Referring to FIG. 7A, the light emitting unit EMU may include light emitting elements electrically connected in series to each other. In an example, the light emitting unit EMU may include a first light emitting element LD1, a second light emitting element LD2, a third light emitting element LD3, and a fourth light emitting element LD4, which may be electrically connected in series in a forward direction between the first driving power source VDD and the second driving power source VSS. In a following embodiment, when at least one light emitting element among the first to fourth light emitting elements LD1 to LD4 may be arbitrarily designated or when the first to fourth light emitting elements LD1 to LD4 may be inclusively designated, the light emitting element or the light emitting elements may be referred to as a light emitting element LD or light emitting elements LD.

One end portion (for example, a second semiconductor layer) of the first light emitting element LD1 may be electrically connected to the first driving power source VDD through a first electrode EL1, and the other end portion (for example, a first semiconductor layer) of the first light emitting element LD1 may be electrically connected to one end portion (for example, a second semiconductor layer) of the second light emitting element LD2 through a first intermediate electrode CTE1 electrically connected between first and second serial stages.

The one end portion of the second light emitting element LD2 may be electrically connected to the first intermediate electrode CTE1, and the other end portion (for example, a first semiconductor layer) of the second light emitting element LD2 may be electrically connected to one end portion (for example, a second semiconductor layer) of the third light emitting element LD3 through a second intermediate electrode CTE2 electrically connected between the second serial stage and a third serial stage.

The one end portion of the third light emitting element LD3 may be electrically connected to the second intermediate electrode CTE2, and the other end portion (for example, a first semiconductor layer) of the third light emitting element LD3 may be electrically connected to one end portion (for example, a second semiconductor layer) of the fourth light emitting element LD4 through a third intermediate electrode CTE3 electrically connected between the third serial stage and a fourth serial stage.

The one end portion of the fourth light emitting element LD4 may be electrically connected to the third intermediate electrode CTE3, and the other end portion (for example, a first semiconductor layer) of the fourth light emitting element LD4 may be electrically connected to the second driving power source VSS through a second electrode EL2.

As described above, the first to fourth light emitting elements LD1 to LD4 may be electrically connected in series between the first and second electrodes EL1 and EL2 of the light emitting unit EMU of the pixel PXL.

In a light emitting unit EMU having a structure in which light emitting elements LD may be electrically connected in series, a voltage applied between the first and second electrodes EL1 and EL2 may be increased, and the magnitude of a driving current flowing through the light emitting unit EMU may be decreased, as compared with a light emitting unit EMU having a structure in which light emitting elements LD may be electrically connected in parallel. Thus, when the light emitting unit EMU of each pixel PXL is configured in a serial structure, power consumption of the display device may be reduced.

In an embodiment, at least one serial stage may be provided in a form including light emitting elements electrically connected in parallel to each other. Therefore, the light emitting unit EMU of each pixel may be configured in a series/parallel mixed structure. For example, the light emitting unit EMU may be as shown in FIG. 7B.

Referring to FIG. 7B, the pixel PXL may include a pixel circuit 144 and a light emitting unit EMU electrically connected to the pixel circuit 144. The pixel circuit 144 may include first to seventh transistors T1 to T7 and a storage capacitor Cst. In an embodiment, the pixel circuit 144 may have the same configuration as the pixel circuit 144 described with reference to FIGS. 6C and 6D, and therefore, its description will be omitted.

The light emitting unit of the pixel PXL may include serial stages sequentially electrically connected between the first and second driving power sources VDD and VSS. For example, each of the serial stages may include one or more light emitting elements LD electrically connected in a forward direction between two electrodes constituting an electrode pair of the corresponding serial stage. In an example, the light emitting unit EMU may include first to third serial stages SET1 to SET3 sequentially electrically connected between the first and second driving power sources VDD and VSS. Each of the first to third serial stages SET1 to SET3 may include two electrodes EL1 and CE1a, CE1b and CE2a, or CE2b and EL2 constituting an electrode pair of the corresponding serial stage, and light emitting elements LD electrically connected in parallel in the forward direction, for example, the same direction between the two electrodes EL1 and CE1a, CE1b and CE2a, or CE2b and EL2.

The first serial stage SET1 may include a first electrode EL1 and a 1ath intermediate electrode CE1a among the electrodes EL1 and CE1a, CE1b and CE2a, and CE2b and EL2 constituting the electrode pairs included in the light emitting unit EMU, and may include at least one first light emitting elements LD1 electrically connected between the first electrode EL1 and the 1ath intermediate electrode CE1a. In an example, the first serial stage SET1 may include a first electrode EL1 electrically connected to the first driving power source VSS via the pixel circuit 144, a 1ath intermediate electrode CE1a electrically connected to the second driving power source VSS, and first light emitting elements LD1 electrically connected between the first electrode EL1 and the 1ath intermediate electrode CE1a.

One end portion (for example, a second semiconductor layer) of each first light emitting element LD1 may be electrically connected to the first electrode EL1 of the first serial stage SET1, and the other end portion (for example, a first semiconductor layer) of the first light emitting element LD1 may be electrically connected to the 1ath intermediate electrode CE1a of the first serial stage SET1. The first light emitting elements LD1 may be electrically connected in parallel between the first electrode EL1 and the 1ath intermediate electrode CE1a of the first serial stage SET1, and may be electrically connected in the same direction (for example, the forward direction) between the first electrode EL1 and the 1ath intermediate electrode CE1a. In an embodiment, at least one reverse light emitting elements (see LDr shown in FIG. 6A) may be electrically connected to the first serial stage SET1. The reverse light emitting element LDr may be electrically connected in parallel together with the first light emitting elements LD1 constituting effective light sources between the first electrode EL1 and the 1ath intermediate electrode CE1a, and may be electrically connected in a direction opposite to that of the first light emitting elements LD1 between the first electrode EL1 and the 1ath intermediate electrode CE1a. Although a predetermined driving voltage (for example, a driving voltage in the reverse direction) may be applied between the first electrode EL1 and the 1ath intermediate electrode CE1a, the reverse light emitting element LDr may maintain the inactive state, and accordingly, no current may substantially flow through the reverse light emitting element LDr.

The second serial stage SET2 may include a 1bth intermediate electrode CE1b and a 2ath intermediate electrode CE2a among the electrodes EL1 and CE1a, CE1b and CE2a, and CE2b and EL2 constituting the electrode pairs included in the light emitting unit EMU, and may include at least one second light emitting element LD2 electrically connected between the 1bth intermediate electrode CE1b and the 2ath intermediate electrode CE2a. In an example, the second serial stage SET2 may include a 1bth intermediate electrode CE1b electrically connected to the first driving power source VDD via the pixel circuit 144 and the first serial stage SET1, a 2ath intermediate electrode CE2a electrically connected to the second driving power source VSS, and second light emitting elements LD2 electrically connected between the 1bth intermediate electrode CE1b and the 2ath intermediate electrode CE2a. One end portion (for example, a second semiconductor layer) of each second light emitting element LD2 may be electrically connected to 1bth intermediate electrode CE1b of the second serial state SET2, and the other end portion (for example, a first semiconductor layer) of the second light emitting element LD2 may be electrically connected to the 2ath intermediate electrode CE2a of the second serial stage SET2. The second light emitting elements LD2 may be electrically connected in parallel between the 1bth and 2ath intermediate electrodes CE1b and CE2a of the second serial stage SET2, and may be electrically connected in the same direction (for example, the forward direction) between the first and second driving power sources VDD and VSS through the 1bth and 2ath intermediate electrodes CE1b and CE2a. In an embodiment, at least one reverse light emitting element (see LDr shown in FIG. 6) may be electrically connected between the 1bth and 2ath intermediate electrodes CE1b and CE2a. The reverse light emitting element LDr may be electrically connected in parallel together with the second light emitting elements LD2 constituting effective light sources between the 1bth and 2ath intermediate electrodes CE1b and CE2a, and may be electrically connected in a direction opposite to that of the second light emitting elements LD2 between the 1bth and 2ath intermediate electrodes CE1b and CE2a.

In an embodiment, the 1ath intermediate electrode CE1a of the first serial stage SET1 and the 1bth intermediate electrode CE1b of the second serial stage SET2 may be integrally provided or disposed to be electrically connected to each other. For example, the 1ath intermediate electrode CE1a of the first serial stage SET1 and the 1bth intermediate electrode CE1b of the second serial stage SET2 may constitute a first intermediate electrode CE1 which may electrically connect the first serial stage SET1 and the second serial stage SET2. As described above, when the 1ath intermediate electrode CE1a of the first serial stage SET1 and the 1bth intermediate electrode CE1b of the second serial stage SET2 may be integrally provided, the 1ath intermediate electrode CE1a and the 1bth intermediate electrode CE1b may be different areas of the first intermediate electrode CE1.

The third serial stage SET3 may include a 2bth intermediate electrode CE2b and a second electrode EL2 among the electrodes EL1 and CE1a, CE1b and CE2a, and CE2b and EL2 constituting the electrode pairs that may be included in the light emitting unit EMU, and may include at least one third light emitting element LD3 electrically connected between the 2bth intermediate electrode CE2b and the second electrode EL2. In an example, the third serial stage SET3 may include a 2bth intermediate electrode CE2b electrically connected to the first driving power source VDD via the pixel circuit 144 and previous serial stages, for example, first and second serial stages SET1 and SET2, a second electrode EL2 electrically connected to the second driving power source VSS, and third light emitting elements LD3 electrically connected between the 2bth intermediate electrode CE2b and the second electrode EL2. One end portion (for example, a second semiconductor layer) of each third light emitting element LD3 may be electrically connected to 2bth intermediate electrode CE2b of the third serial stage SET3, and the other end portion (for example, a first semiconductor layer) of the third light emitting element LD3 may be electrically connected to the second electrode EL2 of the third serial stage SET3. The third light emitting elements LD3 may be electrically connected in parallel between the 2bth intermediate electrode CE2b and the second electrode EL2 of the third serial stage SET3, and be electrically connected in the same direction (for example, the forward direction) between the first and second driving power sources VDD and VSS through the 2bth intermediate electrode CE2b and the second electrode EL2. In an embodiment, at least one reverse light emitting element (see LDr shown in FIG. 6) may be electrically connected between the 2bth intermediate electrode CE2b and the second electrode EL2. The reverse light emitting element LDr may be electrically connected in parallel together with the third light emitting elements LD3 constituting effective light sources between the 2bth intermediate electrode CE2b and the second electrode EL2, and may be electrically connected in a direction opposite to that of the third light emitting elements LD3 between the 2bth intermediate electrode CE2b and the second electrode EL2.

In an embodiment, the 2ath intermediate electrode CE2a of the second serial stage SET2 and the 2bth intermediate electrode CE2b of the third serial stage SET3 may be integrally provided or disposed to be electrically connected to each other. For example, the 2ath intermediate electrode CE2a of the second serial stage SET2 and the 2bth intermediate electrode CE2b of the third serial stage SET3 may constitute a second intermediate electrode CE2 which may electrically connect the second serial stage SET2 and the third serial stage SET3. As described above, when the 2ath intermediate electrode CE2a of the second serial stage SET2 and the 2bth intermediate electrode CE2b of the third serial stage SET3 may be integrally provided, the 2ath intermediate electrode CE2a and the 2bth intermediate electrode CE2b may be different areas of the second intermediate electrode CE2.

In the above-described embodiment, the first electrode EL1 of the first serial stage SET1 may be an anode electrode of a light emitting unit EMU of each pixel PXL, and the second electrode EL2 of the third serial stage SET3 may be a cathode electrode of the light emitting unit EMU.

As described above, the light emitting unit EMU of the pixel PXL, which may include the light emitting elements LD electrically connected in a serial/parallel mixed structure, may easily control driving current/voltage conditions to be suitable for specifications of a product to which the light emitting unit EMU may be applied.

As an example, the light emitting unit EMU of the pixel PXL, which may include the light emitting elements LD electrically connected in the serial/parallel mixed structure, may decrease a driving current, as compared with the light emitting unit EMU including the light emitting elements LD electrically connected in parallel. The light emitting unit EMU of the pixel PXL, which may include the light emitting elements LD electrically connected in the serial/parallel mixed structure, may decrease a driving voltage applied to both ends of the light emitting unit EMU, as compared with the light emitting unit EMU including the light emitting elements LD all electrically connected in series. When all the light emitting elements LD may be electrically connected in series, a path through the driving current flows may be blocked in the pixel PXL, when at least one of the light emitting elements LD electrically connected in series may not be completely electrically connected in the forward direction (or when the reverse light emitting element LDr may be included). Therefore, a dark spot defect may be caused. On the other hand, when the light emitting elements LD may be electrically connected in the serial/parallel mixed structure, a driving current may flow through another light emitting element LD of each serial stage, even when some light emitting elements LD are not electrically connected in the forward direction in the corresponding serial stage (or when the reverse light emitting element LDr may be included) or when a defect occurs in some light emitting elements LD. Accordingly, a defect of the pixels PXL may be prevented or minimized.

Figure 8:
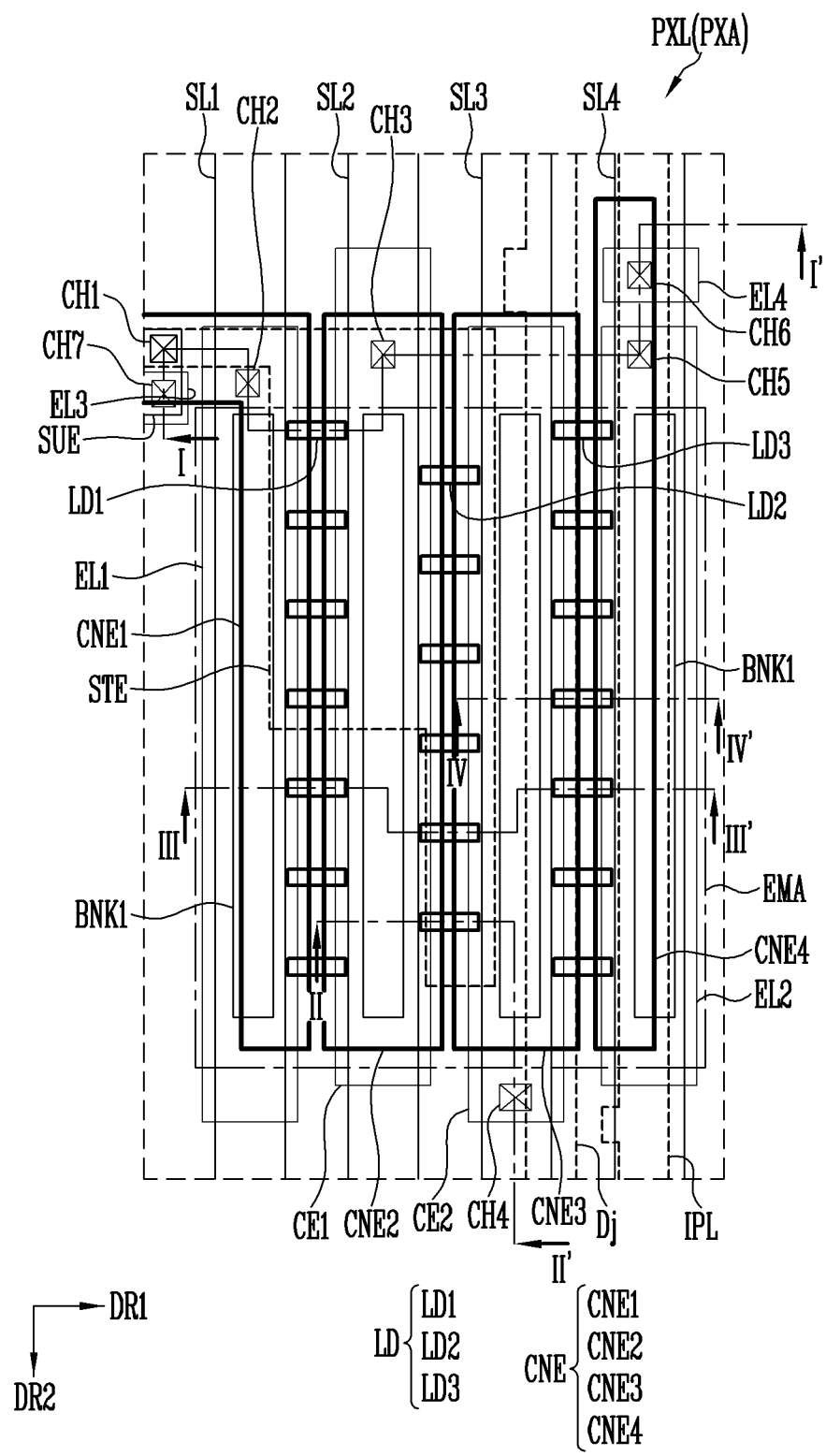
FIG. 8 is a plan view schematically illustrating one pixel among the pixels shown in FIG. 5.
Figure 9A:
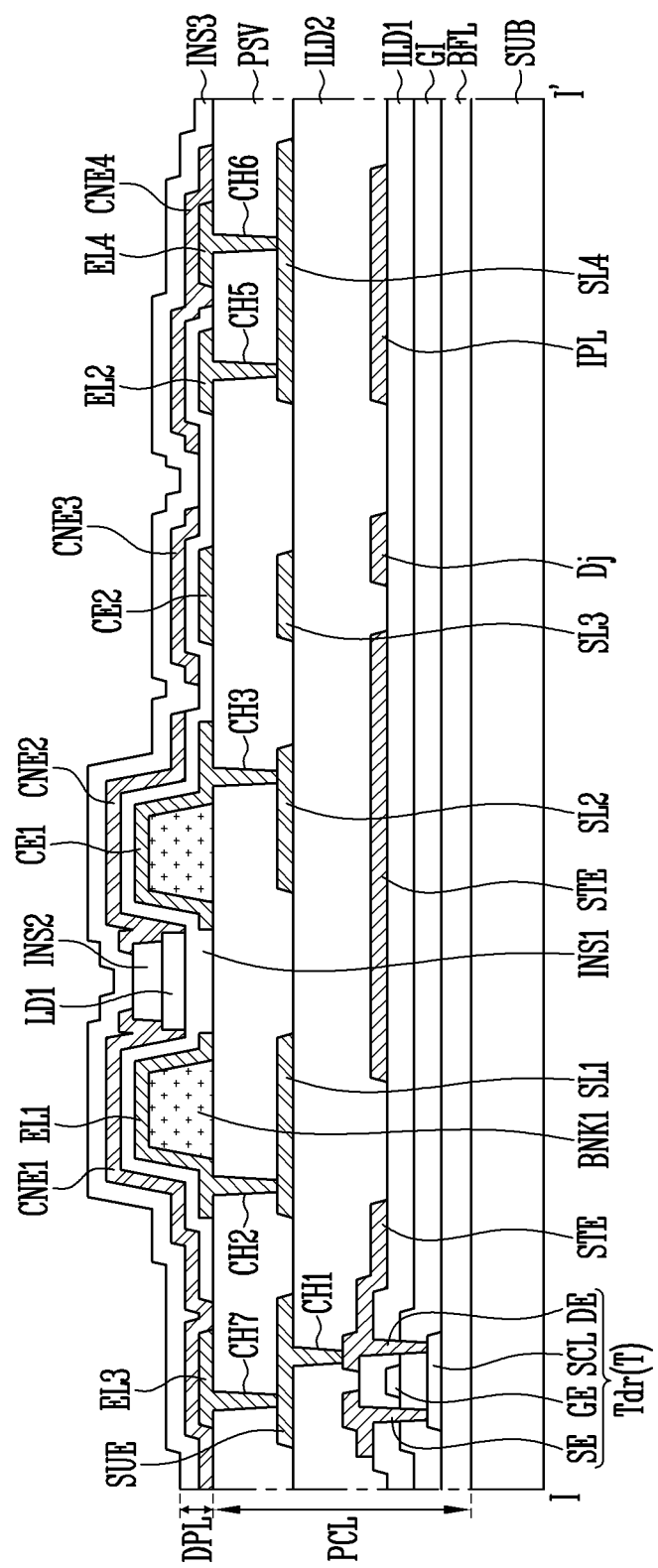
FIG. 9A is a schematic cross-sectional view taken along line I-I' shown in FIG. 8.
Figure 9B:
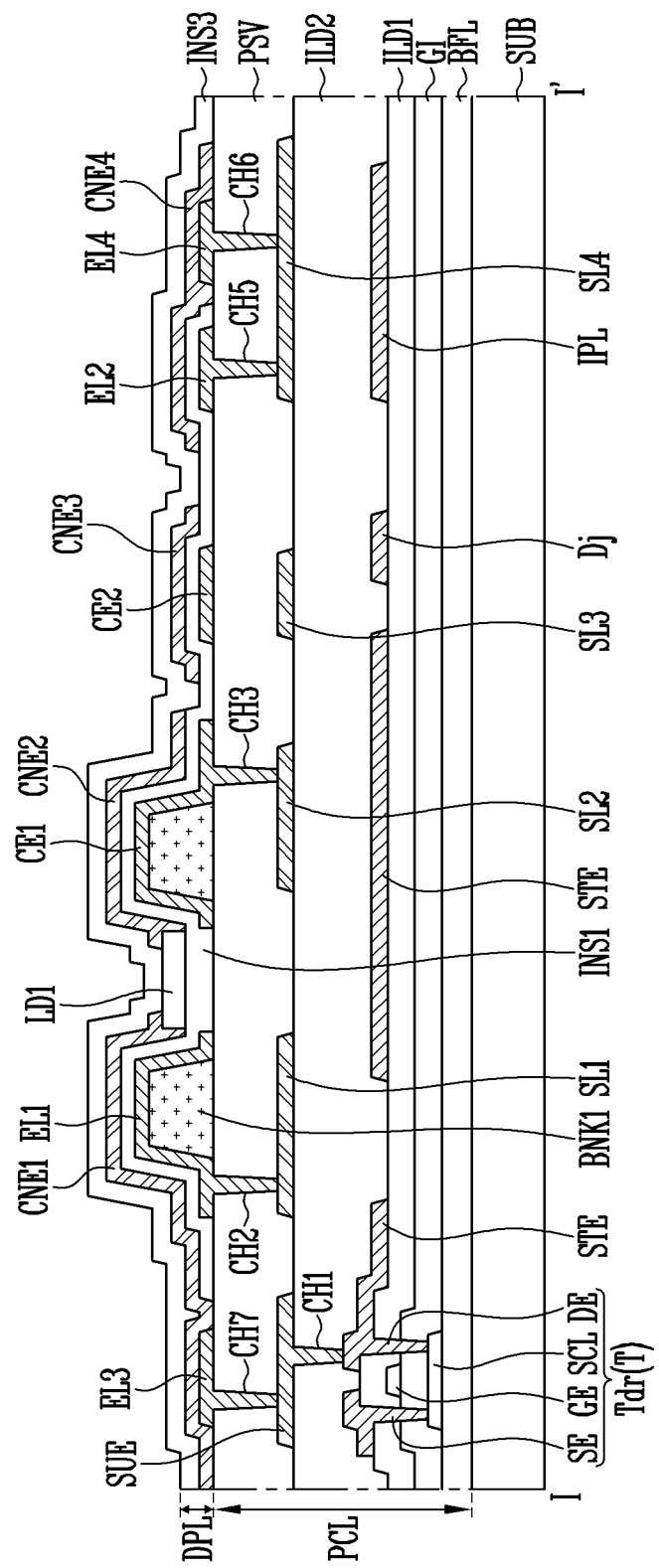
FIG. 9B illustrates an embodiment of first and second contact electrodes shown in FIG. 9A, and is a schematic cross-sectional view corresponding to the line I-I' shown in FIG. 8.
Figure 10:
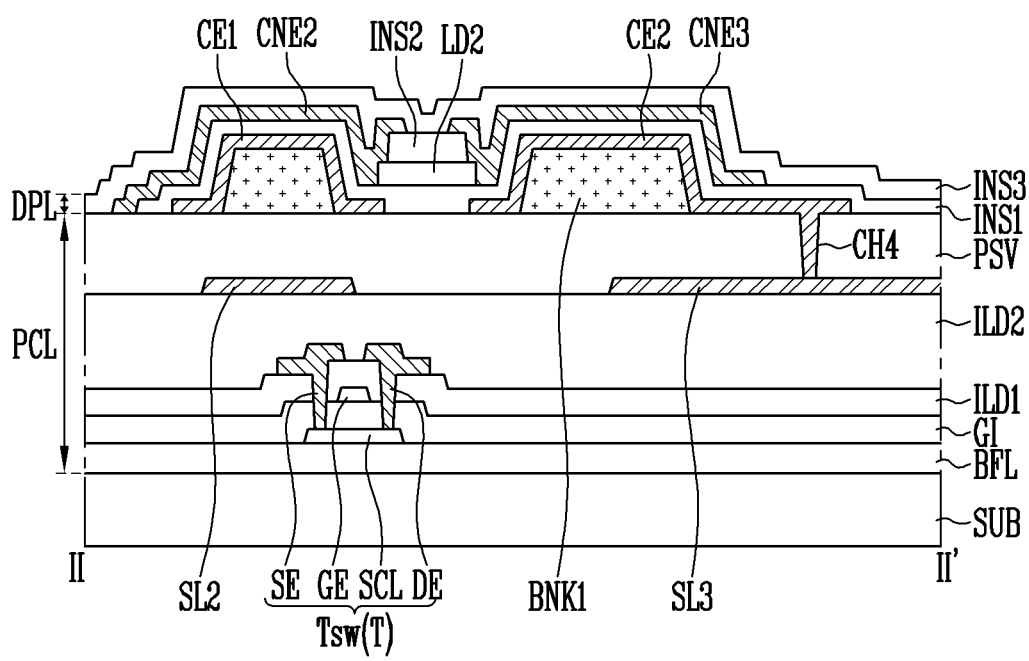
FIG. 10 is a schematic cross-sectional view taken along line II-IF shown in FIG. 8.
Figure 11:
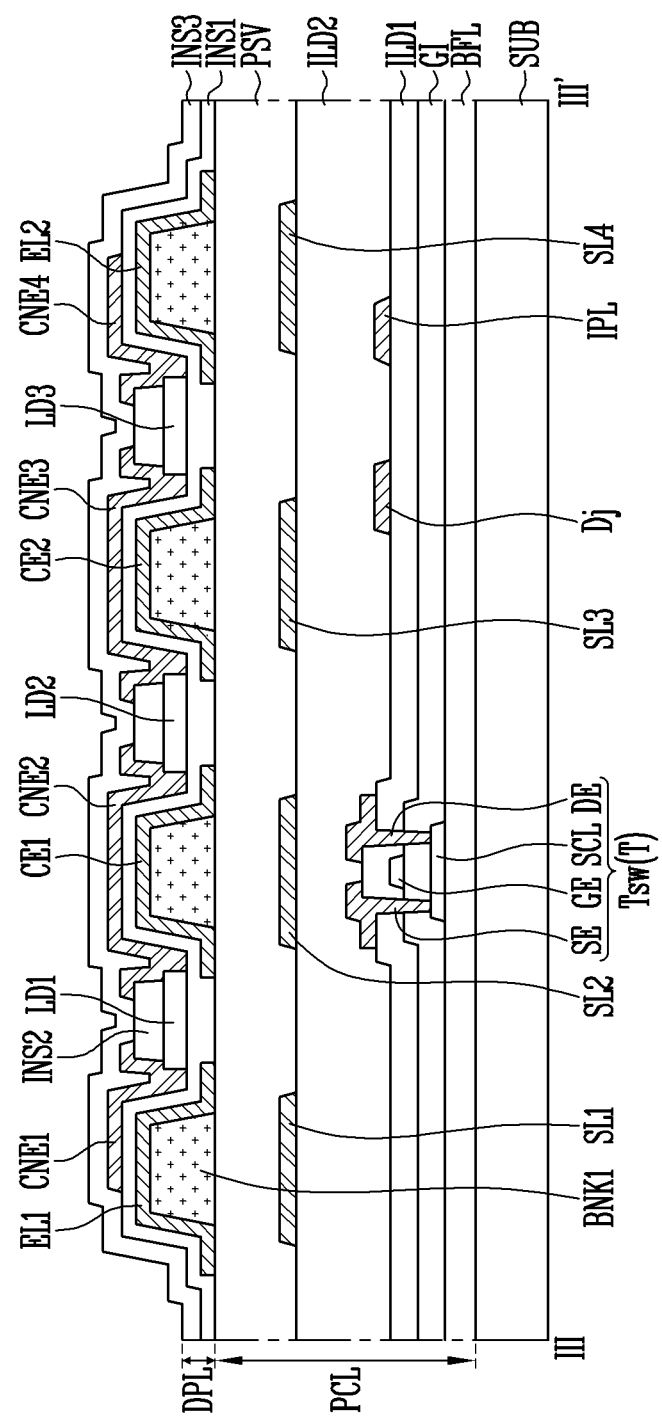
FIG. 11 is a schematic cross-sectional view taken along line shown in FIG. 8.
Figure 12:
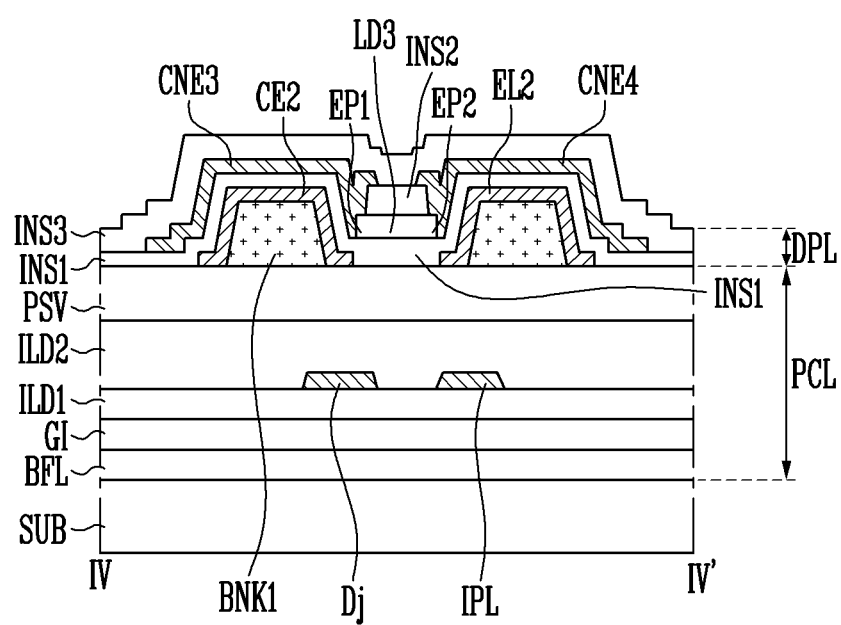
FIG. 12 is a schematic cross-sectional view taken along line IV-IV' shown in FIG. 8.
Figure 13:
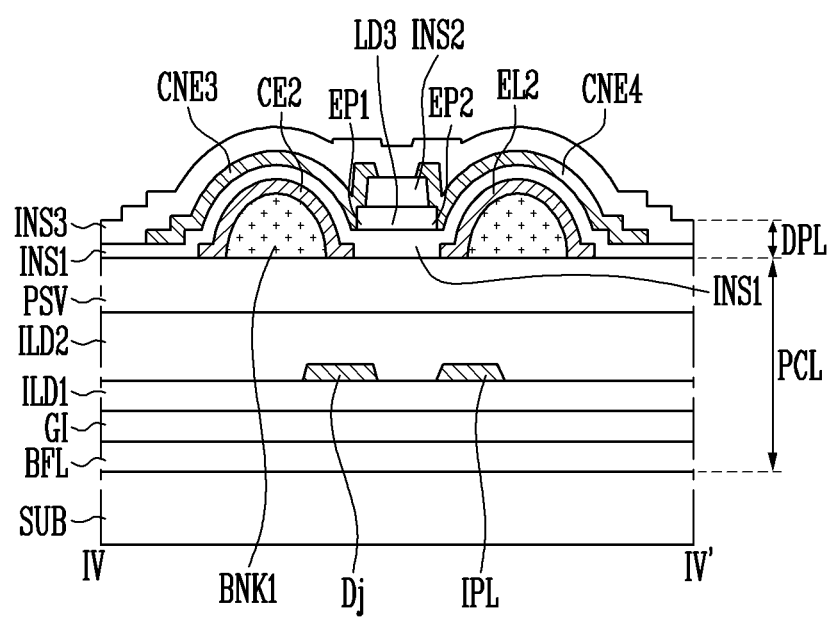
FIG. 13 illustrates an embodiment of a first bank pattern shown in FIG. 12, and is a schematic cross-sectional view corresponding to the line IV-IV' shown in FIG. 8.
Figure 14:
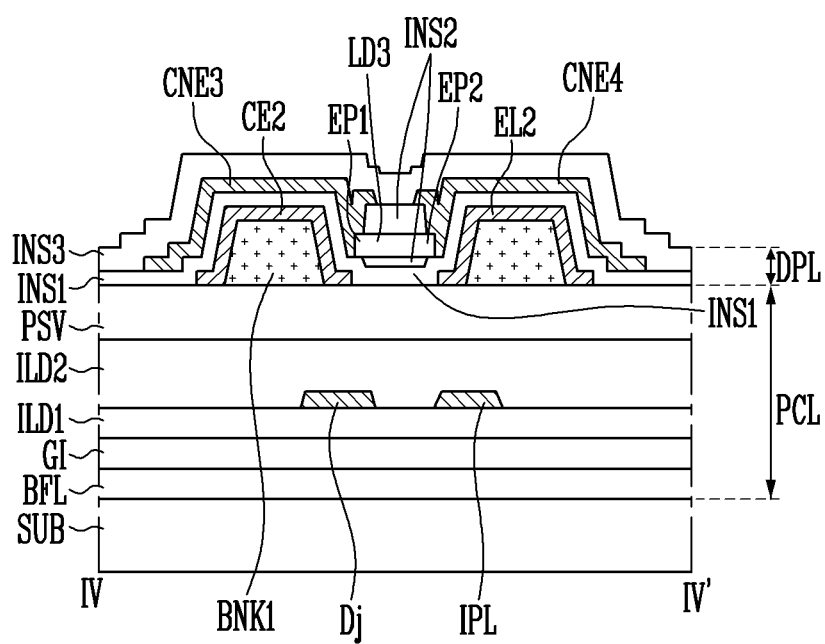
FIG. 14 illustrates an embodiment of a display element part shown in FIG. 12, and is a schematic cross-sectional view corresponding to the line IV-IV' shown in FIG. 8.
Figure 15:
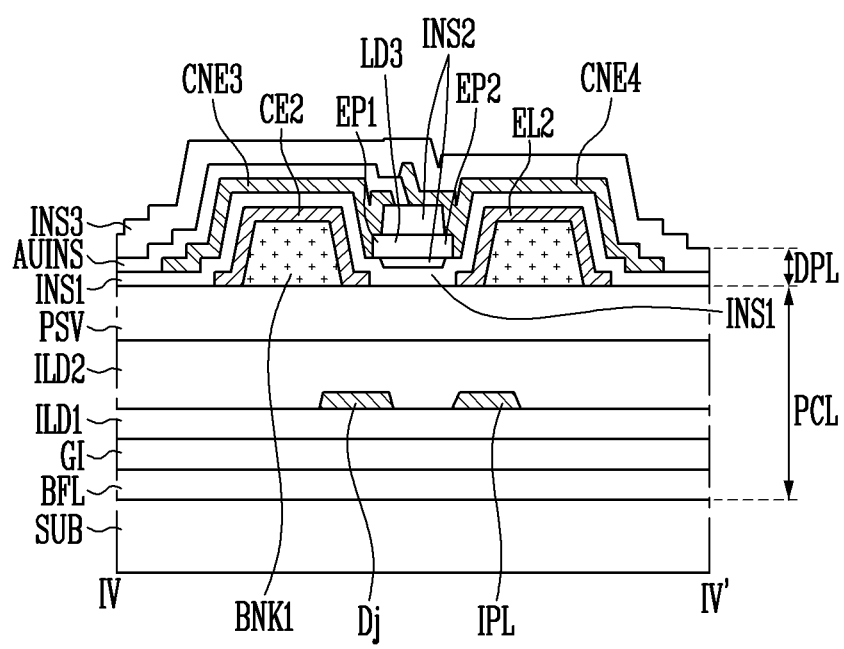
FIG. 15 illustrates an embodiment of the display element part shown in FIG. 12, and is a schematic cross-sectional view corresponding to the line IV-IV' shown in FIG. 8.
Figure 16A:
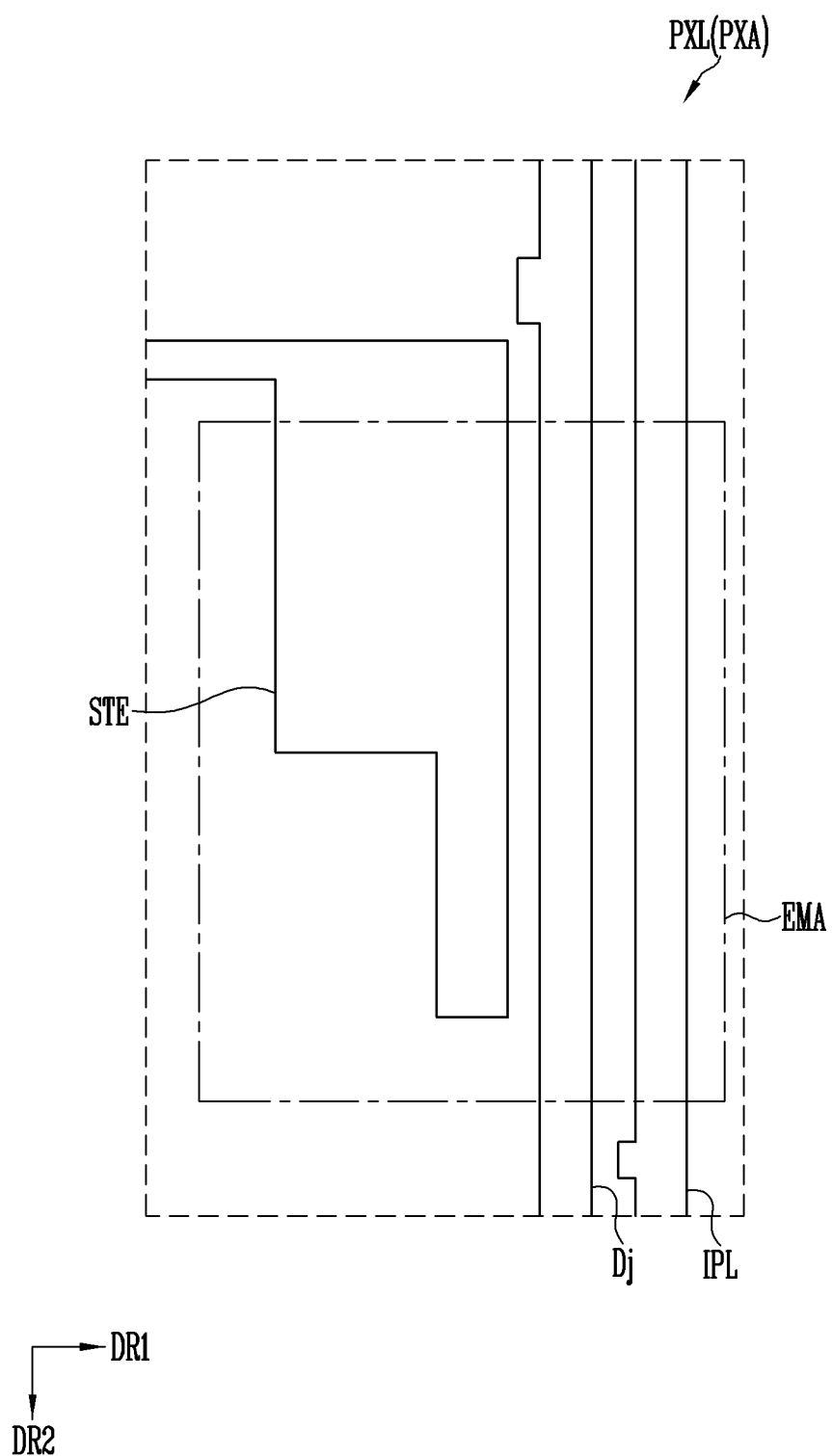
FIGS. 16A to 16F are schematic plan views sequentially illustrating a method of fabricating the one pixel shown in FIG. 8.
Figure 16B:
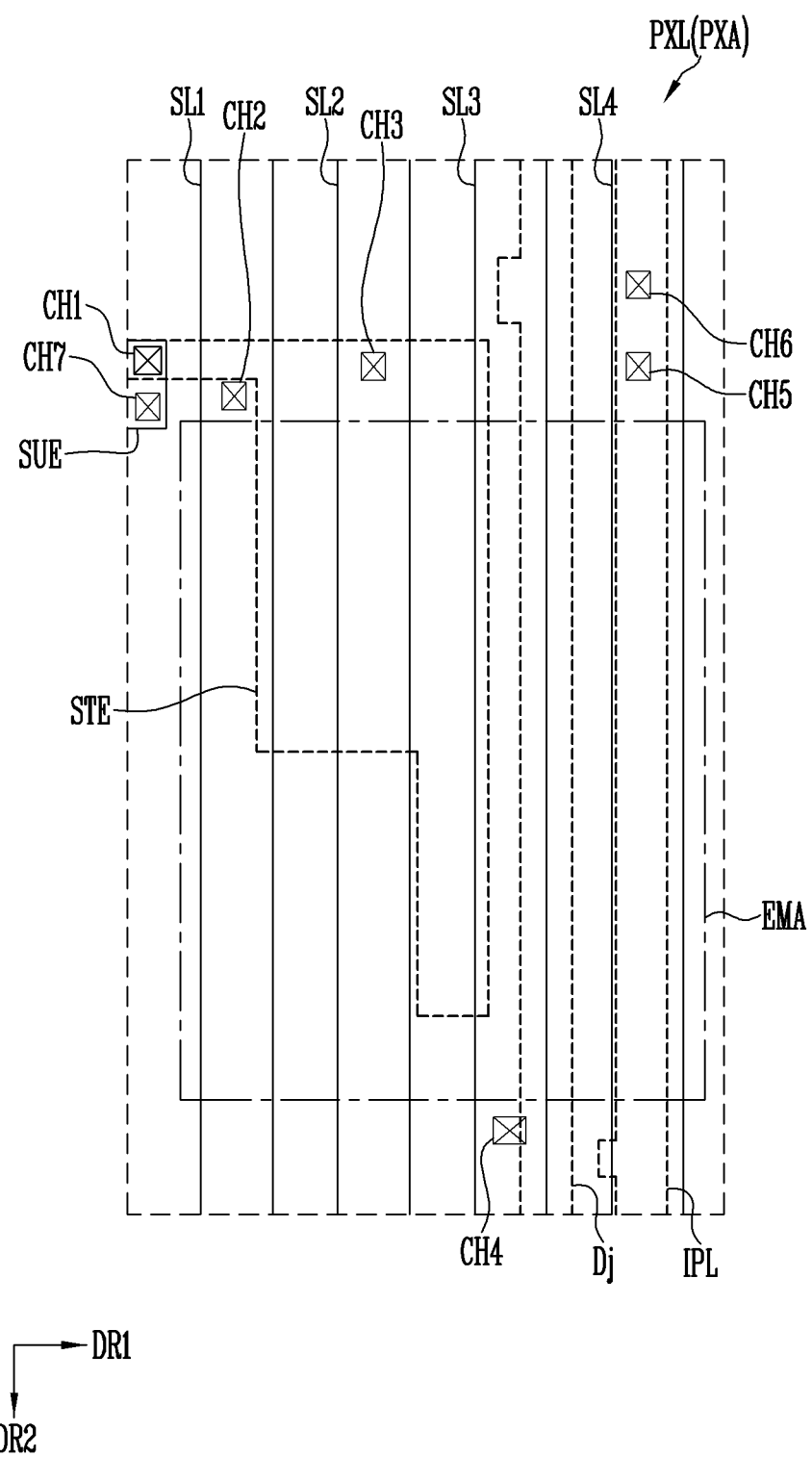
Figure 16C:
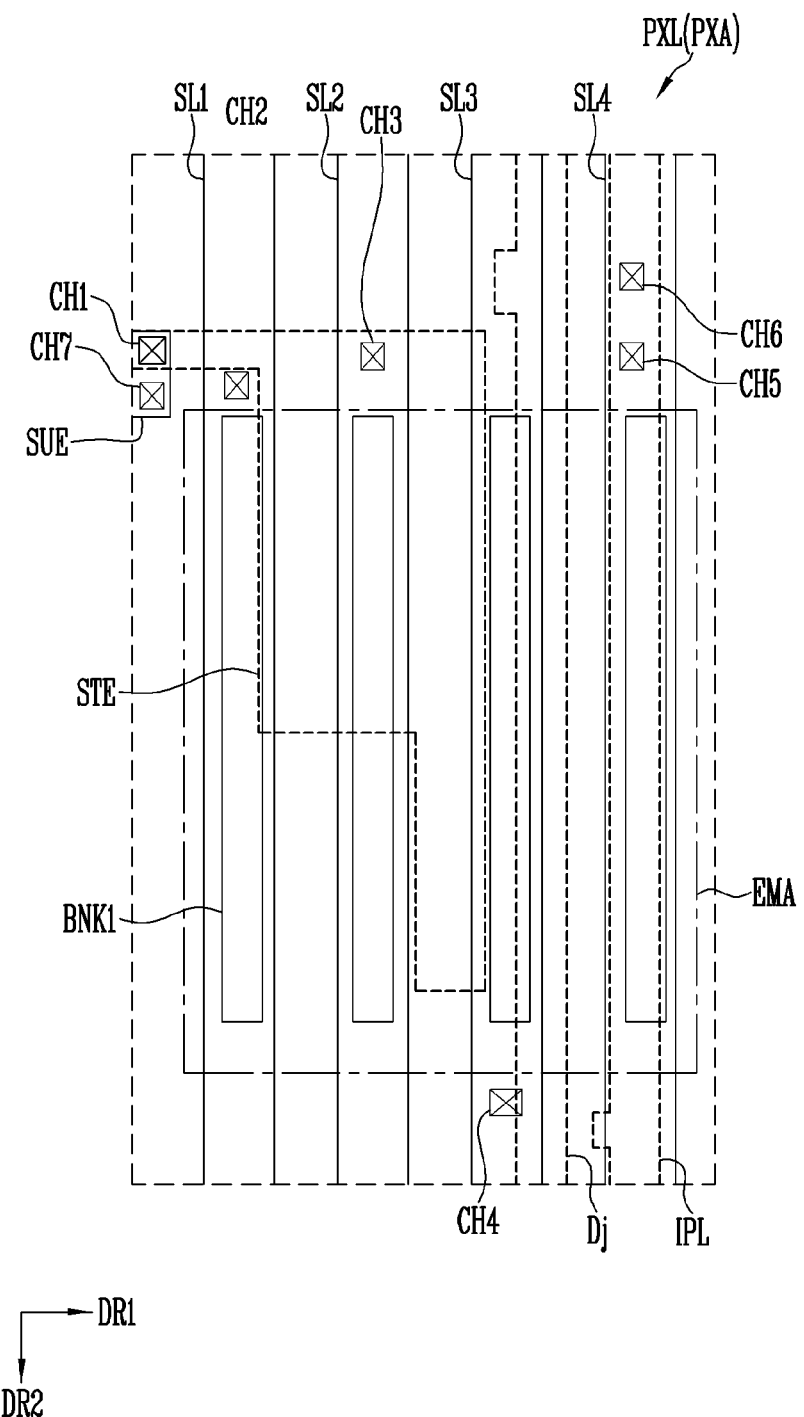
Figure 16D:
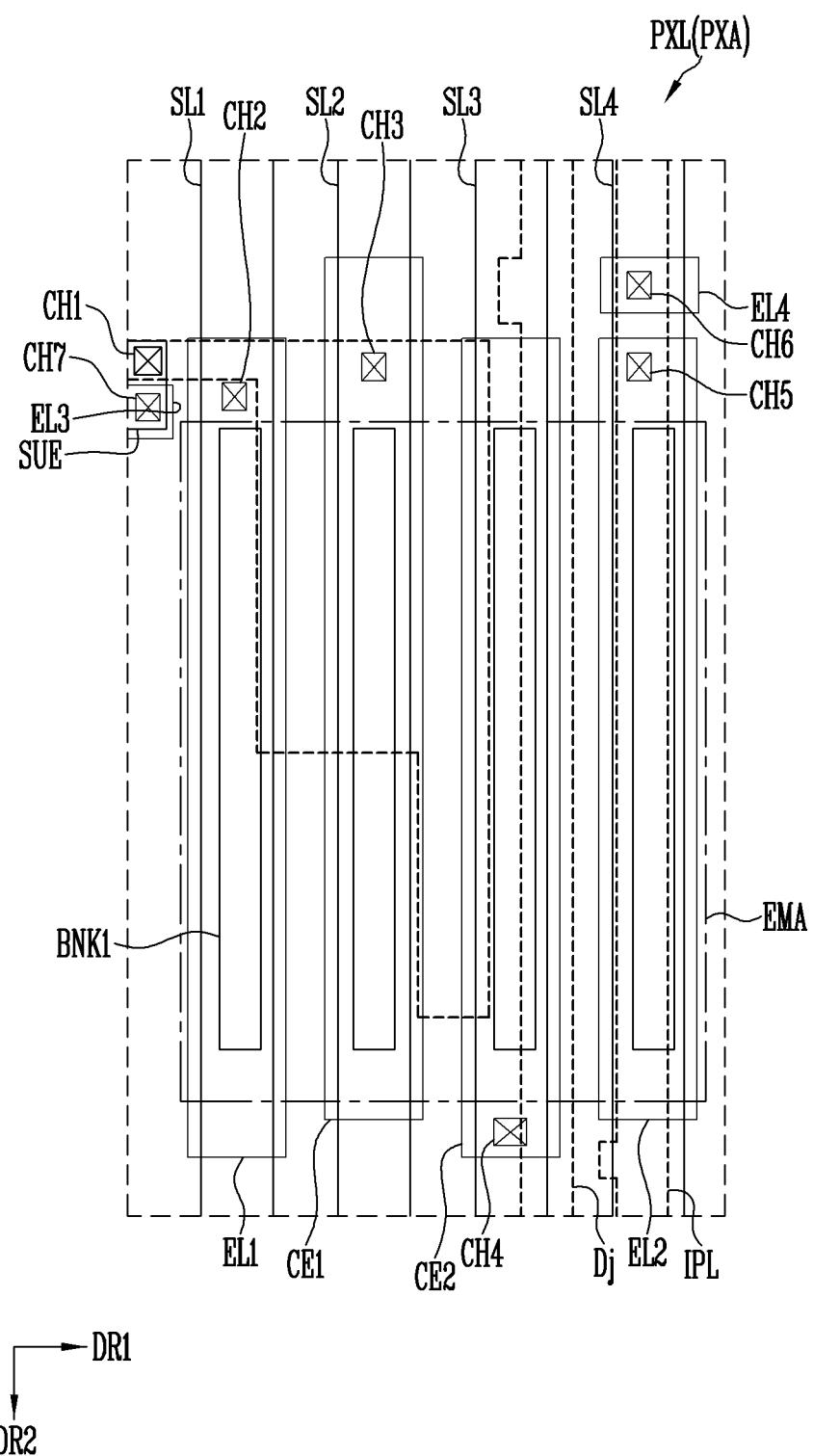
Figure 16E:
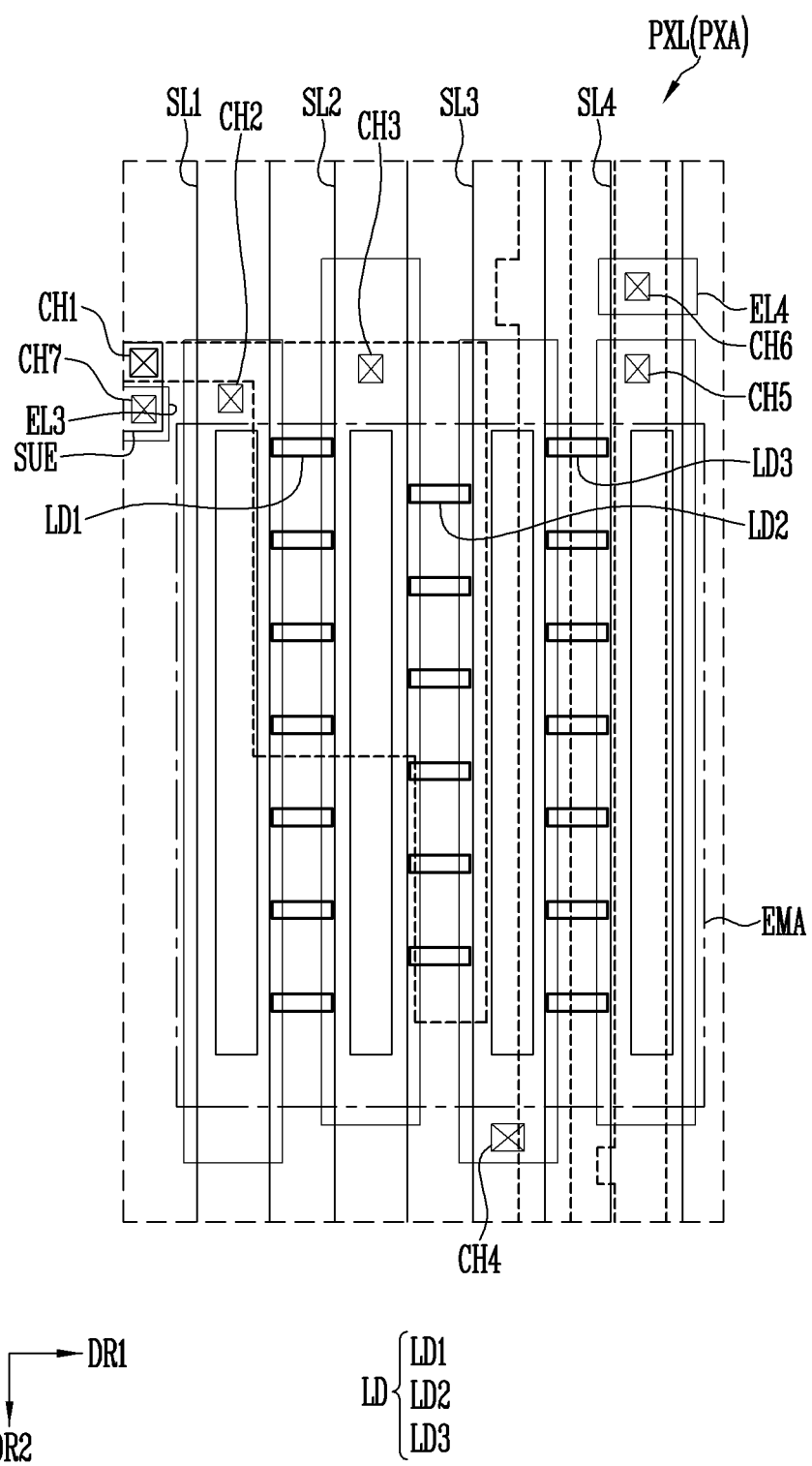
Figure 16F:
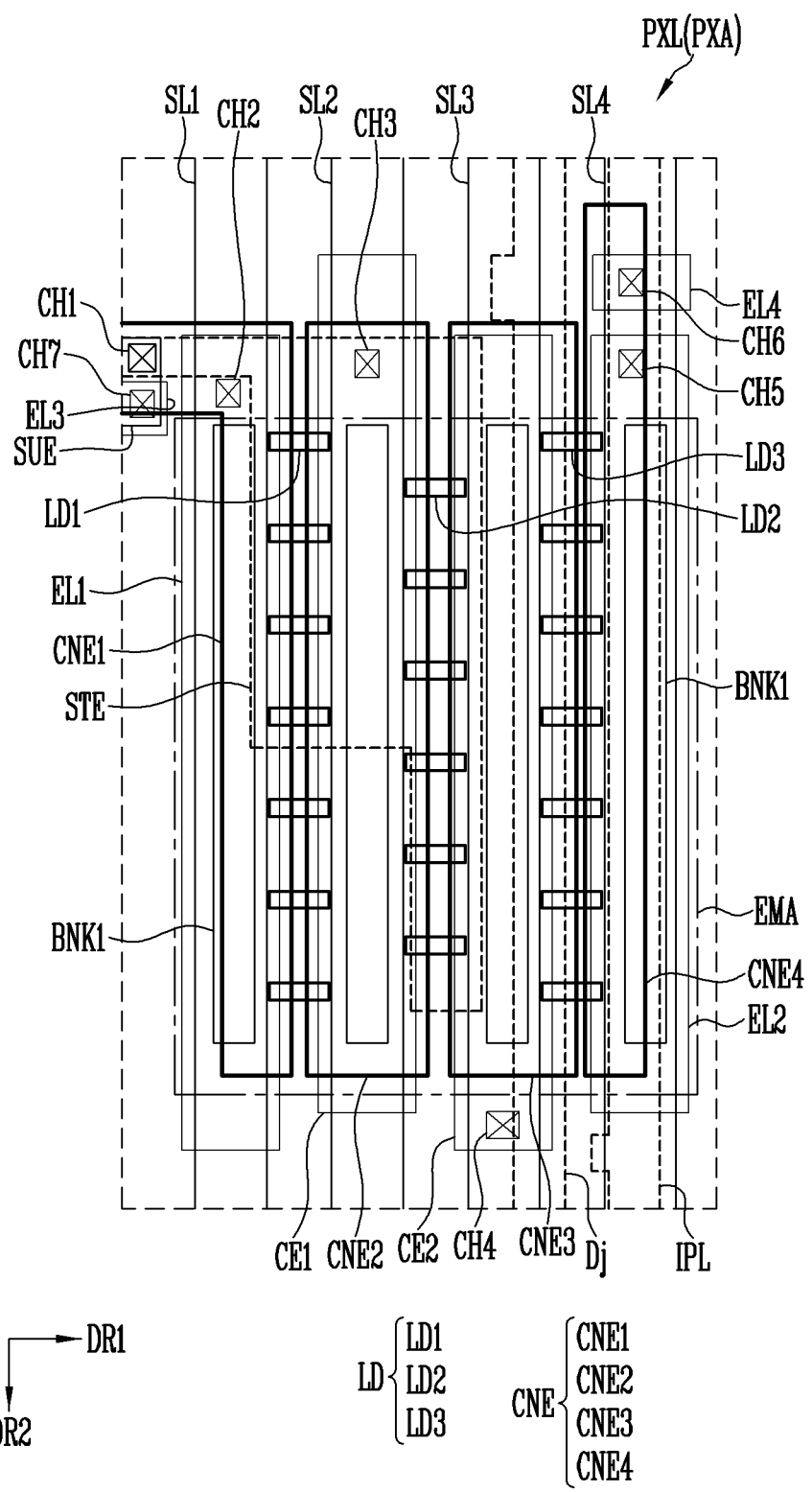
Figure 17A:
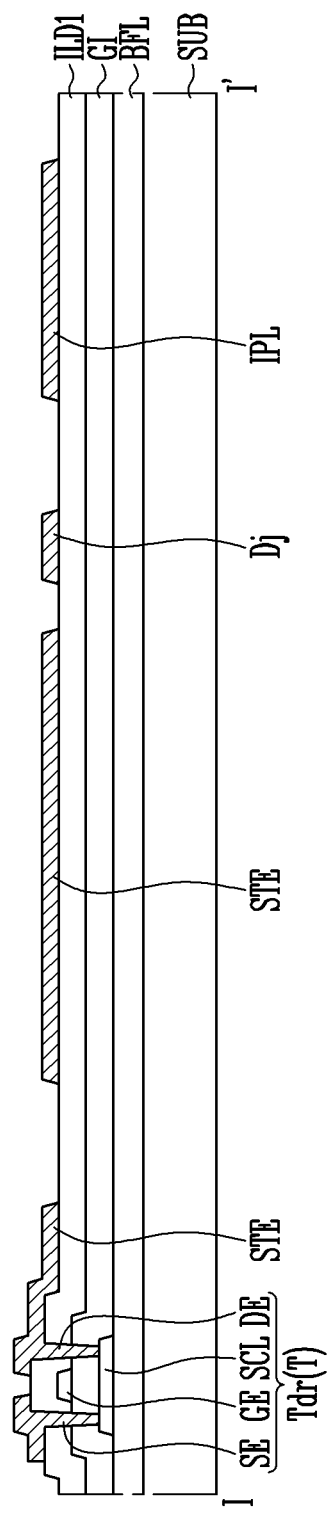
Figure 17B:
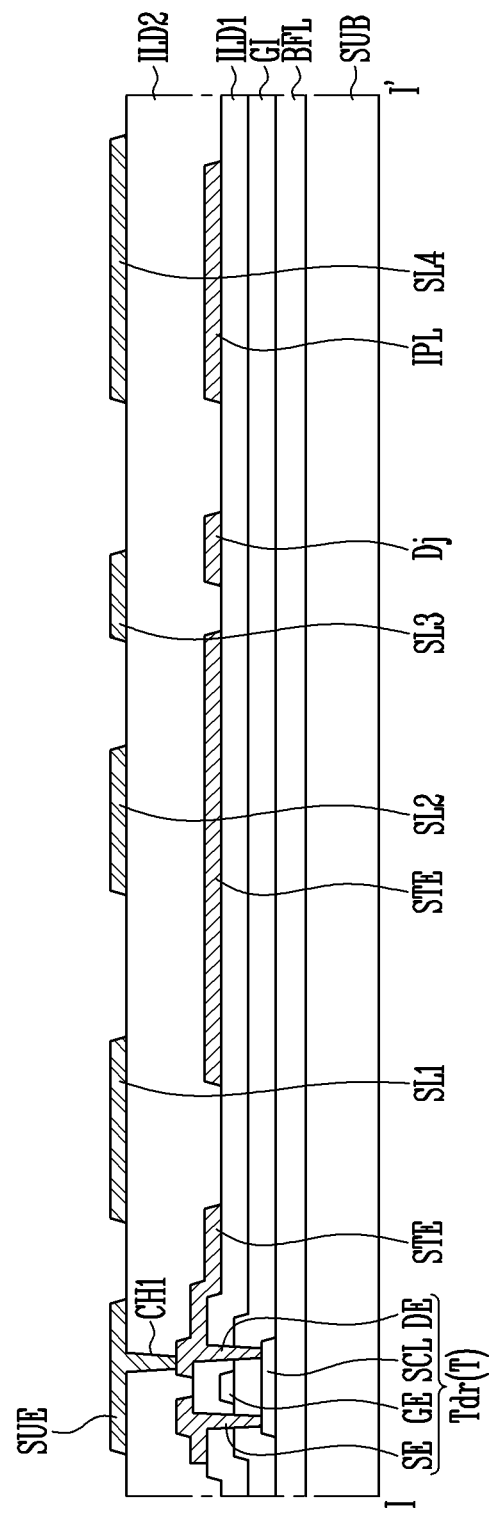
Figure 17D:
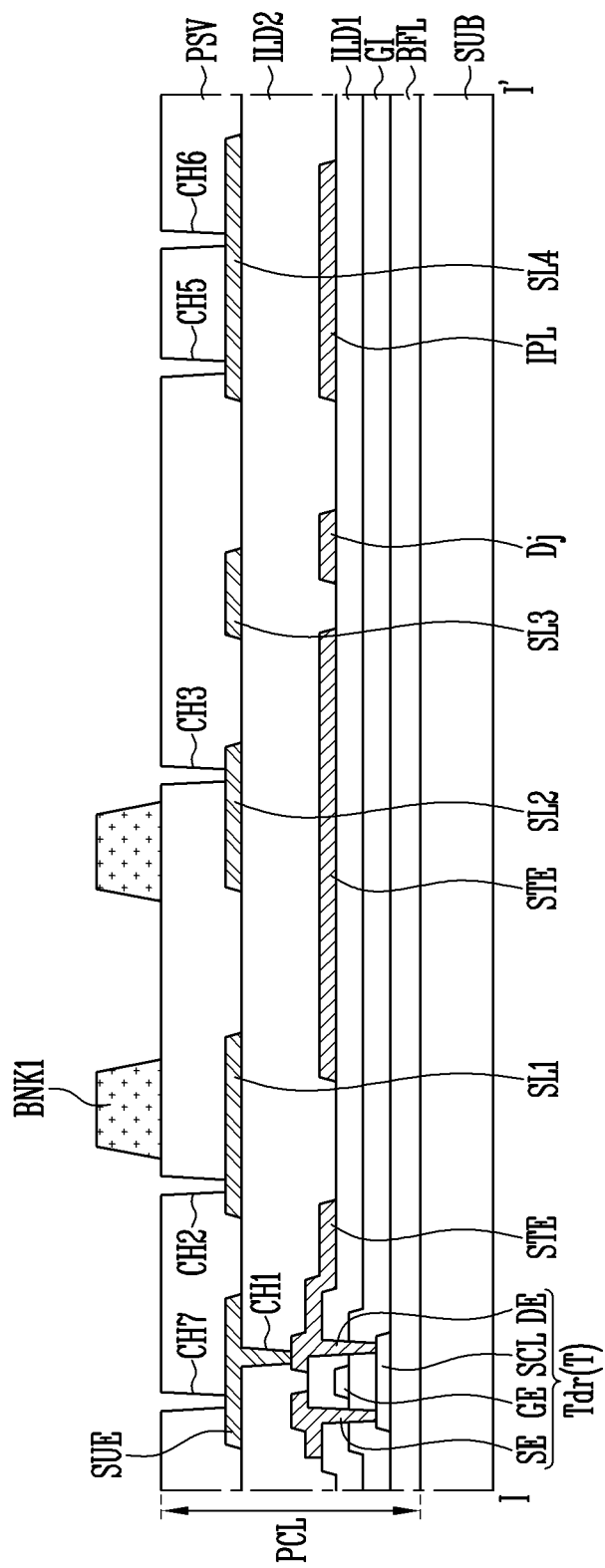
Figure 17F:
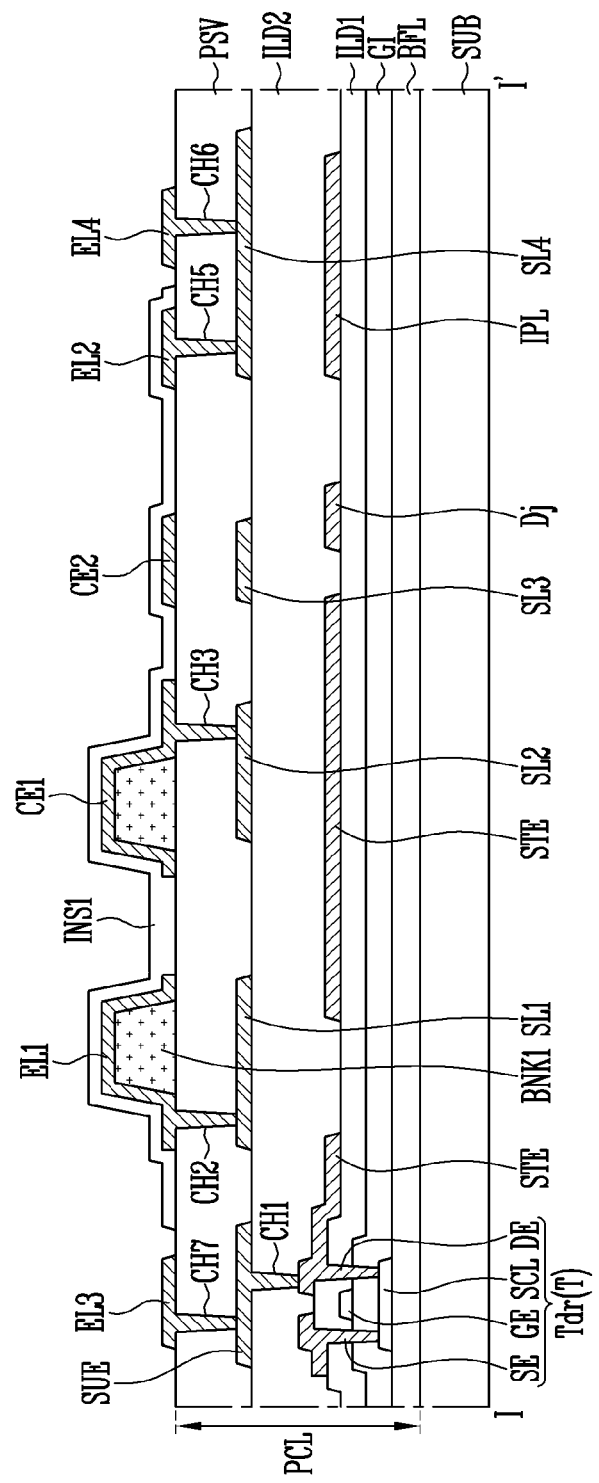
Figure 17G:
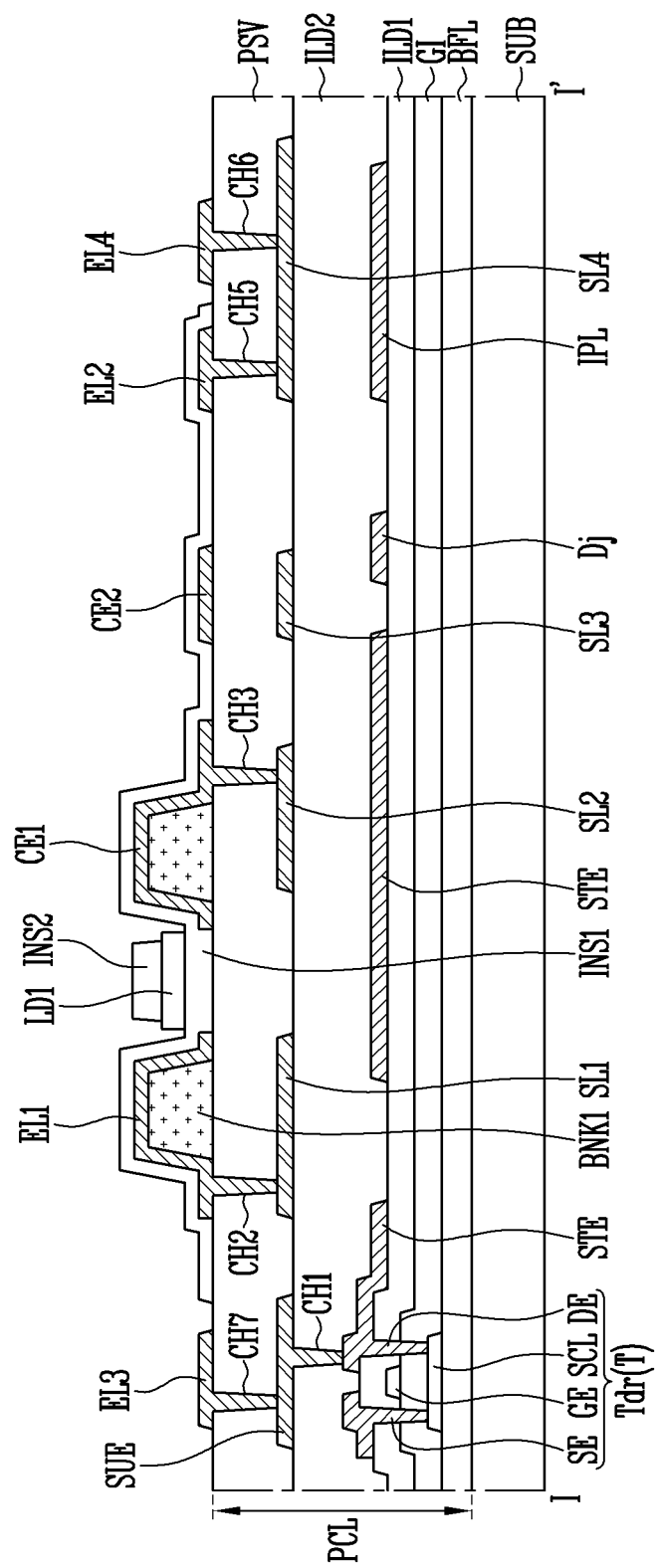
Figure 17H:
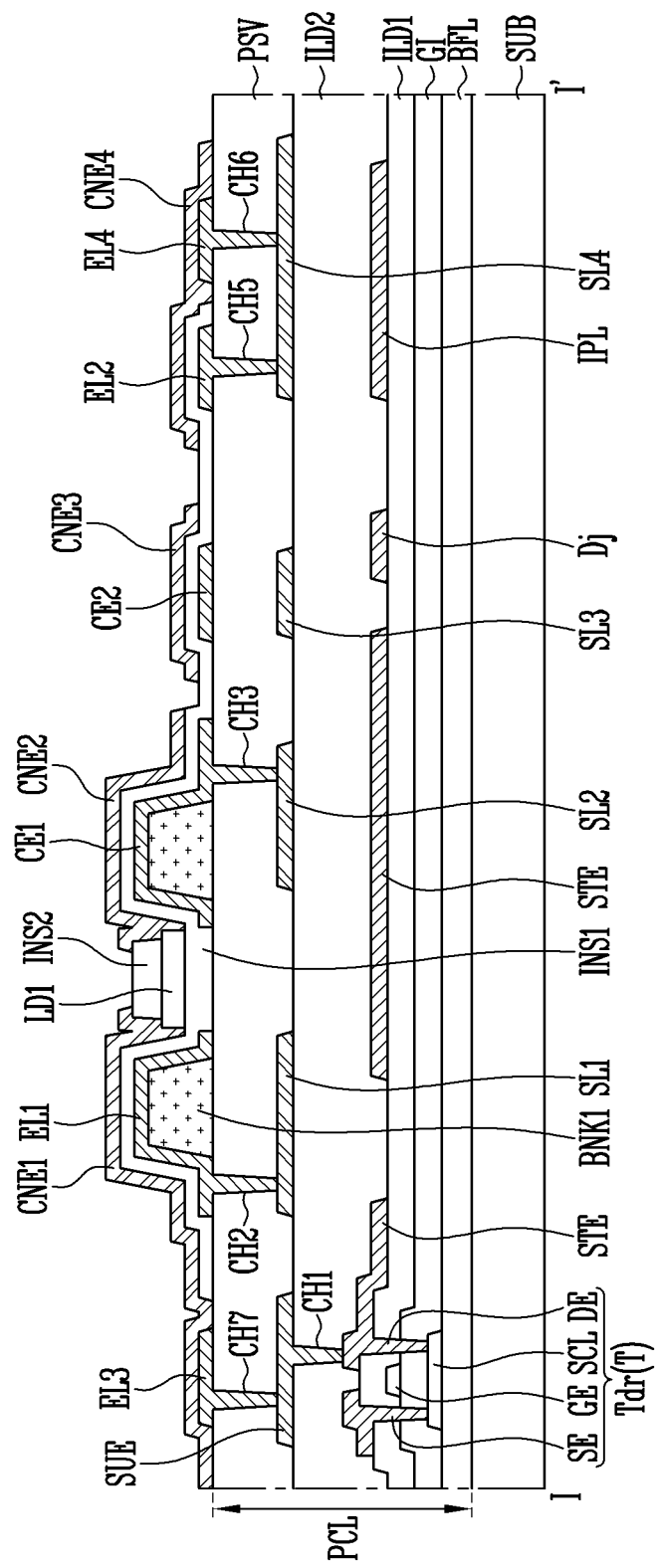
Figure 17I:
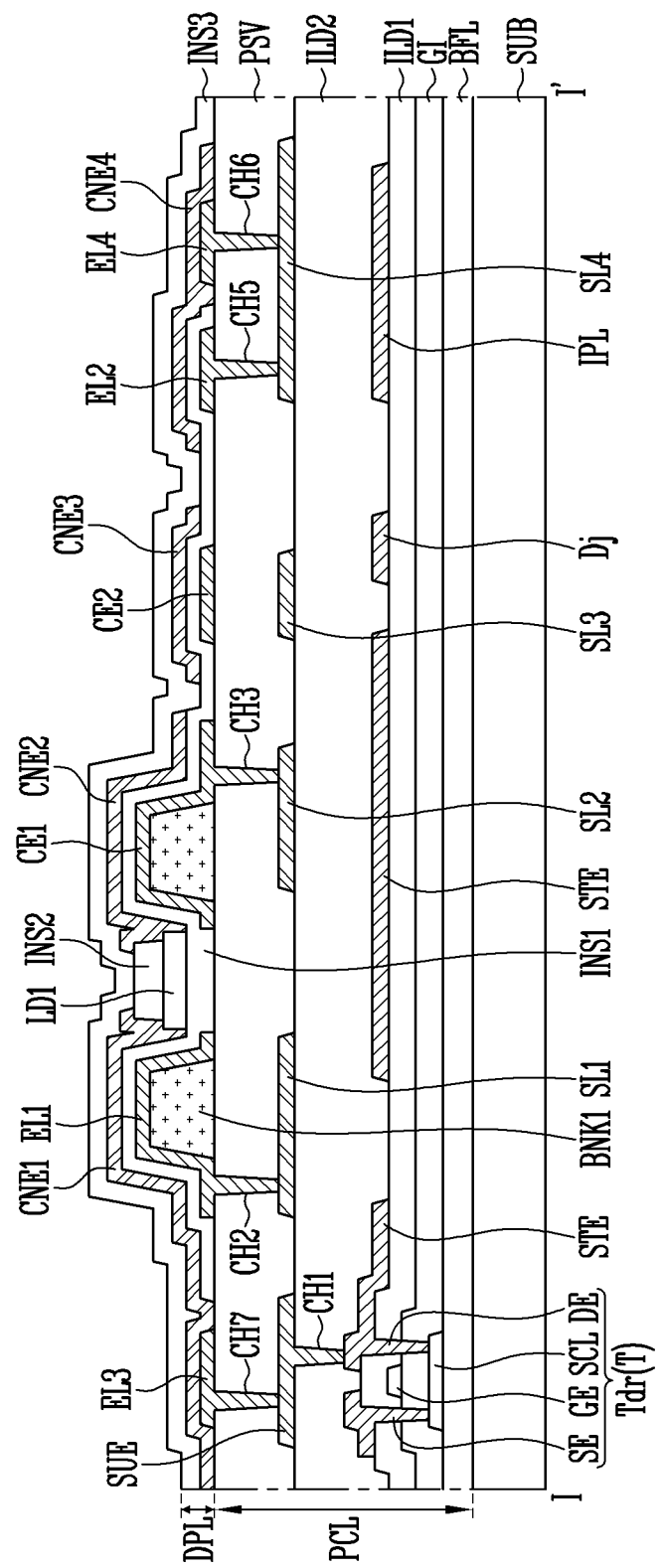

FIG. 8 is a plan view schematically illustrating one pixel among the pixels shown in FIG. 5. FIG. 9A is a schematic cross-sectional view taken along line I-I' shown in FIG. 8. FIG. 9B illustrates an embodiment of first and second contact electrodes shown in FIG. 9A, and is a schematic cross-sectional view corresponding to the line I-I' shown in FIG. 8. FIG. 10 is a schematic cross-sectional view taken along line II-IF shown in FIG. 8. FIG. 11 is a schematic cross-sectional view taken along line shown in FIG. 8. FIG. 12 is a schematic cross-sectional view taken along line IV-IV' shown in FIG. 8. FIG. 13 illustrates an embodiment of a first bank pattern shown in FIG. 12, and is a schematic cross-sectional view corresponding to the line IV-IV' shown in FIG. 8. FIG. 14 illustrates an embodiment of a display element part shown in FIG. 12, and is a schematic cross-sectional view corresponding to the line IV-IV' shown in FIG. 8. FIG. 15 illustrates an embodiment of the display element part shown in FIG. 12, and is a schematic cross-sectional view corresponding to the line IV-IV' shown in FIG. 8.

The pixel shown in FIG. 8 may be any one of the pixels respectively shown in FIGS. 6A to 6E, 7A, and 7C.

In FIG. 8, illustration of a transistor electrically connected to light emitting elements may be omitted for convenience. In FIG. 8, only some signal lines, for example, a data line Dj and an initialization power line IPL among signal lines provided or disposed in a pixel area PXA of each pixel PXL may be illustrated for convenience.

In FIGS. 8 to 15, the structure of the one pixel PXL may be simplified and illustrated, such as a case where each electrode may be illustrated as a single electrode layer and a case where each insulating layer may be illustrated as a single insulating layer. However, the disclosure is not limited thereto.

In an embodiment, the term "being formed and/or provided in the same layer" may mean being formed in the same process, and the term "being formed and/or provided in different layers" may mean being formed in different processes.

In an embodiment, the term "connection" between two components may include electrical connection, physical connection, or a combination thereof.

Referring to FIGS. 1A to 5 and 8 to 15, the display device in accordance with an embodiment may include a substrate SUB, a line unit, and pixels PXL.

The substrate SUB may include a transparent insulating material to enable light to be transmitted therethrough. The substrate SUB may be a rigid substrate or a flexible substrate.

The rigid substrate may include, for example, one of a glass substrate, a quartz substrate, a glass ceramic substrate, and a crystalline glass substrate. The flexible substrate may be one of a film substrate and a plastic substrate, which may include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material applied to the substrate SUB may have resistance (or heat resistance) against high processing temperature in a manufacturing process of the display device.

The substrate SUB may include a display area DA including at least one pixel area PXA in which a pixel may be disposed and a non-display area NDA disposed at the periphery of or adjacent to the display area DA.

The pixel area PXA in which each pixel PXL may be disposed (or provided) may include an emission area EMA in which light may be emitted and a peripheral area surrounding the periphery of the emission area EMA. In an embodiment, the peripheral area may include a non-emission area in which no light may be emitted.

The line unit may include signal lines that may transfer signals (or voltages) to each pixel PXL. The signal lines may include a scan line (for example, see 'Si' shown in FIG. 6A) that may transfer a scan signal to each pixel PXL, a data line Dj that may transfer a data signal to each pixel PXL, an initialization power line IPL that may transfer an initialization power source to each pixel PXL, an emission control line (for example, see 'Ei' shown in FIG. 6C) that may transfer to an emission control signal to each pixel PXL, and the like within the spirit and the scope of the disclosure. However, the disclosure is not limited thereto. In an embodiment, the line unit may include signal lines that may transfer other signals, in addition to the above-described signal lines.

The data line Dj may extend in one direction, for example, a second direction DR2. A data signal may be applied to the data line Dj. In an embodiment, the data line Dj may be provided and/or formed and/or disposed on a first interlayer insulating layer ILD1.

The first interlayer insulating layer ILD1 may be an inorganic insulating layer including an inorganic material. In an example, the first interlayer insulating layer ILD1 may include at least one of silicon nitride (SiNx), silicon oxide (SiOx), silicon oxynitride (SiON), and metal oxide such as AlOx. The first interlayer insulating layer ILD1 may be provided in a single layer, but may also be provided in a multi-layer including at least two layers.

The initialization power line IPL may extend in the same direction as the extending direction of the data line Dj, and be disposed to be spaced apart from the data line Dj. The extending direction of the initialization power line IPL is not limited to the above-described embodiment. In an embodiment, the initialization power line IPL may extend in a first direction DR1 intersecting the second direction DR2. An initialization power source may be applied to the initialization power line IPL. In an embodiment, the initialization power line IPL may be provided and/or formed and/or disposed on the first interlayer insulating layer ILD1.

Each pixel PXL may include a pixel circuit layer PCL which may be provided or disposed on the substrate SUB and may include a pixel circuit 144, and a display element layer DPL including light emitting elements LD. The light emitting elements LD may be located or disposed in the emission area EMA of the pixel area PXA of each pixel PXL.

For convenience, the pixel circuit layer PCL will be first described, and the display element layer DPL will then be described.

The pixel circuit layer PCL may include a buffer layer BFL, the pixel circuit 144, and a passivation layer PSV.

The buffer layer BFL may be disposed on the substrate SUB and prevent an impurity from being diffused into a transistor included in the pixel circuit (see '144' shown in FIG. 6A to 7B). The buffer layer BFL may be an inorganic insulating layer including an inorganic material. In an example, the buffer layer BFL may include at least one of silicon nitride (SiNx), silicon oxide (SiOx), silicon oxynitride (SiON), and metal oxide such as AlOx. The buffer layer BFL may be provided in a single layer, but may also be provided in a multi-layer including at least two layers. When the buffer layer BFL is provided in the multi-layer, the layers may be formed of the same or similar material or be formed of different materials. The buffer layer BFL may be omitted according to the material and process conditions of the substrate SUB.

The pixel circuit 144 may include at least one transistor and a storage capacitor Cst. The transistor may include a driving transistor Tdr that may control a driving current of the light emitting elements LD and a switching transistor Tsw electrically connected to the driving transistor Tdr. However, the disclosure is not limited thereto, and the pixel circuit 144 may include circuit elements that may perform another function, in addition to the driving transistor Tdr and the switching transistor Tsw. In the following embodiment, when one of the driving transistor Tdr and the switching transistor Tsw is arbitrarily designated or when the driving transistor Tdr and the switching transistor Tsw are inclusively designated, the transistor or the transistors may be referred to as a transistor T or transistors T.

Each of the driving transistor Tdr and the switching transistor Tsw may include a transistor semiconductor pattern SCL, a gate electrode GE, a first terminal SE, and a second terminal DE. The first terminal SE may be any one of a source electrode and a drain electrode, and the second terminal DE may be the other of the source electrode and the drain electrode. In an example, when the first terminal SE is the source electrode, the second terminal DE may be the drain electrode.

The transistor semiconductor pattern SCL may be provided and/or formed and/or disposed on the buffer layer BFL. The transistor semiconductor pattern SCL may include a first contact region in contact with the first terminal SE and a second contact region in contact with the second terminal DE. A region between the first contact region and the second contact region may be a channel region. The transistor semiconductor pattern SCL may be made of poly-silicon, amorphous silicon, oxide semiconductor, or other material within the spirit and the scope of the disclosure. The channel region may be a semiconductor pattern undoped with an impurity, and may be an intrinsic semiconductor. Each of the first contact region and the second contact region may be a semiconductor pattern doped with the impurity.

The gate electrode GE may be provided and/or formed and/or disposed on the transistor semiconductor pattern SCL with a gate insulating layer GI interposed or disposed therebetween.

The gate insulating layer GI may be an inorganic insulating layer including an inorganic material. In an example, the gate insulating layer GI may include at least one of silicon nitride (SiNx), silicon oxide (SiOx), silicon oxynitride (SiON), and metal oxide such as AlOx. However, the material of the gate insulating layer GI is not limited to the above-described embodiments. In an embodiment, the gate insulating layer GI may be an organic insulating layer including an organic material. The gate insulating layer GI may be provided in a single layer, but may also be provided in a multi-layer including at least two layers.

The first terminal SE and the second terminal DE may be in contact with the first contact region and the second contact region of the transistor semiconductor pattern SCL through contact holes penetrating the first interlayer insulating layer ILD1 and the gate insulating layer GI, respectively.

In the above-described embodiment, a case where the first and second terminals SE and DE of each of the driving transistor Tdr and the switching transistor Tsw may be separate electrodes electrically connected to the transistor semiconductor pattern SCL has been described, but the disclosure is not limited thereto. In an embodiment, the first terminal SE of each of the driving transistor Tdr and the switching transistor Tsw may be one of the first and second contact regions adjacent to the channel region of a corresponding transistor semiconductor pattern SCL, and the second terminal DE of each of the driving transistor Tdr and the switching transistor Tsw may be the other of the first and second contact regions adjacent to the channel region of the corresponding transistor semiconductor pattern SCL. Therefore, the second terminal DE of each of the driving transistor Tdr and the switching transistor Tsw may be electrically connected to the light emitting elements LD of a corresponding pixel PXL through a bridge electrode, a contact electrode, or the like within the spirit and the scope of the disclosure.

In an embodiment, the transistors T included in the pixel circuit 144 may be a low-temperature polycrystalline silicon (LTPS) thin film transistor, but the disclosure is not limited thereto. In an embodiment, the transistors T may be an oxide semiconductor thin film transistor. A case where the transistors T is a thin film transistor having a top gate structure is described as an example, but the disclosure is not limited thereto. In an embodiment, the transistors T may be a thin film transistor having a bottom gate structure.

In an embodiment, the pixel circuit layer PCL may include a connection electrode STE disposed on the first interlayer insulating layer ILD1. The connection electrode STE may be electrically connected to a partial component of the driving transistor Tdr. In an example, the connection electrode STE may be electrically connected to the second contact region of the driving transistor Tdr. The connection electrode STE may serve as a bridge for electrically connecting between components included in the pixel circuit 144 or may be used as one electrode of the storage capacitor Cst. The connection electrode STE may be provided and/or formed and/or disposed on the first interlayer insulating layer ILD1, and be disposed to be spaced apart from the data line Dj and the initialization power line IPL.

A second interlayer insulating layer ILD2 may be provided or disposed over the driving transistor Tdr, the switching transistor Tsw, the data line Dj, the initialization power line IPL, and the connection electrode STE, which are described above. The second interlayer insulating layer ILD2 may be an inorganic insulating layer including an inorganic material or an organic insulating layer including an organic material. In an embodiment, the second interlayer insulating layer ILD2 may include the same or similar material as the first interlayer insulating layer ILD1, but the disclosure is not limited thereto. The second interlayer insulating layer ILD2 may be provided in a single layer, but may also be provided in a multi-layer including at least two layers. The second interlayer insulating layer ILD2 may include a first contact hole CH1 exposing a portion of the driving transistor Tdr.

A sub-electrode SUE and first to fourth conductive lines SL1 to SL4 may be disposed on the second interlayer insulating layer ILD2. The sub-electrode SUE and the first to fourth conductive lines SL1 to SL4 may be spaced apart from each other on the second interlayer insulating layer ILD2.

Each of the first to fourth conductive lines SL1 to SL4 may extend along the second direction DR2, and may be commonly provided to each pixel PXL and adjacent pixels PXL located or disposed on the same pixel column as the pixel PXL. The first conductive line SL1 and the second conductive lines SL2 may be spaced apart from each other at a certain or predetermined distance, the second conductive line SL2 and the third conductive line SL3 may be spaced apart from each other at a certain or predetermined distance, and the third conductive line SL3 and the fourth conductive line SL4 may be spaced apart from each other at a certain or predetermined distance. In the pixel area PXA of each pixel PXL, the first and second conductive lines SL1 and SL2, the second and third conductive lines SL2 and SL3, and the third and fourth conductive lines SL3 and SL4 may be spaced apart from each other at the same distance. However, the disclosure is not limited thereto. In an embodiment, the first and second conductive lines SL1 and SL2, the second and third conductive lines SL2 and SL3, and the third and fourth conductive lines SL3 and SL4 may be spaced apart from each other at different distances.

The first conductive line SL1 may be electrically connected to a partial component, for example, a first electrode EL1 of the display element layer DPL, through a second contact hole CH2 penetrating the passivation layer PSV. The first conductive layer SL1 may allow the first electrode EL1 to serve as a first alignment electrode (or first alignment line) by transferring a predetermined alignment signal (or alignment voltage) to the first electrode EL1 when the light emitting elements LD in the emission area EMA of each pixel PXL may be aligned. In an embodiment, the first conductive line SL1 along with the first electrode EL1 may serve as an alignment electrode (or alignment line) that may align the light emitting elements LD in the emission area EMA of each pixel PXL.

The second conductive line SL2 may be electrically connected to a partial component, for example, a first intermediate electrode CE1 of the display element layer DPL through a third contact hole CH3 penetrating the passivation layer PSV. The second conductive line SL2 may allow the first intermediate electrode CE1 to serve as a second alignment electrode (or second alignment line) by transferring a predetermined alignment signal (or alignment voltage) to the first intermediate electrode CE1 when the light emitting elements LD in the emission area EMA of each pixel PXL may be aligned. In an embodiment, the second conductive line SL2 along with the first intermediate electrode CE1 may serve as an alignment electrode (or alignment line) that may align the light emitting elements LD in the emission area EMA of each pixel PXL.

The third conductive line SL3 may be electrically connected to a partial component, for example, a second intermediate electrode CE2 of the display element layer DPL through a fourth contact hole CH4 penetrating the passivation layer PSV. The third conductive line SL3 may allow the second intermediate electrode CE2 to serve as a third alignment electrode (or third alignment line) by transferring a predetermined alignment signal (or alignment voltage) to the second intermediate electrode CE2 when the light emitting elements LD in the emission area EMA of each pixel PXL may be aligned. In an embodiment, the third conductive line SL3 along with the second intermediate electrode CE2 may serve as an alignment electrode (or alignment line) that may align the light emitting elements LD in the emission area EMA of each pixel PXL.

The fourth conductive line SL4 may be electrically connected to a partial component, for example, a second electrode EL2 of the display element layer DPL through a fifth contact hole CH5 penetrating the passivation layer PSV. The fourth conductive line SL4 may allow the second electrode EL2 to serve as a fourth alignment electrode (or fourth alignment line) by transferring a predetermined alignment signal (or alignment voltage) to the second electrode EL2 when the light emitting elements LD in the emission area EMA of each pixel PXL may be aligned. In an embodiment, the fourth conductive line SL4 along with the second electrode EL2 may serve as an alignment electrode (or alignment line) that may align the light emitting elements LD in the emission area EMA of each pixel PXL.

A second driving power source VSS that may drive the light emitting elements LD may be applied to the fourth conductive line SL4 after the light emitting elements LD may be aligned in the emission area EMA of each pixel PXL. In an example, the fourth conductive line SL4 may have the same or similar configuration as the second power line PL2 described with reference to FIGS. 6A to 7B.

After the light emitting elements LD may be aligned in the emission area EMA of each pixel PXL, a predetermined signal (or voltage) may be applied to each of the first to fourth conductive lines SL1 to SL4 or may not be applied to each of the first to fourth conductive lines SL1 to SL4. When the predetermined signal (or voltage) is applied to each of the first to fourth conductive lines SL1 to SL4, the same signal (or voltage) may be applied to the first and third conductive lines SL1 and SL3, and the same signal (or voltage) may be applied to the second and fourth conductive lines SL2 and SL4. In an example, a first driving power source VDD may be applied to the first and third conductive lines SL1 and SL3, and the second driving power source VSS may be applied to the second and fourth conductive lines SL2 and SL4. The first and third conductive lines SL1 and SL3 may have the same configuration as the first power line PL1 described with reference to FIGS. 6A to 7A, and the second and fourth conductive lines SL2 and SL4 may have the same or similar configuration as the second power line PL2 described with reference to FIGS. 6A to 7B. When the predetermined signal (or voltage) is not applied to each of the first to fourth conductive lines SL1 to SL4, the first to fourth conductive lines SL1 to SL4 may be in a floating state.

In an embodiment, the first to fourth conductive lines SL1 to SL4 may be disposed on the second interlayer insulating layer ILD2, to block an electric field induced from the transistor T included in the pixel circuit layer PCL and signal lines electrically connected to the transistor T, thereby preventing the electric field from having influence on alignment and/or driving of the light emitting elements LD provided or disposed in the display element layer DPL. For example, the first to fourth conductive lines SL1 to SL4 may serve as electric field shielding lines.

The sub-electrode SUE may be spaced apart from the first conductive line SL1 to be electrically and/or physically separated from the first conductive line SL1. The sub-electrode SUE may be electrically connected to the driving transistor Tdr through the first contact hole CH1 penetrating the second interlayer insulating layer ILD2. Therefore, a predetermined signal applied to the driving transistor Tdr may be transferred to the sub-electrode SUE.

The sub-electrode SUE may be electrically connected to a partial component, for example, a third electrode EL3 of the display element layer DPL through a seventh contact hole CH7 penetrating the passivation layer PSV. The sub-electrode SUE may allow the third electrode EL3 to serve as a driving electrode of the light emitting elements LD by transferring the predetermined signal applied to the driving transistor Tdr to the third electrode EL3 after the light emitting elements LD may be aligned in the emission area EMA of each pixel PXL.

The sub-electrode SUE and the first to fourth conductive lines SL1 to SL4, which are described above, may be disposed on the second interlayer insulating layer ILD2, and may include the same or similar material. In an example, the sub-electrode SUE and the first to fourth conductive lines SL1 to SL4 may be formed in a single layer including one selected from the group consisting of molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), aluminum (Al) or silver (Ag), which is a low-resistance material so as to decrease wiring resistance. In an embodiment, the sub-electrode SUE and the first to fourth conductive lines SL1 to SL4 may be formed in a double layer in which a first layer and a second layer may be stacked. The first layer may be made of copper (Cu) and may have a thickness of about 6000 Å, and the second layer may be made of titanium (Ti) and may have a thickness of about 200 Å. However, the material of the sub-electrode SUE and the first to fourth conductive lines SL1 to SL4 is not limited to the above-described embodiment.

The passivation layer PSV may be disposed over the sub-electrode SUE and the first to fourth conductive lines SL1 to SL4.

The passivation layer PSV may include an organic insulating layer, an inorganic insulating layer, or the organic insulating layer disposed on the inorganic insulating layer. The inorganic insulating layer may include at least one of silicon oxide (SiOx), silicon nitride (SiNx), silicon oxynitride (SiON), and a metal oxide such as AlOx. The organic insulating layer may include an organic insulating material which may enable light to be transmitted therethrough. For example, the organic insulating layer may include at least one of a photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

In an embodiment, the passivation layer PSV may include the second contact hole CH2 exposing a portion of the first conductive line SL1, the third contact hole CH3 exposing a portion of the second conductive line SL2, the fourth contact hole CH4 exposing a portion of the third conductive line SL3, the fifth contact hole CH5 exposing a portion of the fourth conductive line SL4, a sixth contact hole CH6 exposing another portion of the fourth conductive line SL4, and the seventh contact hole CH7 exposing a portion of the sub-electrode SUE.

The display element layer DPL may be disposed on the passivation layer PSV.

The display element layer DPL may include a first bank pattern BNK1, first to fourth electrodes EL1 to EL4, the first and second intermediate electrodes CE1 and CE2, the light emitting elements LD, and a contact electrode CNE.

The first bank pattern BNK1 may be a supporting member which may support each of the first and second electrodes EL1 and EL2 to change a surface profile of each of the first and second electrodes EL1 and EL2 such that lights emitted from the light emitting elements LD may further advance in an image display direction of the display device.

The first bank pattern BNK1 may be disposed and/or formed between the passivation layer PSV in the emission area EMA of each pixel PXL and the first and second electrodes EL1 and EL2. In an example, the first bank pattern BNK1 may be disposed and/or formed between the passivation layer PSV and the first electrode EL1, and between the passivation layer PSV and the second electrode EL2. The first bank pattern BNK1 may include an inorganic insulating layer made of an inorganic material or an organic insulating layer made of an organic material. In an embodiment, the first bank pattern BNK1 may include an organic insulating layer provided in a single layer and/or an inorganic insulating layer provided in a single layer, but the disclosure is not limited thereto. In an embodiment, the first bank pattern BNK1 may be provided in the form of a multi-layer in which at least one organic insulating layer and at least one inorganic insulating layer may be stacked. However, the material of the first bank pattern BNK1 is not limited to the above-described embodiments. In an embodiment, the first bank pattern BNK1 may include a conductive material.

The first bank pattern BNK1 may have a section having a substantially trapezoidal shape which may be narrowed as approaching the top thereof from one surface of the passivation layer PSV, but the disclosure is not limited thereto. In an embodiment, as shown in FIG. 13, the first bank pattern BNK1 may include a curved surface having a section provided in a substantially semi-elliptical shape, a substantially semicircular shape (or substantially hemispherical shape) or the like, which may be narrowed as approaching the top thereof from the one surface of the passivation layer PSV. When viewed on a section, the shape of the first bank pattern BNK1 is not limited to the above-described embodiments, and may be variously changed in a range or accordingly, such that the efficiency of light emitted from each of the light emitting elements LD may be improved. Adjacent first bank patterns BNK1 may be disposed on the same plane of the passivation layer PSV, and have the same height (or thickness).

The first bank pattern BNK1 may have a substantially bar shape extending along one direction, for example, the second direction DR2 (vertical direction) in a plan view. However, the disclosure is not limited thereto, and the first bank pattern BNK1 may be provided in various shapes.

Although not directly shown in the drawings, a second bank pattern may be provided or disposed in a peripheral area of the pixel area PXA of each pixel PXL.

The second bank pattern may surround at least one side of the peripheral area included in the pixel area PXA of each pixel PXL. The second bank pattern may be a structure which may define (or partition) the emission areas EMA of each pixel PXL and pixels PXL adjacent thereto, and may be, for example, a pixel defining layer. The second bank pattern may include at least one light blocking material and/or at least one reflective material, to prevent a light leakage defect in which light (or beam) may be leaked between each pixel PXL and pixels PXL adjacent thereto. In an embodiment, a reflective material layer may be formed over the second bank pattern to further improve the efficiency of light emitted from each pixel PXL. In an embodiment, the second bank pattern may be formed or disposed in a layer different from that of the first bank pattern BNK1 or may be formed or disposed in the same layer as the first bank pattern BNK1.

Each of the first and second electrodes EL1 and EL2 may be provided or disposed in the pixel area PXA of each pixel PXL, and may extend along the second direction DR2. The first and second intermediate electrodes CE1 and CE2 may be disposed between the first and second electrodes EL1 and EL2. In an example, the first intermediate electrode CE1 may be disposed between the first electrode EL1 and the second electrode EL2, and the second intermediate electrode CE2 may be disposed between the first intermediate electrode CE1 and the second electrode EL2. In a plan view, the first electrode EL1, the first intermediate electrode CE1, the second intermediate electrode CE2, and the second electrode EL2 may be sequentially arranged or disposed along the first direction DR1.

Each of the first and second electrodes EL1 and EL2 and the first and second intermediate electrodes CE1 and CE2 may extend along the second direction DR2, and may be provided in the pixel area PXA of each pixel PXL, or only the pixel area PXA of each pixel PXL. The first electrode EL1 and the first intermediate electrode CE1 may be spaced apart from each other at a certain or predetermined distance, the first intermediate electrode CE1 and the second intermediate electrode CE2 may be spaced apart from each other at a certain or predetermined distance, and the second intermediate electrode CE2 and the second electrode EL2 may be spaced apart from each other at a certain or predetermined distance. In the pixel area PXA of each pixel PXL, the first electrode EL1 and the first intermediate electrode CE1, the first intermediate electrode CE1 and the second intermediate electrode CE2, and the first intermediate electrode CE1 and the second electrode EL2 may be spaced apart from each other at the same distance. However, the disclosure is not limited thereto. In an embodiment, the first electrode EL1 and the first intermediate electrode CE1, the first intermediate electrode CE1 and the second intermediate electrode CE2, and the first intermediate electrode CE1 and the second electrode EL2 may be spaced apart from each other at different distances.

Each of the first electrode EL1, the first intermediate electrode CE1, the second intermediate electrode CE2, and the second electrode EL2 may be disposed and/or formed over the first bank pattern BNK1 to have a surface profile substantially corresponding to the shape of the first bank pattern BNK1. In an example, each of the first electrode EL1, the first intermediate electrode CE1, the second intermediate electrode CE2, and the second electrode EL2 may include a protrusion part substantially corresponding to the first bank pattern BNK1 and a flat part substantially corresponding to the passivation layer PSV. Each of the first electrode EL1, the first intermediate electrode CE1, the second intermediate electrode CE2, and the second electrode EL2 may be made of a material having a constant reflexibility to allow light emitted from each of the light emitting elements LD to advance in the image display direction of the display device.

Each of the first electrode EL1, the first intermediate electrode CE1, the second intermediate electrode CE2, and the second electrode EL2 may be made of a conductive material having a constant reflexibility. The conductive material may include an opaque metal advantageous in reflecting lights emitted from the light emitting elements LD in the image display direction of the display device. The opaque metal may include, for example, a metal such as Ag, Mg, Al, Pt, Pd, Au, Ni, Nd, Ir, Cr, Ti, or any alloy thereof. In an embodiment, each of the first electrode EL1, the first intermediate electrode CE1, the second intermediate electrode CE2, and the second electrode EL2 may include a transparent conductive material. The transparent conductive material may include a conductive oxide such as indium tin oxide (ITO), indium zinc oxide (IZO), zinc oxide (ZnO), or indium tin zinc oxide (ITZO), a conductive polymer such as PEDOT, and the like within the spirit and the scope of the disclosure. When each of the first electrode EL1, the first intermediate electrode CE1, the second intermediate electrode CE2, and the second electrode EL2 includes the transparent conductive material, a separate conductive layer may be additionally included, which may be made of an opaque metal for reflecting lights emitted from the light emitting elements LD in the image display direction of the display device. However, the material of each of the first electrode EL1, the first intermediate electrode CE1, the second intermediate electrode CE2, and the second electrode EL2 is not limited to the above-described materials.

Each of the first electrode EL1, the first intermediate electrode CE1, the second intermediate electrode CE2, and the second electrode EL2 may be provided and/or formed in a single layer, but the disclosure is not limited thereto. In an embodiment, each of the first electrode EL1, the first intermediate electrode CE1, the second intermediate electrode CE2, and the second electrode EL2 may be provided and/or formed in a multi-layer in which two or more materials among metals, alloys, conductive oxides, and conductive polymers may be stacked. Each of the first electrode EL1, the first intermediate electrode CE1, the second intermediate electrode CE2, and the second electrode EL2 may be provided in a multi-layer including at least two layers to minimize distortion that may be caused by a signal delay when a signal (or voltage) is transferred to both end portions EP1 and EP2 of each of the light emitting elements LD. In an example, each of the first electrode EL1, the first intermediate electrode CE1, the second intermediate electrode CE2, and the second electrode EL2 may be provided in a multi-layer in which indium tin oxide (ITO)/silver (Ag)/indium tin oxide (ITO) may be sequentially stacked.

As described above, since each of the first electrode EL1, the first intermediate electrode CE1, the second intermediate electrode CE2, and the second electrode EL2 may have a surface profile substantially corresponding to the shape of the first bank BNK1 disposed on the bottom thereof, light emitted from each of the light emitting elements LD may be reflected by each of the first electrode EL1, the first intermediate electrode CE1, the second intermediate electrode CE2, and the second electrode EL2 to be further advance in the image display direction of the display device. Consequently, the efficiency of light emitted from each of the light emitting elements LD may be further improved.

Each of the first bank pattern BNK1, the first electrode EL1, the first intermediate electrode CE1, the second intermediate electrode CE2, and the second electrode EL2 may serve as a reflective member which may allow lights emitted from the light emitting elements LD to advance in the image display direction of the display device, thereby improving the light emission efficiency of the light emitting elements LD.

In an embodiment, the first electrode EL1 may be disposed to substantially correspond to the first conductive line SL1, the first intermediate electrode CE1 may be disposed to substantially correspond to the second conductive line SL2, the second intermediate electrode CE2 may be disposed to substantially correspond to the third conductive line SL3, and the second electrode EL2 may be disposed to substantially correspond to the fourth conductive line SL4. The first electrode EL1 may be provided over the first bank pattern BNK1 on the passivation layer PSV, which may substantially correspond to the first conductive line SL1. The first intermediate electrode CE1 may be provided or disposed over the first bank pattern BNK1 on the passivation layer PSV, which may substantially correspond to the second conductive line SL2. The second intermediate electrode CE2 may be provided or disposed over the first bank pattern BNK1 on the passivation layer PSV, which may substantially correspond to the third conductive line SL3. The second electrode EL2 may be provided or disposed over the first bank pattern BNK1 on the passivation layer PSV, which may substantially correspond to the fourth conductive line SL4.

In a plan view, the first electrode EL1 and the first conductive line SL1 may overlap each other, the first intermediate electrode CE1 and the second conductive line SL2 may overlap each other, the second intermediate electrode CE2 and the third conductive line SL3 may overlap each other, and the second electrode EL2 and the fourth conductive line SL4 may overlap each other.

The first electrode EL1 may be electrically connected to the first conductive line SL1 through the second contact hole CH2 penetrating the passivation layer PSV. Based on the passivation layer PSV, the first conductive line SL1 may be a lower conductive layer disposed on the bottom of the passivation layer PSV, and the first electrode EL1 may be an upper conductive layer disposed on the top of the passivation layer PSV. The first electrode EL1 may be electrically connected to the first conductive line SL1 through the second contact hole CH2 to be provided or disposed together with the first conductive layer in a double layer for minimizing distortion that may be caused by a signal delay by reducing wiring resistance.

Although a case where the first electrode EL1 is electrically connected to the first conductive line SL1 to be provided or disposed together with the first conductive line SL1 in the double layer is illustrated in the above-described embodiment, the disclosure is not limited thereto. In an embodiment, in order to minimize wiring resistance, the first electrode EL1 may be electrically connected to any one of conductive layers disposed on the bottom of the first conductive line SL1, for example, disposed on the first interlayer insulating layer ILD1 to be provided or disposed together with the conductive layer and the first conductive line SL1 in a triple layer.

The first intermediate electrode CE1 may be electrically connected to the second conductive line SL2 through the third contact hole CH3 penetrating the passivation layer PSV. Based on the passivation layer PSV, the second conductive line SL2 may be a lower conductive layer disposed on the bottom of the passivation layer PSV, and the first intermediate electrode CE1 may be an upper conductive layer disposed on the top of the passivation layer PSV. The first intermediate electrode CE1 may be electrically connected to the second conductive line SL2 through the third contact hole CH3 to be provided or disposed together with the second conductive layer SL2 in a double layer for minimizing distortion that may be caused by a signal delay by reducing wiring resistance.

Although a case where the first intermediate electrode CE1 may be electrically connected to the second conductive line SL2 to be provided or disposed together with the second conductive line SL2 in the double layer is illustrated in the above-described embodiment, the disclosure is not limited thereto. In an embodiment, in order to minimize wiring resistance, the first intermediate electrode CE1 may be electrically connected to any one of conductive layers disposed on the bottom of the second conductive line SL2, for example, disposed on the first interlayer insulating layer ILD1 to be provided or disposed together with the conductive layer and the second conductive line SL2 in a triple layer.

The second intermediate electrode CE2 may be electrically connected to the third conductive line SL3 through the fourth contact hole CH4 penetrating the passivation layer PSV. Based on the passivation layer PSV, the third conductive line SL3 may be a lower conductive layer disposed on the bottom of the passivation layer PSV, and the second intermediate electrode CE2 may be an upper conductive layer disposed on the top of the passivation layer PSV. The second intermediate electrode CE2 may be electrically connected to the third conductive line SL3 through the fourth contact hole CH4 to be provided or disposed together with the third conductive layer SL3 in a double layer for minimizing distortion that may be caused by a signal delay by reducing wiring resistance.

Although a case where the second intermediate electrode CE2 may be electrically connected to the third conductive line SL3 to be provided or disposed together with the third conductive line SL3 in the double layer is illustrated in the above-described embodiment, the disclosure is not limited thereto. In an embodiment, in order to minimize wiring resistance, the second intermediate electrode CE2 may be electrically connected to any one of conductive layers disposed on the bottom of the third conductive line SL3, for example, disposed on the first interlayer insulating layer ILD1 to be provided or disposed together with the conductive layer and the third conductive line SL3 in a triple layer.

The second electrode EL2 may be electrically connected to the fourth conductive line SL4 through the fifth contact hole CH5 penetrating the passivation layer PSV. Based on the passivation layer PSV, the fourth conductive line SL4 may be a lower conductive layer disposed on the bottom of the passivation layer PSV, and the second electrode EL2 may be an upper conductive layer disposed on the top of the passivation layer PSV. The second electrode EL2 may be electrically connected to the fourth conductive line SL4 through the fifth contact hole CH5 to be provided or disposed together with the fourth conductive layer SL4 in a double layer for minimizing distortion that may be caused by a signal delay by reducing wiring resistance.

Although a case where the second electrode EL2 may be electrically connected to the fourth conductive line SL4 to be provided or disposed together with the fourth conductive line SL4 in the double layer is illustrated in the above-described embodiment, the disclosure is not limited thereto. In an embodiment, in order to minimize wiring resistance, the second electrode EL2 may be electrically connected to any one of conductive layers disposed on the bottom of the fourth conductive line SL4, for example, disposed on the first interlayer insulating layer ILD1 to be provided or disposed together with the conductive layer and the fourth conductive line SL4 in a triple layer.

The first electrode EL1, the first and second intermediate electrodes CE1 and CE2, and the second electrode EL2 may be formed to be disposed in the pixel area PXA of each pixel PXL, or only the pixel area PXA of each pixel PXL.

The third electrode EL3 may be disposed on the passivation layer PSV to be spaced apart from the first electrode EL1, and may be electrically separated from the first electrode ELL The third electrode EL3 may be electrically connected to the sub-electrode SUE through the seventh contact hole CH7 penetrating the passivation layer PSV. The third electrode EL3 may be electrically connected to the driving transistor Tdr of the pixel circuit layer PCL through the sub-electrode SUE. Therefore, a predetermined signal applied to the driving transistor Tdr may be transferred to the third electrode EL3 via the sub-electrode SUE.

The fourth electrode EL4 may be disposed on the passivation layer PSV to be spaced apart from the second electrode EL2. The fourth electrode EL4 may be electrically connected to the fourth conductive line SL4 through the sixth contact hole CH6 penetrating the passivation layer PSV. The fourth electrode EL4 may be electrically connected to the second electrode EL2 through the fourth conductive line SL4. In an embodiment disclosure, the second driving power source VSS may be applied to the fourth conductive line SL4. Accordingly, the second driving power source VDD applied to the fourth conductive line SL4 may be applied to the second and fourth electrodes EL2 and EL4.

In an embodiment, each of the first electrode EL1, the first intermediate electrode CE1, the second intermediate electrode CE2, and the second electrode EL2 may receive a predetermined alignment signal (or alignment voltage) transferred from a corresponding conductive line that may serve together with the corresponding conductive line as an alignment electrode (or alignment line) that may align the light emitting elements LD. In an example, the first electrode EL1 may receive a first alignment signal (or first alignment voltage) transferred from the first conductive line SL1 that may serve together with the first conductive line SL1 as a first alignment electrode (or first alignment line), and the first intermediate electrode CE1 may receive a second alignment signal (or second alignment voltage) transferred from the second conductive line SL2 that may serve together with the second conductive line SL2 as a second alignment electrode (or second alignment line). The second intermediate electrode CE2 may receive a third alignment signal (or third alignment voltage) transferred from the third conductive line SL3 that may serve together with the third conductive line SL3 as a third alignment electrode (or third alignment line), and the second electrode EL2 may receive a fourth alignment signal (or fourth alignment voltage) transferred from the fourth conductive line SL4 that may serve together with the fourth conductive line SL4 as a fourth alignment electrode (or fourth alignment line).

The first to fourth alignment signals may be signals having a voltage difference and/or a phase difference to a degree to which the light emitting elements LD may be aligned between the first electrode EL1, the first and second intermediate electrodes CE1 and CE2, and the second electrode EL2. In an embodiment, among the first to fourth alignment signals, the first and third alignment signals may have the same voltage level, and the second and fourth alignment signals may have the same voltage level.

At least some of the first to fourth alignment signals may be alternating current (AC) signals, but the disclosure is not limited thereto.

When a corresponding alignment signal may be applied to each of the first electrode EL1, the first and second intermediate electrodes CE1 and CE2, and the second electrode EL2, an electric field may be formed between each of the first electrode EL1 and the first intermediate electrode CE1, between the first intermediate electrode CE1 and the second intermediate electrode CE2, and the second intermediate electrode CE2 and the second electrode EL2. The light emitting elements LD may be aligned and/or provided in the emission area EMA of each pixel PXL by the electric field formed between the two adjacent electrodes.

In an embodiment, when light emitting elements LD may be aligned in the emission area EMA of each pixel PXL, the alignment signal (or alignment voltage) applied to each of the first electrode EL1, the first and second intermediate electrodes CE1 and CE2, and the second electrode EL2 may be controlled, or a magnetic field may be formed, so that the light emitting elements LD supplied in the emission area EMA may be aligned to be relatively biased.

Each of the light emitting elements LD may be a light emitting element having a micro size, for example, a small size ranging from nano scales or micro scales, which may be fabricated using a material having an inorganic crystalline structure. For example, each of the light emitting elements LD may be a micro light emitting element fabricated through an etching process or a micro light emitting element fabricated through a growth process. However, the kind or type, size, shape, for example of the light emitting elements LD may be variously changed within the spirit and the scope of the disclosure. At least two or a few tens of light emitting elements LD may be aligned and/or provided and/or disposed in the emission area EMA of each pixel PXL, but the number of the light emitting elements LD is not limited thereto. In an embodiment, the number of the light emitting elements LD aligned and/or provided and/or disposed in the emission area EMA of each pixel PXL may be variously changed within the spirit and the scope of the disclosure.

Each of the light emitting elements LD may be disposed between two electrodes adjacent in the first direction DR1. The light emitting elements LD may include first light emitting elements LD1 disposed between the first electrode EL1 and the first intermediate electrode CE1, second light emitting elements LD2 disposed between the first intermediate electrode CE1 and the second intermediate electrode CE2, and third light emitting elements LD3 disposed between the second intermediate electrode CE2 and the second electrode EL2. In the following embodiment, when one of the first to third light emitting elements LD1 to LD3 is arbitrarily designated or when the first to third light emitting elements LD1 to LD3 are inclusively designated, the light emitting element or the light emitting elements may be referred to as a light emitting element LD or light emitting elements LD.

In an embodiment, each of the light emitting elements LD may emit any one of colored light and/or white light. Each of the light emitting elements LD may be aligned between two adjacent electrodes such that its length L direction may be substantially parallel to the first direction DR1. The light emitting elements LD may be provided or disposed in a form in which they may be dispersed in a solution, to be injected into the emission area EMA of each pixel PXL.

In an embodiment, the light emitting elements LD may be injected into the emission area EMA of each pixel PXL through an inkjet printing process, a slit coating process, or other various processes within the spirit and the scope of the disclosure. In an example, the light emitting elements LD may be mixed with a volatile solvent to be supplied to the emission area EMA of each pixel PXL through an inkjet printing process or a slit coating process. When a corresponding alignment signal (or alignment voltage) is applied to each of the first to fourth conductive lines SL1 to SL4 located or disposed in the pixel area PXA of each pixel PXL, an electric field may be formed between two adjacent electrodes among the first electrode EL1, the first intermediate electrode CE1, the second intermediate electrode CE2, and the second electrode EL2.

After the light emitting elements LD may be aligned, the solvent may be volatilized or removed through another process, so that the light emitting elements LD may be finally aligned and/or provided and/or disposed in the emission area EMA of each pixel PXL.

The above-described light emitting elements LD may be provided and/or formed and/or disposed on a first insulating layer INS1 in the emission area EMA of each pixel PXL.

The first insulating layer INS1 may be formed and/or provided and/or disposed on the bottom of each of the light emitting elements LD, which may be aligned and/or provided and/or disposed between two electrodes in the emission area EMA of each pixel PXL. The first insulating layer INS1 may be filled in a space between each of the light emitting elements LD and the passivation layer PSV, to stably support the light emitting elements LD and prevent separation of the light emitting elements LD from the passivation layer PSV.

The first insulating layer INS1 may include an inorganic insulating layer made of an inorganic material or an organic insulating layer made of an organic material. In an embodiment, the first insulating layer INS1 may be an inorganic insulating layer advantageous in protecting the light emitting elements LD from the pixel circuit layer PCL of each pixel PXL, but the disclosure is not limited thereto. In an embodiment, the first insulating layer INS1 may be an organic insulating layer advantageous in planarizing a supporting surface of the light emitting elements LD.

In an embodiment, the first insulating layer INS1 may be provided or disposed over each of the first electrode EL1, the first intermediate electrode CE1, the second intermediate electrode CE2, and the second electrode EL2, and may cover or overlap the first electrode EL1, the first intermediate electrode CE1, the second intermediate electrode CE2, and the second electrode EL2. The first insulating layer INS1 may not cover or overlap the third electrode EL3 and the fourth electrode EL4. Therefore, the third electrode EL3 and the fourth electrode EL4 may be exposed to the outside.

An upper surface of the first electrode EL1 may be completely covered or overlapped by the first insulating layer INS1 to be electrically insulated from adjacent electrodes. An upper surface of the first intermediate electrode CE1 may be completely covered or overlapped by the first insulating layer INS1 to be electrically insulated from adjacent electrodes. An upper surface of the second intermediate electrode CE2 may be completely covered or overlapped by the first insulating layer INS1 to be electrically insulated from adjacent electrodes. An upper surface of the second electrode EL2 may be completely covered or overlapped by the first insulating layer INS1 to be electrically insulated from adjacent electrodes.

A second insulating layer INS2 may be provided and/or formed and/or disposed over the light emitting elements LD. The second insulating layer INS2 may be provided and/or formed and/or disposed over each of the light emitting elements LD to cover or overlap a partial upper surface of each of the light emitting elements LD, and expose both end portions EP1 and EP2 of each of the light emitting elements LD to the outside. The second insulating layer INS2 may be formed as an independent pattern on the emission area EMA of each pixel PXL, but the disclosure is not limited thereto.

The second insulating layer INS2 may be a single layer or a multi-layer, and may include an inorganic insulating layer including at least one inorganic material or an organic insulating layer including at least one organic material. The second insulating layer INS2 may allow each of the light emitting elements LD aligned in the emission area EMA of each pixel PXL to be further fixed. In an embodiment, the second insulating layer INS2 may include an inorganic insulating layer advantageous in protecting the active layer 12 of each of the light emitting elements LD from external oxygen, moisture, and other damage within the spirit and the scope of the disclosure. However, the disclosure is not limited thereto. The second insulating layer INS2 may include an organic insulating layer including an organic material according to design conditions of the display device to which the light emitting elements LD may be applied.

In an embodiment, after light emitting elements LD may be completely aligned in the emission area EMA of each pixel PXL, the second insulating layer INS2 may be formed or disposed over the light emitting elements LD, so that the light emitting elements LD may be prevented from being separated from the position at which the light emitting elements LD may be aligned. Meanwhile, as shown in FIG. 14, when a gap (or space) exists between the first insulating layer INS1 and the light emitting elements LD before the second insulating layer INS2 may be formed, the gap may be filled with the second insulating layer INS2 in the process of forming the second insulating layer INS2. Accordingly, the light emitting elements LD may include an organic insulating layer advantageous in fill the gap between the first insulating layer INS1 and the light emitting elements LD.

In an embodiment, the second insulating layer INS2 may be formed or disposed over each of the light emitting elements LD such that the active layer 12 of the light emitting elements LD may be prevented from being in contact with an external conductive material. The second insulating layer INS2 may cover or overlap only a partial surface of each of the light emitting elements LD, and may expose both end portions EP1 and EP2 of each of the light emitting elements LD to the outside.

The contact electrode CNE may be disposed on the first insulating layer INS1.

In an embodiment, the contact electrode CNE may be a component electrically connected to each of the third electrode EL3 and the fourth electrode EL4 to transfer a corresponding signal (or voltage) to both end portions EP1 and EP2 of each of the light emitting elements LD.

The contact electrode CNE may be made of various transparent conductive materials. In an example, the contact electrode CNE may include at least one of various transparent conductive materials including ITO, IZO, and ITZO, and may be substantially transparent or translucent to satisfy a predetermined transmittance. However, the material of the contact electrode CNE is not limited to the above-described embodiments. In an embodiment, the contact electrode CNE may be made of various opaque conductive materials.

The contact electrode CNE may include a first contact electrode CNE1 disposed on the first insulating layer INS1, a second contact electrode CNE2 disposed on the first intermediate electrode CE1, a third contact electrode CNE3 disposed on the second intermediate electrode CE2, and a fourth contact electrode CNE4 disposed on the second electrode EL2.

The first contact electrode CNE1 may be directly disposed on the third electrode EL3, and may be disposed on one of both end portions EP1 and EP2 of each of the first light emitting elements LD1. The first contact electrode CNE1 may electrically connect the third electrode EL3 and the one end portion of each of the first light emitting elements LD1. In a plan view, the first contact electrode CNE1 may overlap the one end portion of each of the first light emitting elements LD1 and the third electrode EL3. The first contact electrode CNE1 may overlap the first electrode EL1.

Since the first contact electrode CNE1 may be directly electrically connected to the third electrode EL3, a signal of the driving transistor Tdr, which may be applied to the third electrode EL3 through the sub-electrode SUE, may be transferred to the first contact electrode CNE1. The signal transferred to the first contact electrode CNE1 may be applied to the one end portion of each of the first light emitting elements LD1.

The second contact electrode CNE2 may be disposed on the first insulating layer INS1 over the first intermediate electrode CE1, and may be electrically connected to the other of both the end portions EP1 and EP2 of each of the first light emitting elements LD1. The second contact electrode CNE2 may be electrically connected to one of both end portions EP1 and EP2 of each of the second light emitting elements LD2. In a plan view, the second contact electrode CNE2 may overlap the other end portion of each of the first light emitting elements LD1 and the one end portion of each of the second light emitting elements LD2. The second contact electrode CNE2 may be electrically and/or physically separated from the first intermediate electrode CE1 located or disposed thereunder by the first insulating layer INS1. In an embodiment, the second contact electrode CNE2 and the first intermediate electrode CE1 may not be electrically connected to each other.

The first contact electrode CNE1 and the second contact electrode CNE2 may be disposed to be spaced apart from each other. In an example, the first contact electrode CNE1 and the second contact electrode CNE2 may be disposed on the second insulating layer INS2 to be spaced apart from each other at a certain or predetermined distance. However, the disclosure is not limited thereto. In an embodiment, as shown in FIG. 9B, the first contact electrode CNE1 and the second contact electrode CNE2 may be disposed on an upper surface of each first light emitting element LD1 to be spaced apart from each other at a certain or predetermined distance. For example, the first contact electrode CNE1 and the second contact electrode CNE2 may be disposed on the insulating film surrounding the outer circumference of the first light emitting element LD1 to be spaced apart from each other at a certain or predetermined distance.

In an embodiment of, one of both the end portions EP1 and EP2 of each first light emitting element LD1 may be directly electrically connected to the first contact electrode CNE1, and the other end portion of the first light emitting element LD1 may be directly electrically connected to the second contact electrode CNE2. The first contact electrode CNE1 and the second contact electrode CNE2 may be provided or disposed in the same layer. However, the disclosure is not limited thereto. In an embodiment, the first and second contact electrodes CNE1 and CNE2 may be provided or disposed in different layers. When the first contact electrode CNE1 and the second contact electrode CNE2 may be provided or disposed in different layers, a separate insulating layer may be provided or disposed between the first contact electrode CNE1 and the second contact electrode CNE2.

The third contact electrode CNE3 may be disposed on the first insulating layer INS1 over the second intermediate electrode CE2, and may be electrically connected to the other of both the end portions EP1 and EP2 of each of the second light emitting elements LD2. The third contact electrode CNE3 may be one of both end portions EP1 and EP2 of each of the third light emitting elements LD3. In a plan view, the third contact electrode CNE3 may overlap the other end portion of each of the second light emitting elements LD2 and the one end portion of each of the third light emitting elements LD3. The third contact electrode CNE3 may be electrically and/or physically separated from the second intermediate electrode CE2 located or disposed thereunder by the first insulating layer INS1. In an embodiment, the third contact electrode CNE3 and the second intermediate electrode CE2 may not be electrically connected to each other.

The second contact electrode CNE2 and the third contact electrode CNE3 may be disposed to be spaced apart from each other. In an example, the second contact electrode CNE2 and the third contact electrode CNE3 may be disposed on the second insulating layer INS2 to be spaced apart from each other at a certain or predetermined distance. Although not directly shown in the drawings, the second contact electrode CNE2 and the third contact electrode CNE3 may be disposed on an upper surface of each second light emitting element LD2 to be spaced apart from each other at a certain or predetermined distance. In an embodiment, one of both the end portions EP1 and EP2 of each second light emitting element LD2 may be directly electrically connected to the second contact electrode CNE2, and the other end portion of the second light emitting element LD2 may be directly electrically connected to the third contact electrode CNE3.

The second contact electrode CNE2 and the third contact electrode CNE3 may be provided or disposed in the same layer. However, the disclosure is not limited thereto. In an embodiment, the second and third contact electrodes CNE2 and CNE3 may be provided or disposed in different layers. When the second contact electrode CNE2 and the third contact electrode CNE3 are provided or disposed in different layers, a separate insulating layer may be provided or disposed between the second contact electrode CNE2 and the third contact electrode CNE3.

The fourth contact electrode CNE4 may be disposed on the fourth electrode EL4, and may be disposed on the other of both the end portions EP1 and EP2 of each of the third light emitting elements LD3. The fourth contact electrode CNE4 may electrically connect the fourth electrode EL4 and the other end portion of each of the third light emitting elements LD3. In a plan view, the fourth contact electrode CNE4 may overlap the one end portion of each of the third light emitting elements LD3 and the fourth electrode EL4. The fourth contact electrode CNE4 may overlap the second electrode EL2.

When the fourth contact electrode CNE4 is directly electrically connected to the fourth electrode EL4, the second driving power source VSS applied to the fourth electrode EL4 through the fourth conductive line SL4 may be transferred to the fourth contact electrode CNE4. The second driving power source VSS transferred to the fourth contact electrode CNE4 may be applied to the other end portion of each of the third light emitting elements LD3.

In an embodiment, one of both the end portions EP1 and EP2 of each third light emitting element LD3 may be directly electrically connected to the third contact electrode CNE3, and the other end portion of the third light emitting element LD3 may be directly electrically connected to the fourth contact electrode CNE4.

The third contact electrode CNE3 and the fourth contact electrode CNE4 may be disposed to be spaced apart from each other. In an example, the third contact electrode CNE3 and the fourth contact electrode CNE4 may be disposed on the second insulating layer INS2 to be spaced apart from each other at a certain or predetermined distance. Although not directly shown in the drawings, the third contact electrode CNE3 and the fourth contact electrode CNE4 may be disposed on an upper surface of each third light emitting element LD3 to be spaced apart from each other at a certain or predetermined distance.

The third contact electrode CNE3 and the fourth contact electrode CNE4 may be provided or disposed in the same layer, but the disclosure is not limited thereto. In an embodiment, the third contact electrode CNE3 and the fourth contact electrode CNE4 may be provided or disposed in different layers. In an example, as shown in FIG. 15, the third contact electrode CNE3 may be provided or disposed on the second insulating layer INS2, and may be covered or overlapped by an auxiliary insulating layer AUINS. The fourth contact electrode CNE4 may be provided or disposed on the auxiliary insulating layer AUINS, and be covered or overlapped by a third insulating layer INS3. The auxiliary insulating layer AUINS may be an inorganic insulating layer including an inorganic material or an organic insulating layer including an organic material.

In an embodiment, the first contact electrode CNE1 may be the anode electrode of the light emitting unit EMU of each pixel PXL, and the fourth electrode CNE4 may be the cathode electrode of the light emitting unit EMU of each pixel PXL.

The third insulating layer INS3 may be provided and/or formed and/or disposed over the first to fourth contact electrodes CNE1 to CNE4. The third insulating layer INS3 may be an inorganic insulating layer including an inorganic material or an organic insulating layer including an organic material. In an example, the third insulating layer INS3 may have a structure in which at least one inorganic insulating layer and at least one organic insulating layer may be alternately stacked. The third insulating layer INS3 may entirely cover or overlap the display element layer DPL to block moisture, humidity or the like from the outside from being introduced to the display element layer DPL including the light emitting elements LD.

In accordance with the above-described embodiment, the first and second contact electrodes CNE1 and CNE2 spaced part from each other and the first light emitting elements LD1 electrically connected in parallel therebetween may constitute one serial stage (for example, a first serial stage), the second and third contact electrodes CNE2 and CNE3 spaced part from each other and the second light emitting elements LD2 electrically connected in parallel therebetween may constitute another serial stage (for example, a second serial stage), and the third and fourth contact electrodes CNE3 and CNE4 spaced part from each other and the third light emitting elements LD3 electrically connected in parallel therebetween may constitute a serial stage (for example, a third serial stage).

Light emitting element LD included in each of two consecutive serial stages may be electrically connected to each other by sharing one contact electrode CNE. The first light emitting elements LD1 included in the first serial stage and the second light emitting elements LD2 included in the second serial stage may be electrically connected to each other by sharing the second contact electrode CNE2. The second light emitting elements LD2 included in the second serial stage and the third light emitting elements LD3 included in the third serial stage may be electrically connected to each other by sharing the third contact electrode CNE3. In this manner, the light emitting elements LD aligned in the emission area EMA of each pixel PXL may be electrically connected in a serial/parallel mixed structure, to constitute the light emitting unit EMU of each pixel PXL.

In the case that a driving current flows from the first conductive line (see 'PL1' shown in FIGS. 6A to 7B) to the fourth conductive line SL4 by the driving transistor Tdr of the pixel circuit layer PCL included in each pixel PXL, the driving current may be introduced to the light emitting unit EMU of each pixel PXL through the sub-electrode SUE and the first contact hole CH1. In an example, the driving current flows in the second contact electrode CNE2 via the third electrode EL3 and the first contact electrode CNE1 through the sub-electrode SUE and the first contact hole CH1. Accordingly, each of the first light emitting elements LD1 disposed between the first contact electrode CNE1 and the second contact electrode CNE2 may emit light with a luminance corresponding to a divided current flowing thereto.

The driving current flowing to the second contact electrode CNE2 flows to the third contact electrode CNE3 via the second light emitting elements LD2. Accordingly, each of the second light emitting elements LD2 may emit light with a luminance corresponding to a divided current flowing thereto.

The driving current flowing to the third contact electrode CNE3 flows to the fourth contact electrode CNE4 via the third light emitting elements LD3. Accordingly, each of the third light emitting elements LD3 may emit light with a luminance corresponding to a divided current flowing thereto.

In the above-described manner, a driving current of each pixel PXL may flow by sequentially passing through the first light emitting elements LD1 disposed between the first and second contact electrodes CNE1 and CNE2, the second light emitting elements LD2 disposed between the second and third contact electrodes CNE2 and CNE3, and the third light emitting elements LD3 disposed between the third and fourth contact electrodes CNE3 and CNE4. Accordingly, each pixel PXL may emit light with a luminance corresponding to a data signal supplied during each frame period.

In accordance with the above-described embodiment, an alignment signal (or alignment voltage) that may align light emitting elements LD may be transferred to each of the first electrode EL1, the first and second intermediate electrodes CE1 and CE2, and the second electrode EL2 through the first to fourth conductive lines SL1 to SL4, so that the light emitting elements LD may be aligned in the emission area EMA of each pixel PXL. The first and second electrodes EL1 and EL2 and the first and second intermediate electrodes CE1 and CE2 may be disposed in the pixel area PXA of each pixel PXL, or only the pixel area PXA of each pixel PXL, to drive each pixel PXL independently (or individually) from adjacent pixels PXL. Accordingly, a process of removing some of alignment electrodes, for example may be omitted to independently (or individually) drive each of the pixels PXL after light emitting elements LD may be aligned in the emission area EMA of each pixel PXL. Consequently, a fabricating process of the display device in accordance with the above-described embodiment may be simplified.

In accordance with the above-described embodiment, each of the first electrode EL1, the first and second intermediate electrodes CE1 and CE2, and the second electrode EL2 may be provided in a double-layered structure by being electrically connected to a conductive line having a relatively thick thickness, so that a defect caused by a signal delay may be minimized by reducing wiring resistance of each of the first electrode EL1, the first and second intermediate electrodes CE1 and CE2, and the second electrode EL2.

As an example, in accordance with the above-described embodiment, each of the first electrode EL1, the first and second intermediate electrodes CE1 and CE2, and the second electrode EL2 may be covered or overlapped by the first insulating layer INS1, not to be influenced by static electricity introduced from the outside.

In accordance with the above-described embodiment, the light emitting unit EMU may be provided or disposed in a serial/parallel mixed structure, so that each pixel PXL may be stably driven. Accordingly, a driving current flowing in the display panel of the display device may be decreased, so that the power consumption efficiency of the display device may be improved.

FIGS. 16A to 16F are schematic plan views sequentially illustrating a method of fabricating the one pixel shown in FIG. 8. FIGS. 17A to 17I are schematic cross-sectional views sequentially illustrating a method of fabricating the one pixel shown in FIG. 9A.

Hereinafter, the pixel in accordance with an embodiment of the disclosure, which is shown in FIGS. 8 and 9A, will be sequentially described according to the method in conjunction with FIGS. 16A to 16F and 17A to 17I.

Referring to FIGS. 1A to 5, 8 to 15, 16A, and 17A, some components of a pixel circuit layer PCL included in each of pixels PXL may be formed or disposed on a substrate SUB. A pixel area PXA in which each pixel PXL may be provided (or formed or disposed) may include an emission area EMA in which light may be emitted and a peripheral area surrounding the periphery of the emission area EMA.

The components of above-described pixel circuit layer PCL may include a driving transistor Tdr, a switching transistor Tsw, a data line Dj, an initialization power line IPL, a connection electrode STE, and at least one insulating layer. The at least one insulating layer may include a buffer layer BFL, a gate insulating layer GI, and a first interlayer insulating layer ILD1, which may be sequentially formed or disposed on the substrate SUB.

Referring to FIGS. 1A to 5, 8 to 15, 16B, 17A, and 17B, a second interlayer insulating layer ILD2 including a first contact hole CH1 exposing a portion of the driving transistor Tdr may be formed or disposed on the first interlayer insulating layer ILD1.

A sub-electrode SUE and first to fourth conductive lines SL1 to SL4 may be formed or disposed on the second interlayer insulating layer ILD2.

The sub-electrode SUE may be provided or disposed in each of the pixels PXL. The sub-electrode SUE may be electrically connected to the driving transistor Tdr through a first contact hole CH1.

The first to fourth conductive lines SL1 to SL4 may be commonly provided in pixels PXL located or disposed on the same pixel column in a display area DA. For example, the pixels PXL located or disposed on the same pixel column may be commonly connected to the first to fourth conductive lines SL1 to SL4.

Referring to FIGS. 1A to 5, 8 to 15, and 17A to 17C, after an insulating material layer may be formed or disposed over the sub-electrode SUE and the first to fourth conductive lines SL1 to SL4, a passivation layer PSV may be formed or disposed, which may include a seventh contact hole CH7 exposing a portion of the sub-electrode SUE, a second contact hole CH2 exposing the first conductive line SL1, a third contact hole CH3 exposing a portion of the second conductive line SL2, a fourth contact hole (see CH4 shown in FIG. 10) exposing a portion of the third conductive line SL3, a fifth contact hole CH5 exposing a portion of the fourth conductive line SL4, and a sixth contact hole CH6 exposing another portion of the fourth conductive line SL4.

Referring to FIGS. 1A to 5, 8 to 15, 16C, and 17A to 17D, a first bank pattern BNK1 may be formed or disposed on the passivation layer PSV. The first bank pattern BNK1 may be spaced apart from an adjacent first bank pattern BNK1 at a certain or predetermined distance. In a plan view, the first bank pattern BNK1 may have a substantially bar shape extending in one direction, for example, a second direction DR2, but the disclosure is not limited thereto. The first bank pattern BNK1 may include an inorganic insulating layer made of an inorganic material or an organic insulating layer made of an organic material.

Referring to FIGS. 1A to 5, 8 to 15, 16D, and 17A to 17E, first to fourth electrodes EL1 to EL4 and first and second intermediate electrodes CE1 and CE2, which may include a conductive substance (or material) having high reflexibility, may be formed or disposed on the passivation layer PSV including the first bank pattern BNK1.

Each of the first electrode EL1, the first and second intermediate electrodes CE1 and CE2, and the second electrode EL2 may be formed or disposed over a corresponding first bank pattern BNK1 in the emission area EMA of each pixel PXL, and the first electrode EL1, the first and second intermediate electrodes CE1 and CE2, and the second electrode EL2 may be spaced apart from each other.

In an embodiment, the first electrode EL1, the first and second intermediate electrodes CE1 and CE2, and the second electrode EL2 may be provided or disposed in each of the pixels PXL. In an example, a first electrode EL1 provided in one pixel PXL may be separated from a first electrode EL1 provided or disposed in each of adjacent pixels PXL disposed on the same pixel column as the one pixel PXL without being electrically connected to the first electrode EL1. A first intermediate electrode CE1 provided or disposed in one pixel PXL may be separated from a first intermediate electrode CE1 provided or disposed in each of adjacent pixels PXL disposed on the same pixel column as the one pixel PXL without being electrically connected to the first intermediate electrode CE1. A second intermediate electrode CE2 provided or disposed in one pixel PXL may be separated from a second intermediate electrode CE2 provided or disposed in each of adjacent pixels PXL disposed on the same pixel column as the one pixel PXL without being electrically connected to the second intermediate electrode CE2. A second electrode EL2 provided or disposed in one pixel PXL may be separated from a second electrode EL2 provided or disposed in each of adjacent pixels PXL disposed on the same pixel column as the one pixel PXL without being electrically connected to the second electrode EL2.

The first electrode EL1 may be electrically connected to the first conductive line SL1 through the second contact hole CH2, and may serve together with the first conductive line SL1 as a first alignment electrode (or first alignment line) that may align the light emitting elements LD. The first alignment electrode may be provided in a double-layered structure including the first conductive line SL1 and the first electrode EL1 electrically connected to the first conductive line SL1.

The first intermediate electrode CE1 may be electrically connected to the second conductive line SL2 through the third contact hole CH3, and may serve together with the second conductive line SL2 as a second alignment electrode (or second alignment line) that may align the light emitting elements LD. The second alignment electrode may be provided in a double-layered structure including the second conductive line SL2 and the first intermediate electrode CE1 electrically connected to the second conductive line SL2.

The second intermediate electrode CE2 may be electrically connected to the third conductive line SL3 through the fourth contact hole CH4, and may serve together with the third conductive line SL3 as a third alignment electrode (or third alignment line) that may align the light emitting elements LD. The third alignment electrode may be provided in a double-layered structure including the third conductive line SL3 and the second intermediate electrode CE2 electrically connected to the third conductive line SL3.

The second electrode EL2 may be electrically connected to the fourth conductive line SL4 through the fifth contact hole CH5, and may serve together with the fourth conductive line SL4 as a fourth alignment electrode (or fourth alignment line) that may align the light emitting elements LD. The fourth alignment electrode may be provided in a double-layered structure including the fourth conductive line SL4 and the second electrode EL2 electrically connected to the fourth conductive line SL4.

A third electrode EL3 may be electrically connected to the sub-electrode SUE through the seventh contact hole CH7, and may be electrically connected to the driving transistor Tdr through the sub-electrode SUE.

A fourth electrode EL4 may be electrically connected to the fourth conductive line SL4 through the sixth contact hole CH6.

Referring to FIGS. 1A to 5, 8 to 15, and 17A to 17F, a first insulating layer INS1 may be formed over the first electrode EL1, the first and second intermediate electrodes CE1 and CE2, and the second electrode EL2. The first insulating layer INS1 may cover or overlap the first electrode EL1, the first and second intermediate electrodes CE1 and CE2, and the second electrode EL2. The first insulating layer INS1 may not cover or overlap the third and fourth electrode EL3 and EL4. Accordingly, the third and fourth electrodes EL3 and EL4 may be exposed to the outside.

Subsequently, a second bank pattern (not shown) may be formed in the peripheral area of each of the pixels PXL.

Referring to FIGS. 1A to 5, 8 to 15, 16E, and 17A to 17G, an electric field may be formed between an electrode electrically connected to a corresponding conductive line and an electrode adjacent thereto by applying a corresponding alignment signal (or alignment voltage) to each of the first to fourth conductive lines SL1 to SL4. The same first alignment signal (or first alignment voltage) may be applied to the first and third conductive lines SL1 and SL3, and the same second alignment signal (or second alignment voltage) may be applied to the second and fourth conductive lines SL2 and SL4. The first alignment signal (or first alignment voltage) may be different from the second alignment signal (or second alignment voltage).

As described above, a mixed solution including light emitting elements LD may be injected into the emission area EMA of each pixel PXL through an inkjet printing process in which an electric field may be formed between two adjacent electrodes. In an example, an inkjet nozzle may be disposed above the first insulating layer INS1, and a solvent in which light emitting elements LD may be mixed may be injected into the emission area EMA of each pixel PXL through the inkjet nozzle. The solvent may be at least one of acetone, water, alcohol, and toluene, but the disclosure is not limited thereto. For example, the solvent may be provided in the form of ink or paste. The method of injecting the light emitting elements LD into the emission area EMA of each pixel PXL is not limited to the above-described embodiment, and may be variously changed within the spirit and the scope of the disclosure.

The solvent may be removed after the light emitting elements LD may be injected into the emission area EMA of each pixel PXL.

When the light emitting elements LD are injected into the emission area EMA of each pixel PXL, self-alignment of the light emitting elements LD may be induced due to an electric field formed in between the first electrode EL1 and the first intermediate electrode CE1, between the first intermediate electrode CE1 and the second intermediate electrode CE2, and between the second intermediate electrode CE2 and the second electrode EL2. Accordingly, first light emitting elements LD1 may be aligned between the first electrode EL1 and the first intermediate electrode CE1, second light emitting elements LD2 may be aligned between the first intermediate electrode CE1 and the second intermediate electrode CE2, and third light emitting elements LD3 may be aligned between the second intermediate electrode CE2 and the second electrode EL2. The first to third light emitting elements LD1 to LD3 may be aligned on the first insulating layer INS1 in the emission area EMA of each pixel PXL.

A second insulating layer INS2 may be continuously formed over each of the first to third light emitting elements LD1 to LD3. The second insulating layer INS2 may expose both end portions EP1 and EP2 of each of the light emitting elements LD to the outside by covering or overlapping at least a portion of an upper surface of each of the first to third light emitting elements LD1 to LD3.

Referring to FIGS. 1A to 5, 8 to 15, 16F, and 17A to 17H, first to fourth contact electrodes CNE1 to CNE4 may be formed or disposed on the first to fourth electrode EL1 to EL4 and the first and second intermediate electrodes CE1 and CE2.

The first contact electrode CNE1 may overlap the third electrode EL3, the first electrode EL1, and one end portion of each of the first light emitting elements LD1. The first contact electrode CNE1 may be directly formed or disposed on the third electrode EL3 to be electrically connected to the third electrode EL3, and be electrically connected to one end portion of each of the first light emitting elements LD1. The first contact electrode CNE1 may electrically connect the third electrode EL3 and the one end portion of each of the first light emitting elements LD1.

The second contact electrode CNE2 may overlap the other end portion of each of the first light emitting elements LD1, the first intermediate electrode CE1, and one end portion of each of the second light emitting elements LD2. The second contact electrode CNE2 may electrically connect the other end portion of each of the first light emitting elements LD1 and the one end portion of each of the second light emitting elements LD2. The second contact electrode CNE2 may not be electrically connected to the first intermediate electrode CE1 by the first insulating layer INS1. For example, the first intermediate electrode CE1 and the second contact electrode CNE2 may be electrically separated (or insulated) from each other.

The third contact electrode CNE3 may overlap the other end portion of each of the second light emitting elements LD2, the second intermediate electrode CE2, and one end portion of each of the third light emitting elements LD3. The third contact electrode CNE3 may electrically connect the other end portion of each of the second light emitting elements LD2 and the one end portion of each of the third light emitting elements LD3. The third contact electrode CNE3 may not be electrically connected to the second intermediate electrode CE2 by the first insulating layer INS1. For example, the second intermediate electrode CE2 and the third contact electrode CNE3 may be separated (or insulated) from each other.

The fourth contact electrode CNE4 may overlap the other end portion of each of the third light emitting elements LD3, the second electrode EL2, and the fourth electrode EL4. The fourth contact electrode CNE4 may be directly formed or disposed on the fourth electrode EL4 to be electrically connected to the fourth electrode EL4, and be electrically connected to the other end portion of each of the third light emitting elements LD3. The fourth contact electrode CNE4 may electrically connect the fourth electrode EL4 and the other end portion of each of the third light emitting elements LD3.

Referring to FIGS. 1A to 5, 8 to 15, and 17A to 17I, a third insulating layer INS3 covering or overlapping the first to fourth contact electrodes CNE1 to CNE4 may be formed or disposed. The third insulating layer INS3 may have a structure in which at least one inorganic layer and at least one organic layer may be alternately stacked.

In accordance with the disclosure, there may be provided a display device in which light emitting elements may be aligned in each pixel by applying a conductive line provided or disposed in a pixel circuit layer, so that a separation process of a line that may align the light emitting elements may be omitted, thereby simplifying a fabricating process.

There may be provided a method of fabricating the display device.

Embodiments have been disclosed herein, and although specific terms may be employed, those terms used herein are to be interpreted in a generic and descriptive sense only and not for purpose of limitation. In some instances, as would be apparent to one of ordinary skill in the art, features, characteristics, and/or elements described in connection with an embodiment may be used singly or in combination with features, characteristics, and/or elements described in connection with another or other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a substrate including:
a display area including a plurality of pixel areas; and
a non-display area adjacent to the display area; and
a pixel disposed in each of the plurality of pixel areas,
wherein the pixel includes:
a sub-electrode, a first conductive line, and a second conductive line, disposed on the substrate, wherein the sub-electrode, the first conductive line, and the second conductive line are spaced apart from each other;
a first insulating layer disposed over the sub-electrode and the first and second conductive lines;
first to fourth electrodes disposed on the first insulating layer, the first to fourth electrodes being spaced apart from each other;
a second insulating layer disposed over the first and second electrodes to completely overlap the first and second electrodes, the second insulating layer exposing the third and fourth electrodes;
a plurality of light emitting elements disposed on the second insulating layer between the first and second electrodes;
a first contact electrode disposed on the first electrode, wherein the second insulating layer is disposed between the first contact electrode and the first electrode; and
a second contact electrode disposed on the second electrode, wherein the second insulating layer is disposed between the second contact electrode and the second electrode.

2. The display device of claim 1, wherein the pixel includes:
third and fourth conductive lines disposed on the substrate, the third and fourth conductive lines being disposed between the first conductive line and the second conductive line; and
first and second intermediate electrodes disposed on the second insulating layer, the first and second intermediate electrodes being disposed between the first electrode and the second electrode.

3. The display device of claim 2, wherein the second insulating layer is disposed over the first and second intermediate electrodes to completely overlap the first and second intermediate electrodes.

4. The display device of claim 3, wherein
the first electrode extends in a same direction as the first conductive line on the first insulating layer,
the second electrode extends in a same direction as the second conductive line on the first insulating layer,
the first intermediate electrode extends in a same direction as the third conductive line on the first insulating layer, and
the second intermediate electrode extends in a same direction as the fourth conductive line on the first insulating layer.

5. The display device of claim 4, wherein
the first electrode overlaps the first conductive line,
the second electrode overlaps the second conductive line,
the first intermediate electrode overlaps the third conductive line, and
the second intermediate electrode overlaps the fourth conductive line in a plan view.

6. The display device of claim 5, wherein the first insulating layer includes a plurality of contact holes exposing a portion of the sub-electrode, a portion of each of the first to fourth conductive lines, and another portion of the second conductive line.

7. The display device of claim 6, wherein
the first electrode is electrically connected to the exposed portion of the first conductive line,
the second and fourth electrodes are electrically connected to the exposed portions, respectively, of the second conductive line,
the first intermediate electrode is electrically connected to the exposed portion of the third conductive line,
the second intermediate electrode is electrically connected to the exposed portion of the fourth conductive line, and
the third electrode is electrically connected to the exposed portion of the sub-electrode.

8. The display device of claim 7, wherein
the first conductive line and the first electrode are connected to each other to form a double-layered structure including the first insulating layer disposed between the first conductive line and the first electrode,
the second conductive line and the second electrode are connected to each other to form a double-layered structure including the first insulating layer disposed between the second conductive line and the second electrode,
the third conductive line and the first intermediate electrode are connected to each other to form a double-layered structure including the first insulating layer disposed between the third conductive line and the first intermediate electrode, and
the fourth conductive line and the second intermediate electrode are connected to each other to form a double-layered structure including the first insulating layer disposed between the fourth conductive line and the second intermediate electrode.

9. The display device of claim 7, wherein the second conductive line, the second electrode, and the fourth electrode are electrically connected to each other.

10. The display device of claim 7, wherein
the first contact electrode is directly disposed on the third electrode and an end portion of each of the plurality of light emitting elements, and the second contact electrode is directly disposed on the fourth electrode and another end portion of each of the plurality of light emitting elements.

11. The display device of claim 10, wherein
the first contact electrode electrically connects the third electrode and an end portion of each of the plurality of light emitting elements, and
the second contact electrode electrically connects the fourth electrode and another end portion of each of the plurality of light emitting elements.

12. The display device of claim 8, wherein the pixel includes:
a third contact electrode spaced apart from the first and second contact electrodes and disposed on the first intermediate electrode, the second insulating layer being disposed between the third contact electrode and the first intermediate electrode; and
a fourth contact electrode spaced apart from the first to third contact electrodes and disposed on the second intermediate electrode, the second insulating layer being disposed between the fourth contact electrode and the second intermediate electrode.

13. The display device of claim 12, wherein
the third contact electrode and the first intermediate electrode are electrically separated from each other, and
the fourth contact electrode and the second intermediate electrode are electrically separated from each other.

14. The display device of claim 13, wherein the pixel includes:
a transistor disposed between the substrate and the first to fourth conductive lines; and
a signal line electrically connected to the transistor,
wherein the transistor is electrically connected to the sub-electrode.

15. The display device of claim 11, wherein
the pixel includes a third insulating layer disposed over an upper surface of each of the plurality of light emitting elements, and
the first and second contact electrodes are disposed on the third insulating layer.

16. The display device of claim 15, wherein the first contact electrode and the second contact electrode are disposed in a same layer.

17. The display device of claim 15, wherein the first contact electrode and the second contact electrode are disposed in different layers.

18. The display device of claim 1, wherein each of the plurality of light emitting elements includes:
a first semiconductor layer doped with a first conductive dopant;
a second semiconductor layer doped with a second conductive dopant; and
an active layer disposed between the first semiconductor layer and the second semiconductor layer.

19. A method of fabricating a display device, the method comprising:
forming a pixel in each pixel area, wherein the forming of the pixel includes:
forming a sub-electrode and first to fourth conductive lines on a substrate, the sub-electrode and the first to fourth conductive lines being spaced apart from each other;
forming a first insulating layer over the sub-electrode and the first to fourth conductive lines;
forming first to fourth electrodes and first and second intermediate electrodes on the first insulating layer, wherein the first to fourth electrodes and the first and second intermediate electrodes are spaced apart from each other;
forming a second insulating layer over the first and second electrodes and the first and second intermediate electrodes, wherein the forming of the second insulating layer includes:
forming the second insulating layer completely overlapping each of the first and second electrodes and the first and second intermediate electrodes; and
forming the second insulating layer not overlapping the third and fourth electrodes;
aligning a plurality of light emitting elements on the second insulating layer between two adjacent electrodes among the first and second electrodes and the first and second intermediate electrodes; and
forming first to fourth contact electrodes on the second insulating layer, wherein
the first contact electrode is electrically connected to one of the third and fourth electrodes, and
the second contact electrode is electrically connected to the other of the third and fourth contact electrodes.

20. The method of claim 19, wherein the forming of the first insulating layer includes:
applying an insulating material onto the sub-electrode and the first to fourth conductive lines; and
forming a plurality of contact holes exposing a portion of the sub-electrode, a portion of each of the first to fourth conductive lines, and another portion of the second conductive line, by removing a portion of the insulating material.

21. The method of claim 20, wherein the forming of the pixel includes:
connecting the first conductive line and the first electrode to form a double-layered structure including the first insulating layer disposed between the first conductive line and the first electrode,
connecting the second conductive line and the second electrode to form a double-layered structure including the first insulating layer disposed between the second conductive line and the second electrode,
connecting the third conductive line and the first intermediate electrode to form a double-layered structure including the first insulating layer disposed between the third conductive line and the first intermediate electrode, and
connecting the fourth conductive line and the second intermediate electrode to form a double-layered structure including the first insulating layer disposed between the fourth conductive line and the second intermediate electrode.

22. The method of claim 21, wherein the forming of the pixel includes forming a transistor and signal lines electrically connected to the transistor on the substrate, before the forming of the sub-electrode and the first to fourth conductive lines.

* * * * *